(12) United States Patent
Spreitzer et al.

(10) Patent No.: US 6,458,909 B1
(45) Date of Patent: Oct. 1, 2002

(54) ARYL-SUBSTITUTED POLY (P-ARYLENE-VINYLENES), PROCESS FOR THEIR PREPARATION AND THEIR USE IN ELECTROLUMINESCENCE COMPONENTS

(75) Inventors: Hubert Spreitzer, Frankfurt; Willi Kreuder, Mainz; Heinrich Becker, Glashütten, all of (DE); Harmannus Schoo; Robert Demandt, both of Eindhoven (NL)

(73) Assignee: Hoechst Aktiengesellschaft, Frankfurt (DE)

( * ) Notice: Subject to any disclaimer, the term of this patent is extended or adjusted under 35 U.S.C. 154(b) by 0 days.

(21) Appl. No.: 08/991,559

(22) Filed: Dec. 16, 1997

(30) Foreign Application Priority Data

Dec. 16, 1996 (DE) .......................... 196 52 261

(51) Int. Cl.[7] ........................ C08F 138/00; C08F 126/06
(52) U.S. Cl. ........................ 526/285; 526/258; 526/261; 526/310; 526/313; 526/346; 526/347.1
(58) Field of Search ................ 526/285, 261, 526/346, 310, 258

(56) References Cited

U.S. PATENT DOCUMENTS

| 5,558,904 A | 9/1996 | Hseih et al. |
| 5,723,873 A | * 3/1998 | Yang .......................... 257/40 |

FOREIGN PATENT DOCUMENTS

| EP | 0423283 | 4/1991 |
| EP | 0443861 | 8/1991 |
| WO | WO 90/13148 | 11/1990 |
| WO | WO 94/20589 | 9/1994 |

OTHER PUBLICATIONS

Advanced Materials, vol. 4, Oct. 1992, p. 661 by Vestweber et al.
Advanced Materials, vol. 7, Jan. 1995, pp. 36–38 by Hseih et al.
Phys. Chem. vol. 100, 1996, pp. 1667–1677 by Salbeck et al.
Synthetic Metals, vol. 64, 1994, pp. 141–145 by Vestweber et al.

* cited by examiner

*Primary Examiner*—Fred Zitomer
(74) *Attorney, Agent, or Firm*—Frommer Lawrence Haug

(57) ABSTRACT

Poly(p-arylene-vinylenes) comprising repeating units of the formula (I),

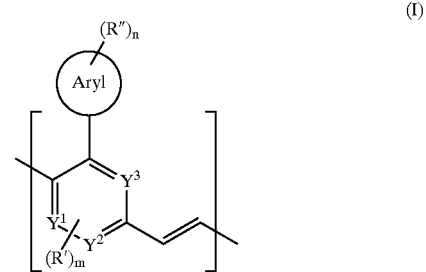

where the symbols and indices have the following meanings:
 $Y^1$, $Y^2$, $Y^3$: identical or different, CH, N;
 Aryl: an aryl group having from 4 to 14 carbon atoms;
 R', R": identical or different, each a straight-chain or branched or cyclic alkyl or alkoxy group having from 1 to 20 carbon atoms, where one or more non-adjacent $CH_2$ groups may be replaced by —O—, —S—, —CO—, —COO—, —O—CO—, —$NR^1$—, —$(NR^2R^3)^+$—$A^-$, or —$CONR^4$— and one or more H atoms may be replaced by F, or else CN, F, Cl or an aryl group having from 4 to 14 carbon atoms which may be substituted by one or more nonaromatic radicals R';
 $R^1$, $R^2$, $R^3$, $R^4$: identical or different, aliphatic or aromatic hydrocarbon radicals having from 1 to 20 carbon atoms or else H;
 $A^-$: a singly charged anion or its equivalent;
 m: 0, 1 or 2;
 n: 1, 2, 3, 4 or 5;
are suitable as electroluminescence materials.

18 Claims, 5 Drawing Sheets

Fig. 1: ¹H NMR Spectrum of polymer A2 (400 MHz, CDCl₃)

Fig. 2: ¹H NMR Spectrum of polymer A5 (400 MHz, CDCl₃)

Fig. 3: ¹H NMR Spectrum of polymer B1 (400 MHz, CDCl₃)

Fig. 4
Polymer A3
Fig. 4a: Diode current and photoelectric current vs. potential
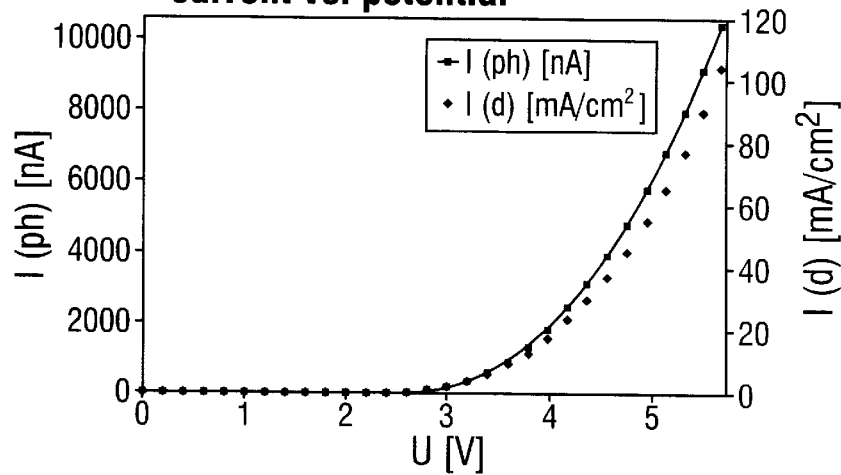
Fig. 4b: Efficency curve
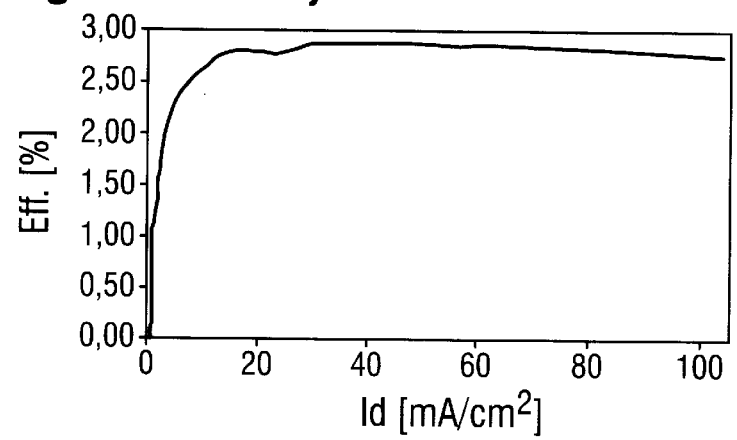
Fig. 4c: Electroluminescence spectrum
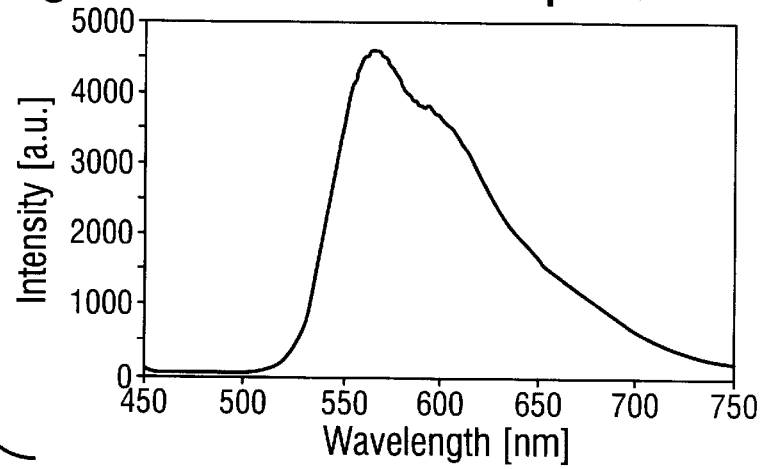

Fig. 5a: Diode current and photoelectric current vs. potential
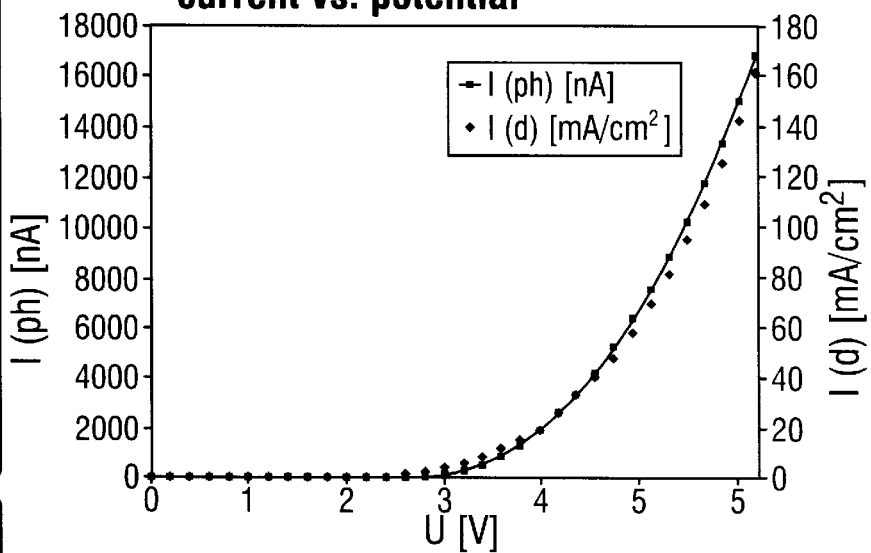
Fig. 5 Polymer A5
Fig. 5b: Efficency curve
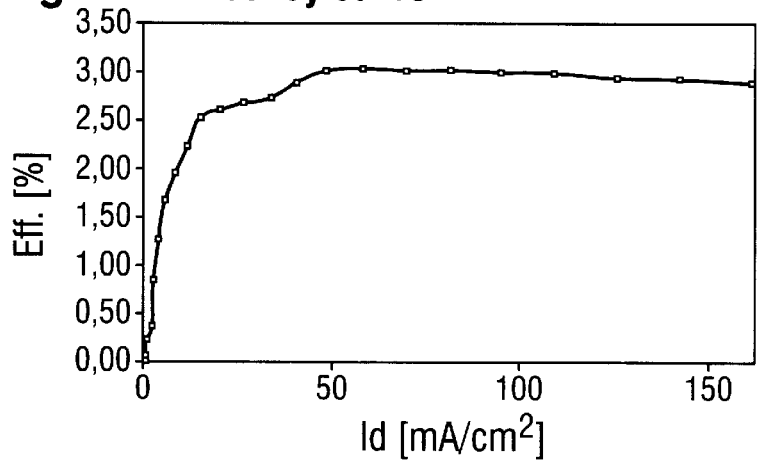
Fig. 5c: Electroluminescence spectrum
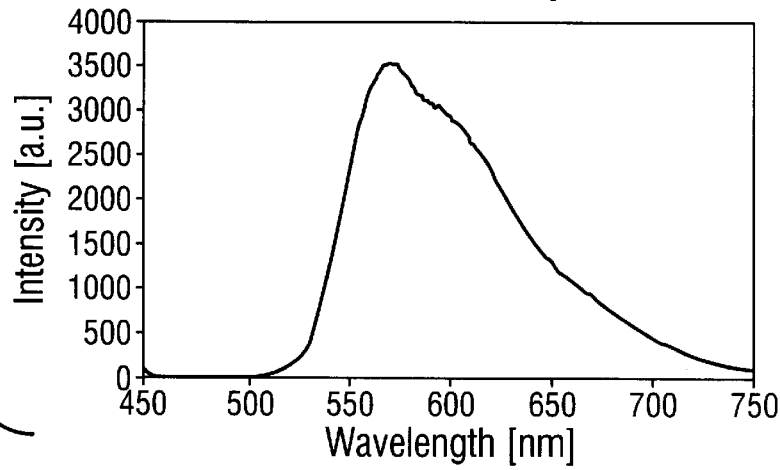

ARYL-SUBSTITUTED POLY (P-ARYLENE-VINYLENES), PROCESS FOR THEIR PREPARATION AND THEIR USE IN ELECTROLUMINESCENCE COMPONENTS

There is a great industrial need for large-area solid-state light sources for a series of applications, predominantly in the field of display elements, VDU technology and lighting engineering. The demands made of these light sources can at present not be fully satisfactorily met by any of the existing technologies.

As an alternative to conventional display and lighting elements, for example incandescent lamps, gas-discharge lamps and non-self-illuminating liquid crystal display elements, use has been made for some time of electroluminescence (EL) materials and devices such as light-emitting diodes (LEDs).

Apart from inorganic electroluminescence materials and devices, low molecular weight, organic electroluminescence materials and devices have been known for about 30 years (see, for example, U.S. Pat. No. 3,172,862). However, until recently such devices were greatly restricted in their practical usability.

EP-B 0 423 283 and EP-B 0 443 861 describe electroluminescence devices comprising a film of a conjugated polymer as light-emitting layer (semiconductor layer). Such devices offer numerous advantages such as the opportunity of producing large-area, flexible displays simply and inexpensively. In contrast to liquid crystal displays, electroluminescence displays are self-illuminating and therefore require no additional backward lighting source.

A typical device as described in EP-B 0 423 283 comprises a light-emitting layer in the form of a thin, dense polymer film (semiconductor layer) comprising at least one conjugated polymer. A first contact layer is in contact with a first surface of the semiconductor layer and a second contact layer is in contact with a further surface of the semiconductor layer. The polymer film of the semiconductor layer has a sufficiently low concentration of extrinsic charge carriers so that when an electric field is applied between the two contact layers, charge carriers are introduced into the semiconductor layer, with one contact layer becoming positive relative to the other, and the semiconductor layer emits radiation. The polymers used in such devices are conjugated. For the purposes of the present invention, a conjugated polymer is a polymer which has a delocalized electron system along the main chain. The delocalized electron system gives the polymer semiconducting properties and makes it able to transport positive and/or negative charge carriers with high mobility.

EP-B 0 423 283 and EP-B 0 443 861 describe poly(p-phenylene-vinyl ene) which has been modified on the aromatic ring by means of alkyl, alkoxy, halogen or nitro substitutents as polymeric material for the light-emitting layer. Such polymers have since been examined in a large number of studies and dialkoxy-substituted PPVs in particular have al ready be en optimized to a great extent in the direction of readiness for applications (cf. for ex ample, J. Salbeck, Ber. Bunsenges. Phys. Chem. 1996, 100, 1667). However, the development of such polymers can in no way be regarded as concluded. Thus, inter alia, improvements are still necessary in respect of operating life, stability and also the achievable color. With regard to the last point, the furthest developed class of polymers mentioned above, dialkoxy-PPV, is suitable only for the emission of orange-red light.

It is therefore an object of the present invention to provide new electroluminescence materials which, when used in lighting or display devices, is suitable for improving the property profile of these devices.

BRIEF DESCRIPTION OF THE DRAWINGS

FIG. 4 depicts the electroluminescence properties of poly(2-methoxy-5-(3,7-dimethyloctyloxy)-p-phenylene-vinylene)-co-(2-(2',5'-dimethyl)phenyl)-p-phenylene-vinylene) (polymer A3).

FIG. 5 depicts the electroluminescence properties of poly(2-methoxy-5-(3,7-dimethyloctyloxy)-p-phenylene-vinylene)-co-(2-(3'-(3,7-diphenyloctyloxy)-p-phenylene-vinylene)-co-(2-(2',5'-dimethyl)phenyl)-p-phenylene-vinylene (polymer A5).

Figure 1:
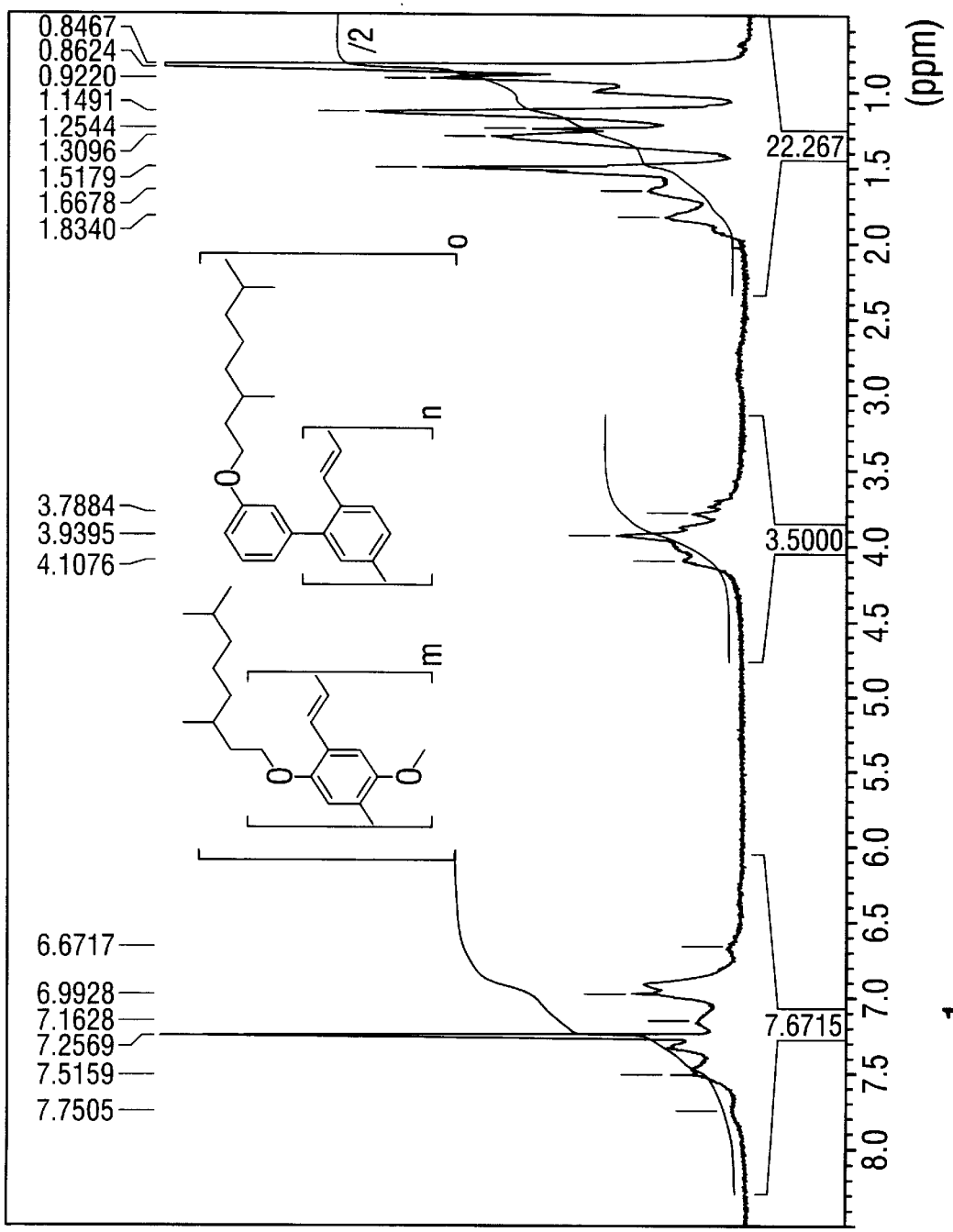
FIG. 1 is a $^1$H nmr spectrum of poly(2-methoxy-5-(3,7-dimethyloctyloxy)-p-phenylene-vinylene)-co-(2-(3'-(3,7-dimethyloctyloxy)phenyl)-p-phenylene-vinylene) (polymer A2).

It has now surprisingly been found that certain polyarylene-vinylenes whose arylene unit is substituted by at least one further substituted aryl radical are particularly suitable as electroluminescence materials.

Such polymers have scarcely been known hitherto: thus, although H. Vestweber et al. (Adv. Mater. 1992, 4, 661; Synth. Met. 1994, 64, 141) describe a phenyl-substituted PPV which is obtained by a Heck reaction of ethylene with 2,5-dibromobiphenyl, this polymer has an extremely low molecular weight ($P_D$ about 15) which has a very adverse effect on the film-forming properties. In addition, the solubility is too low to produce homogeneous films in the usable region of 100 nm by means of standard methods (e.g. spin coating). Similar problems are also reported by C. Zhang et al. (Synth. Met. 1994, 62, 35), who obtain the analogous polymer by a different route (dehydrohalogenation polymerization of 2,5-bis(bromomethyl)biphenyl) but obtain analogous properties: low molecular weight, poor solubility. The only high molecular weight PPV of this type known to date is described by B. R. Hsieh et al. (Adv. Mater. 1995, 7, 36): this group synthesized diphenyl-PPV by means of a precursor process (starting from 1',4'-bis(chloromethyl)-o-terphenyl). The problem here is obviously that even at very high conversion temperatures (about 290° C.), an appreciable residual chlorine content still remains in the polymer and this can be held responsible for the extremely short life of LEDs produced using this substance.

The invention accordingly provides a polymer comprising repeating units of the formula (I),

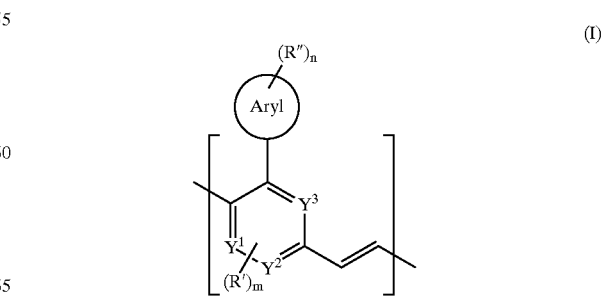

where the symbols and indices have the following meanings:
- $Y^1$, $Y^2$, $Y^3$: identical or different, CH, N;
- Aryl: an aryl group having from 4 to 14 carbon atoms;
- R', R'': identical or different, each a straight-chain or branched or cyclic alkyl or alkoxy group having from 1 to 20 carbon atoms, where one or more non-adjacent CH$_2$ groups may be replaced by —O—, —S—, —CO—, —COO—, —O—CO—, —NR$^1$—, —(NR$^2$R$^3$)$^+$—A$^-$, or —CONR$^4$— and one or more H atoms may be replaced by F, or else CN, F, Cl or an aryl group having from 4 to 14 carbon atoms which may be substituted by one or more nonaromatic radicals R';
- $R^1$, $R^2$, $R^3$, $R^4$: identical or different, aliphatic or aromatic hydrocarbon radicals having from 1 to 20 carbon atoms or else H;
- A$^-$: a singly charged anion or its equivalent;
- m: 0, 1 or 2;
- n: 1, 2, 3, 4 or 5.

The polymers of the invention generally have from 2 to 10,000, preferably from 10 to 5000, particularly preferably from 100 to 5000, very particularly preferably from 250 to 2000, repeating units, preferably of the formula (I).

Preference is given to polymers consisting of repeating units of the formula (I).

Furthermore, preference is also given to copolymers consisting essentially of, particularly preferably consisting of, repeating units of the formula (I) and further repeating units which preferably likewise comprise poly(arylene-vinylene) structures, particularly preferably 2,5-dialkoxy-1,4-phenylene-vinylene structures, where the alkoxy groups are preferably linear or branched and contain from 1 to 22 carbon atoms.

Also preferred are copolymers which have at least two different, particularly preferably at least three different, repeating units of the formula (I).

Likewise preferred are polymers comprising repeating units of the formula (I) in which the symbols and indices have the following meanings:
- $Y^1$, $Y^2$, $Y^3$: CH;
- Aryl: phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinolinyl, 2- or 3-thiophenyl, 2- or 3-pyrrolyl, 2- or 3-furanyl and 2-(1,3,4-oxadiazol)yl;
- R': identical or different, each a straight-chain or branched alkoxy group having from 1 to 12 carbon atoms;
- R'': identical or different, each a straight-chain or branched alkyl or alkoxy group having from 1 to 12 carbon atoms;
- m: 0, 1, particularly preferably 0;
- n: 1, 2, 3, particularly preferably 1, 2.

Particular preference is given to polymers in which the aryl substituent in the repeating unit of the formula (I) has the following meaning: phenyl, 1-naphthyl, 2-naphthyl or 9-anthracenyl.

Furthermore, particular preference is given to polymers in which the aryl substituent in the repeating unit of the formula (I) has the following substitution pattern: 2-, 3- or 4-alkyl(oxy)phenyl, 2,3-, 2,4-, 2,5-, 2,6-, 3,4- or 3,5-dialkyl(oxy)phenyl, 2,3,4-, 2,3,5-, 2,3,6-, 2,4,5-, 2,4,6- or 3,4,5-trialkyl(oxy)phenyl, 2-, 3-, 4-, 5-, 6-, 7- or 8-alkyl(oxy)-1-naphthyl, 1-, 3-, 4-, 5-, 6-, 7- or 8-alkyl(oxy)-2-naphthyl and 10-alkyl(oxy)-9-anthracenyl.

The polymers of the invention are, for example and preferably, obtained from starting materials of the formula (II), where the symbols and indices are as defined for formula (I) and X is one of the following groups: halomethyl, aldehyde, CH$_2$PO(OR)$_2$, CH$_2$S(R)$_2$$^+$A$^-$ or CH$_2$P(R)$_3$$^+$A$^-$, in the following ways:

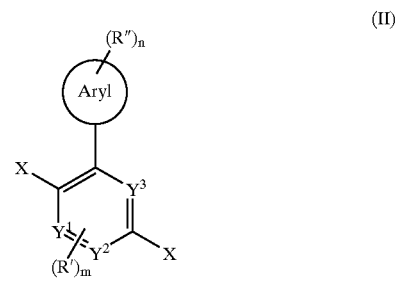

A) Dehydrohalogenation polymerization (X=CH$_2$Hal, Hal=Cl, Br, I), by reacting one or more monomers in a solvent with a base.

For this purpose, the monomers are dissolved in suitable solvents, brought to the reaction temperature and admixed with a base. After the reaction time has elapsed, the reaction solution can be quenched, for example by addition of acid. The polymer is subsequently purified by suitable methods known to those skilled in the art, for example reprecipitation or extraction. Examples of suitable solvents are ethers, (e.g. diethyl ether, THF, dioxane, dioxolane, tert-butyl methyl ether), aromatic hydrocarbons, (e.g. toluene, xylenes, anisole, methylnaphthalenes), alcohols, (e.g. ethanol, tert-butanol), chlorinated compounds (e.g. chlorobenzene, dichlorobenzene) and mixtures of these solvents.

A preferred concentration range for the monomers is from 0.005 to 5 mol/l (monomer/solution volume). Preference is given to the range from 0.01 to 2 mol/l, very particularly preferably the range from 0.01 to 0.5 mol/l. The reaction temperature is generally from −80 to 200° C., preferably from 20 to 140° C. Examples of suitable bases are alkali metal hydroxide (NaOH, KOH), alkali metal hydrides (NaH, KH) and alkali metal alkoxides (NaOEt, KOEt, NaOMe, KOMe, KO$^t$Bu), organometallic compounds (nBuLi, sBuLi, tBuLi, PhLi) and organic amines (LDA, DBU, DMAP, pyridine). The amount is preferably in the range from 2 to 10 equivalents (based on one equivalent of monomer), particularly preferably from 3.5 to 8 equivalents, very particularly preferably from 4 to 6 equivalents. The reaction time is generally from 5 minutes to 24 hours, preferably from 0.5 to 6 hours, very particularly preferably from 1 to 4 hours.

B) Horner polymerization, by reacting two different types of monomer (X$^1$=CHO, X$^2$=CH$_2$PO(OR)$_2$) in a suitable solvent with a base.

C) Wittig polymerization, by reacting two different types of monomer (X$^1$=CHO, X$^2$=CH$_2$P(R)$_3$$^+$A$^-$) in a suitable solvent with a base.

The condensation steps (for the reactions under B) or C)) occur as a result of the action of a basic condensing agent, preferably a strong base, for example an alkoxide, e.g. an alkali metal alkoxide, or hydride, e.g. sodium hydride, preferably potassium tert-butoxide.

The polycondensation is advantageously carried out by initially charging the mixture of the starting components in a solvent and, under an inert gas atmosphere and while stirring, introducing preferably at least molar amounts of condensing agent in solution or suspension.

In another process variant, the condensing agent can also be initially charged, either alone or together with the bisaldehyde (II, X=CHO) in a solvent and the organophosphorus compound can be added. As solvents, preference is given to using hydrocarbons, particularly preferably aromatic hydrocarbons such as toluene, anisole or xylenes, or polar aprotic solvents, preferably amides such as N-methylpyrrolidone (NMP). The reaction temperature is preferably from 60 to 120° C. and the reaction time is from 2 to 20 hours, preferably from 3 to 10 hours.

The work-up can be carried out by adding water, if desired an acid such as acetic acid, and separating off the organic reacton phases. The condensation products obtained can be purified by extraction, e.g. with alcohols or acetic acid, or by precipitation from a solvent by means of a nonsolvent. This preparation process is generally described, for example, in DD 84 272, Hörhold, H.-H.: Z. Chem. 1972, 12, 41; Hörhold, H.-H.; Bergmann, R.; Gottschaldt, J.; Drefahl, G.: Acta Chim. Acad. Sci. Hung. 81, 239; Hörhold, H.-H.; Bergmann, R.: Advances in the Chemistry of Thermally Stable Polymers, Warszawa, Polish Scientific Publishers 1977, 29–48; Hörhold, H.-H.; Helbig, M.: Makromol. Chem., Macromol. Symp., 1987, 12, 229 and Hörhold, H.-H.; Helbig, M.; Raabe, D.; Opfermann, J.; Scherf, U.; Stockmann, R.; Weiβ, D.: Z. Chem. 1987, 27, 126.

D) Precursor polymerization, by producing a precursor polymer starting from one or more appropriate monomers (e.g. $X=CH_2S^+R_2A^-$, $CH_2Hal$) and subsequently eliminating the precursor radicals present, e.g. by thermal treatment (e.g. for $CH_2S^+R_2A^-$) or treatment with base (e.g. for $X=CH_2Hal$).

For this purpose, the monomers are dissolved in suitable solvents in appropriate concentrations, brought to the appropriate reaction temperature and admixed with the appropriate amount of a suitable base. After an appropriate reaction time has elapsed, the reaction solution can be quenched, e.g. by addition of acid. The precursor polymer is subsequently purified by methods known to those skilled in the art, e.g. reprecipitation or extraction. This precursor polymer can then be converted, either in solution or after application to a suitable substrate, into the desired PPV derivative by means of an appropriate treatment method.

In precursor polymerization via sulfur salts, suitable solvents are, for example, alcohols (e.g. methanol, ethanol, tert-butanol), water or mixtures of these solvents. For bis (halomethyl) monomers, suitable solvents are, for example, ethers (e.g. diethylether, THF, dioxane, dioxolane, tert-butyl methyl ether), aromatic hydrocarbons (e.g. toluene, xylenes, anisole, methyinaphthalenes), alcohols (e.g. ethanol, tert-butanol) and mixtures of these.

A suitable concentration range here is from 0.005 to 5 mol/l (monomer/solution volume). Preference is given to the range from 0.01 to 2 mol/l, very particularly preferably the range from 0.01 to 0.5 mol/l.

The reaction temperature for the synthesis of the precursor polymer is generally from 0 to 200° C., preferably from 20 to 140° C.

Examples of suitable bases are alkali metal hydroxides (NaOH, KOH), alkali metal hydrides (NaH, KH) and alkali metal alkoxides (NaOEt, KOEt, NaOMe, KOMe, KO$^t$Bu), organometallic compounds (nBuLi, sBuLi, tBuLi, PhLi) and organic amines (LDA, DBU, DMAP, pyridine). A suitable amount is in the range from 1 to 4 equivalents (based on one equivalent of monomer), preferably from 1.5 to 3 equivalents, particularly preferably from 1.8 to 2.5 equivalents.

The reaction time is generally from 5 minutes to 24 hours, preferably from 0.5 to 6 hours, very particularly preferably from 1 to 4 hours.

The precursor polymer can then be converted, either in solution or on a substrate (e.g. glass, quartz, ITO, PET), into the desired PPV derivative, for example by heating under a gas atmosphere or under reduced pressure or by treatment with base. Suitable temperatures for the heating step are in the range from 50 to 400° C., preferably from 80 to 300° C., very particularly preferably from 100 to 250° C. Suitable bases are the abovementioned compounds. The amount of base used is in the range from 1 to 4 equivalents (based on one equivalent of monomer), preferably from 1.5 to 3 equivalents, particularly preferably from 1.8 to 2.5 equivalents.

These processes are likewise subject-matter of the invention.

The biaryl derivatives represented by formula (II) can be obtained by the route outlined in Scheme 1:

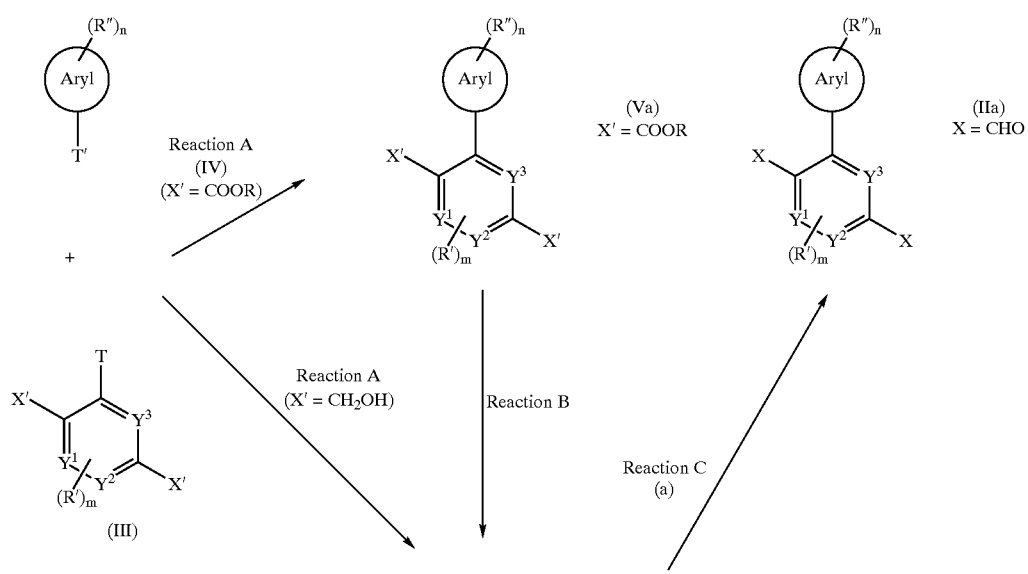

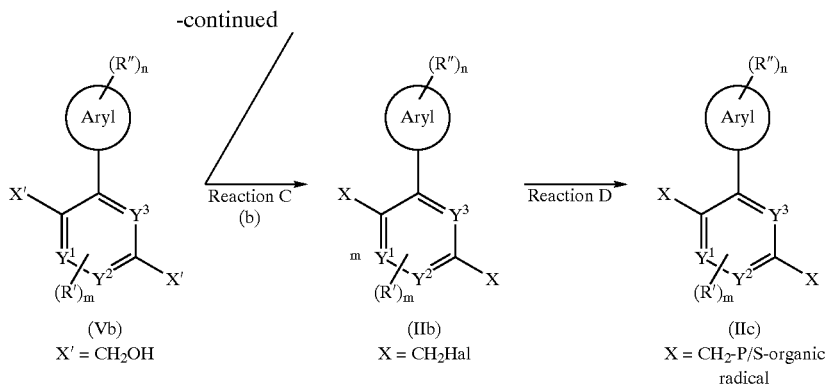

The starting compounds of the formulae (III) and (IV) are very readily obtainable, since some of them are commercially available, e.g. bromoterephthalic acid, or can be prepared in a simple manner and in a large amount from commercially available compounds.

Scheme 2
Preparation of the starting compound (III)

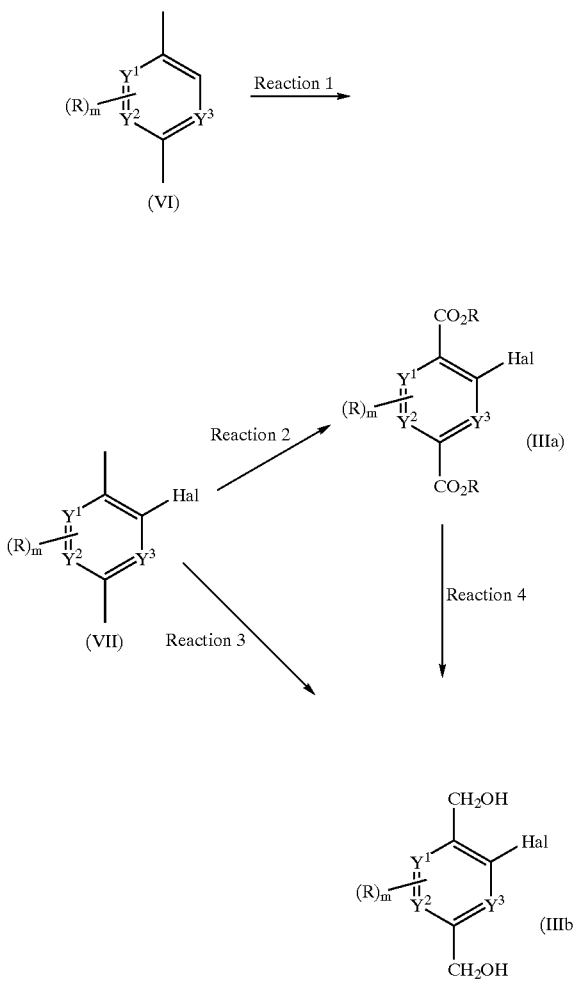

The following may be said about the reactions in Scheme 2: the 1,4-dimethyl compound (VI) is generally commercially available (e.g. p-xylene, 2,5-dimethylphenol, 2,5-dimethylaniline, 2,5-dimethylbenzonitrile, 2,5-dimethylpyridine) or is simple to prepare from commercially available compounds (e.g. alkylation of a corresponding phenol or amine), compound (VI) can be halogenated, e.g. chlorinated or brominated, on the aromatic ring by standard methods (see, for example, Organikum, VEB Deutscher Verlag der Wissenschaften, 15th edition, p. 391 ff., Leipzig 1984). The resulting compounds (VII) are obtainable in good yields and industrial amounts; some of the compounds (VII) are also commercially available (e.g. 2-bromo-p-xylene).

(VII) can be converted, preferably catalytically (cobalt catalyst, atmospheric oxygen, see, for example, EP-A 0 121 684) into the corresponding 1,4-dicarboxylic acids (IIIa). With appropriate selection of the reaction conditions, this is possible regardless of the substituents. The resulting acids, (IIIa) where R=H, can, if desired, be converted into the corresponding esters (R≠H) by standard methods.

The compounds of the formula (IIIa) which are obtained almost quantitatively in this way can be converted into the bisalcohols (IIIb) by means of customary reduction reactions. These bisalcohols are also obtainable directly from the compounds of the formula (VII) by oxidation (see, for example, A. Belli et al., Synthesis 1980, 477).

If desired, the halogen atom can be replaced by a boric acid (ester) or trialkyltin group in an appropriate step, as described below for the compounds of the formula (IVa).

Corresponding perfluoroalkylsulfonates can be prepared, for example, by esterification of corresponding phenol functions.

Scheme 3
Preparation of the starting compound (IV)

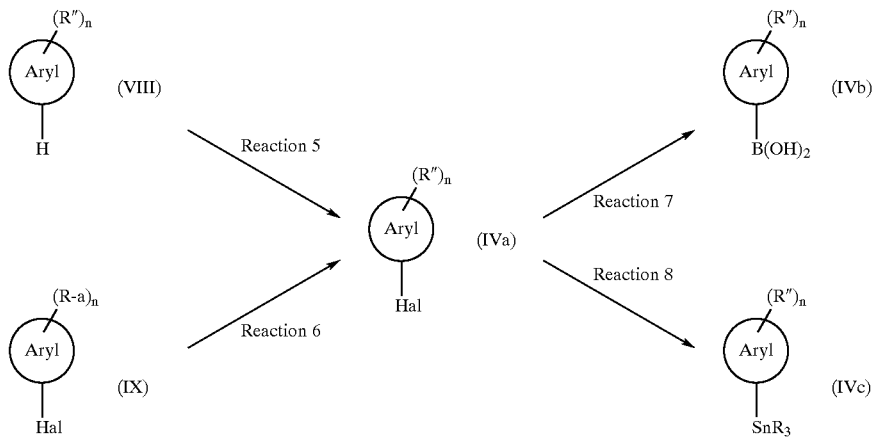

The following may be said about Scheme 3: The compounds (VIII) are generally commercially available (e.g. various alkylaromatics and dialkylaromatics, alkoxyaromatics) or are simple to prepare from the corresponding precursors (e.g. hydroquinone, catechol, naphthol and the like), for example by alkylation. Compound (VIII) can then be converted into compounds of the formula (IVa) by simple halogenation reactions (Reaction 5) as described above. Many compounds of the formula (IX) are inexpensive chemicals (e.g. bromophenol, bromoaniline) which can easily be converted into compounds of the formula (IVa) by means of Reaction 6 (e.g. alkylation of phenol functions). These are then metallated by means of appropriate reagents (e.g. Mg turnings, n-BuLi, s-BuLi) and can subsequently be converted into the corresponding compounds of the formula (IVb) or (IVc) by appropriate further reaction, e.g. with trialkyltin chloride, trialkyl borates.

This shows that the starting compounds (III) and (IV) are readily available in the required range of variations. The starting compounds (III) and (IV) are converted into intermediates of the formula (V) by means of a coupling reaction (Reaction A in Scheme 1).

For this purpose, the compounds of the formulae (III) and (IV) in an inert solvent are reacted at a temperature in the range from 0° C. to 200° C. in the presence of a palladium catalyst.

Here, one of the compounds, preferably that of the formula (III), contains a halogen or perfluoroalkylsulfonate group while the other contains a boric acid (ester) group (IVb) or a trialkyltin group (IVc).

To carry out said reaction A with boric acids (esters) of the formula (IVb), variant Aa, Suzuki coupling, the aromatic boron compound, the aromatic halogen compound or the perfluoroalkylsulfonate, a base and catalytic amounts of the palladium catalyst are added to water or to one or more inert inorganic solvents or preferably to a mixture of water and one or more inert inorganic solvents and stirred at a temperature of from 0 to 200° C., preferably from 30 to 170° C., particularly preferably from 50 to 150° C., in particular from 60 to 120° C., for a period of from 1 to 100 hours, preferably from 5 to 70 hours, particularly preferably from 5 to 50 hours. The crude product can be purified by methods which are known to those skilled in the art and matched to the respective product, e.g. by recrystallization, distillation, sublimation, zone melting, melt crystallization or chromatography.

Examples of suitable organic solvents for the process described are ethers, e.g. diethyl ether, dimethoxyethane, diethylene glycol dimethyl ether, tetrahydrofuran, dioxane, dioxolane, diisopropyl ether, tert-butyl methyl ether, hydrocarbons, e.g. hexane, isohexane, heptane, cyclohexane, toleune, xylene, alcohols, e.g. methanol, ethanol, 1-propanol, 2-propanol, ethylene glycol, 1-butanol, 2-butanol, tert-butanol, ketones, e.g. acetone, ethyl methyl ketone, isobutyl methyl ketone, amides, e.g. dimethylformamide, dimethylacetamide, N-methylpyrrolidone, nitriles, e.g. acetonitrile, propionitrile, butyronitrile, and mixtures thereof.

Preferred organic solvents are ethers such as dimethoxyethane, diethylene glycol dimethyl ether, tetrahydrofuran, dioxane, diisopropyl ether and t-butyl methyl ether, hydrocarbons such as hexane, heptane, cyclohexane, toluene and xylene, alcohols such as methanol, ethanol, 1-propanol, 2-propanol, 1-butanol, 2-butanol, tert-butanol and ethylene glycol, ketones such as ethyl methyl ketone and isobutyl methyl ketone, amides, such as dimethylformamide, dimethylacetamide and N-methylpyrrolidone and mixtures thereof.

Particularly preferred solvents are ethers, e.g. dimethoxyethane, tetrahydrofuran, hydrocarbons, e.g. cyclohexane, toluene, xylene, alcohols, e.g. ethanol, 1-propanol, 2-propanol, 1-butanol, tert-butanol and mixtures thereof.

In a particularly preferred variant of the process described, water and one or more water-insoluble solvents are used. Examples are mixtures of water and toluene or water, toluene and tetrahydrofuran.

Bases which are preferably used in the process described are alkali metal hydroxides and alkaline earth metal hydroxides, alkali metal carbonates and alkaline earth metal carbonates, alkali metal hydrogen carbonates, alkali metal acetates and alkaline earth metal acetates, alkali metal alkoxides and alkaline earth metal alkoxides, and also primary, secondary and tertiary amines.

Particular preference is given to alkali metal hydroxides and alkaline earth metal hydroxides, alkali metal carbonates and alkaline earth metal carbonates and alkali metal hydrogen carbonates. Very particular preference is given to alkali metal hydroxides such as sodium hydroxide and potassium hydroxide and also alkali metal carbonates and alkali metal hydrogen carbonates, for example lithium carbonate, sodium carbonate and potassium carbonate.

In the process described, the base is preferably used in an amount of from 100 to 1000 mol %, particularly preferably from 100 to 500 mol %, very particularly preferably from 150 to 400 mol %, in particular from 180 to 250 mol %, based on the aromatic boron compound.

The palladium catalyst comprises palladium metal or a palladium(0) or (II) compound and a complexing ligand, preferably a phosphine ligand.

The two components can form a compound, e.g. the particularly preferred Pd(PPh$_3$)$_4$, or be used separately.

Examples of suitable palladium components are palladium compounds such as palladium ketonates, palladium acetylacetonates, nitrile palladium halides, olefinpalladium halides, palladium halides, allylpalladium halides and palladium biscarboxylates, preferably palladium ketonates, palladium acetylacetonates, bis-$\eta^2$-olefinpalladium dihalides, palladium(II)halides, $\eta^3$-allylpalladium halide dimers and palladium biscarboxylates, very particularly preferably bis(dibenzylideneacetone)palladium(0) [Pd(dba)$_2$)], Pd(dba)$_2$CHCl$_3$, palladium bisacetylacetonate, bis(benzonitrile)palladium dichloride, PdCl$_2$, Na$_2$PdCl$_4$, dichlorobis(dimethyl sulfoxide)palladium(II), bis(acetonitrile)palladium dichloride, palladium(II) acetate, palladium(II) propionate, palladium(II) butanoate and (1c, 5c-cyclooctadiene)palladium dichloride.

As catalyst, it is likewise possible to employ palladium in metallic form, hereinafter referred to simply as palladium, preferably palladium in powder form or on a support material, e.g. palladium on activated carbon, palladium on aluminum oxide, palladium on barium carbonate, palladium on barium sulfate, palladium on aluminum silicates such as montmorillonite, palladium on SiO$_2$ and palladium on calcium carbonate, each having a palladium content of from 0.5 to 10% by weight. Particular preference is given to palladium in powder form, palladium on activated carbon, palladium on barium carbonate and/or calcium carbonate and palladium on barium sulfate, in each case having a palladium content of from 0.5 to 10% by weight. Very particular preference is given to palladium on activated carbon having a palladium content of 5 or 10% by weight.

The palladium catalyst is used in the process of the invention in an amount of from 0.01 to 10 mol %, preferably from 0.05 to 5 mol %, particularly preferably from 0.1 to 3 mol %, in particular from 0.1 to 1.5 mol %, based on the aromatic halogen compound or the perfluoroalkylsulfonate.

Ligands which are suitable for the process are, for example, phosphines such as trialkylphosphines, tricycloalkylphosphines and triarylphosphines, where the three substituents on the phosphorus can be identical or different and chiral or achiral and one or more of the ligands can link the phosphorus groups of a plurality of phosphines, where part of this linkage can also be one or more metal atoms. Examples of phosphines which can be used for the purposes of the process described here are trimethylphosphine, tributylphosphine, tricyclohexylphosphine, triphenylphosphine, tritolylphosphine, tris(4-dimethylaminophenyl)phosphine, bis(diphenylphosphino) methane, 1,2-bis(diphenylphosphino)ethane, 1,3-bis(diphenylphosphino)propane and 1,1'-bis(diphenylphosphino)ferrocene. Further suitable ligands are, for example, diketones such as acetylacetone and octafluoroacetylacetone and tertiary amines such as trimethylamine, triethylamine, tri-n-propylamine and triisopropylamine.

Preferred ligands are phosphines and diketones; particular preference is given to phosphines.

Very particularly preferred ligands are triphenylphosphine, 1,2-bis(diphenylphosphino)ethane, 1,3-bis(diphenylphosphino)propane and 1,1'-bis(diphenylphosphino)ferrocene, in particular triphenylphosphine.

Also suitable for the process are water-soluble ligands which contain, for example, sulfonic acid salt radicals and/or sulfonic acid radicals and/or carboxylic acid salt radicals and/or carboxylic acid radicals and/or phosphonic acid salts radicals and/or phosphonic acid radicals and/or phosphonium groups and/or peralkylammonium groups and/or hydroxy groups and/or polyether groups having a suitable chain length.

Preferred classes of water-soluble ligands are phosphines substituted with the above groups, for example trialkylphosphines, tricycloalkylphosphines, triarylphosphines, dialkylarylphosphines, alkyldiarylphosphines and heteroarylphosphines such as tripyridylphosphine and trifurylphosphine, where the three substituents on the phosphorus can be identical or different, chiral or achiral and one or more of the ligands can link the phosphorus groups of a plurality of phosphines, where part of this linkage can also be one or more metal atoms; phosphites, phosphinous esters and phosphonous esters, phospholes, dibenzophospholes and cyclic, oligocyclic and polycyclic compounds containing phosphorus atoms.

The ligand is used in the process in an amount of from 0.1 to 20 mol %, preferably 0.2 to 15 mol %, particularly preferably from 0.5 to 10 mol %, in particular from 1 to 6 mol %, based on the aromatic halogen compound or the perfluoroalkylsulfonate. It is also posisble to use mixtures of two or more different ligands.

All or some of the boric acid derivative used can be present as anhydride.

Advantageous embodiments of variant Aa of the abovementioned process are described, for example, in WO 94/10105, EP-A-679 619, WO-A-694 530 and PCT/EP 96/03154, which are hereby expressly incorporated by reference into the present application.

In the variant Ab, also known as Stille coupling, an aromatic tin compound, preferably of the formula (IVc), is reacted with an aromatic halogen compound or an aromatic perfluoroalkylsulfonate, preferably of the formula (III), at a temperature in the range from 0° C. to 200° C. in an inert organic solvent in the presence of a palladium catalyst.

An overview of this reaction may be found, for example, in J. K. Stille, Angew. Chemie Int. Ed. Engl. 1986, 25, 508.

To carry out the process, the aromatic tin compound and the aromatic halogen compound or the perfluoroalkylsulfonate are preferably added to one or more inert organic solvents and stirred at a temperature from 0° C. to 200° C., preferably from 30° C. to 170° C., particularly preferably from 50° C. to 150° C., in particular from 60° C. to 120° C., for a period of from 1 to 100 hours, preferably from 5 to 70 hours, particularly preferably from 5 to 50 hours. After the reaction is complete, the Pd catalyst obtained as a solid is separated off, for example by filtration, and the crude product is freed of the solvent or solvents. Further purification can subsequently be carried out by methods known to those skilled in the art and matched to the respective product, e.g. by recrystallization, distillation, sublimation, zone melting, melt crystallization or chromatography. Organic solvents which are suitable for the process described are, for example, ethers, e.g. diethyl ether, dimethoxyethane, diethylene glycol dimethyl ether, tetrahydrofuran, dioxane, dioxolane, diisopropyl ether, tert-butyl methyl ether, hydrocarbons, e.g. hexane, isohexane, heptane, cyclohexane, benzene, toluene, xylene, alcohols, e.g. methanol, ethanol, 1-propanol, 2-propanol, ethylene glycol, 1-butanol, 2-butanol, tert-butanol, ketones, e.g. acetone, ethyl methyl ketone, isobutyl methyl ketone, amides, e.g. dimethylformamide (DMF), dimethylacetamide, N-methylpyrrolidone, nitriles, e.g. acetonitrile, propionitrile, butyronitrile and mixtures thereof.

Preferred organic solvents are ethers such as dimethoxyethane, diethylene glycol dimethyl ether, tetrahydrofuran, dioxane and diisopropyl ether, hydrocarbons such as hexane, heptane, cyclohexane, benzene, toluene and xylene, alcohols such as methanol, ethanol, 1-propanol, 2-propanol, 1-butanol, 2-butanol, tert-butanol and ethylene glycol, ketones such as ethyl methyl ketone or amides such as DMF.

Particularly preferred solvents are amides; very particular preference is given to DMF.

The palladium catalyst comprises palladium metal or a palladium(0) or (II) compound and a complexing ligand, preferably a phosphine ligand.

The two components can form a compound, e.g. Pd $(PPh_3)_4$, or be used separately.

Examples of suitable palladium components are palladium compounds such as palladium ketonates, palladium acetylacetonates, nitrile palladium halides, olefinpalladium halides, palladium halides, allylpalladium halides and palladium biscarboxylates, preferably palladium ketonates, palladium acetylacetonates, bis-$\eta^2$-olefinpalladium dihalides, palladium(II)halides, $\eta^3$-allylpalladium halide dimers and palladium biscarboxylates, very particularly preferably bis(dibenzylideneacetone)palladium(0) [$Pd(dba)_2$)], $Pd(dba)_2$ $CHCl_3$, palladium bisacetylacetonate, bis(benzonitrile) palladium dichloride, $PdCl_2$, $Na_2PdCl_4$, dichlorobis(dimethyl sulfoxide)palladium(II), bis(acetonitrile) palladium dichloride, palladium(II) acetate, palladium(II) propionate, palladium(II) butanoate and (1c,5c-cyclooctadiene)palladium dichloride.

The palladium catalyst is used in the process described in an amount of from 0.01 to 10 mol %, preferably from 0.05 to 5 mol %, particularly preferably from 0.1 to 3 mol %, in particular from 0.1 to 1.5 mol %, based on the aromatic halogen compound or the perfluoroalkylsulfonate.

Suitable ligands for the process described are, for example, phosphines such as trialkylphosphines, tricycloalkylphosphines and triarylphosphines, where the three substituents on the phosphorus may be identical or different, chiral or achiral and one or more of the ligands may link the phosphorus groups of a plurality of phosphines, where part of this linkage may also be one or more metal atoms.

The ligand is used in the process described in an amount of from 0.1 to 20 mol %, preferably from 0.1 to 15 mol %, particularly preferably from 0.5 to 10 mol %, in particular from 1 to 6 mol %, based on the aromatic halogen compound or the perfluoroalkylsulfonate.

Reaction B

If the group X' in the intermediate (V) is —COOR, it is reduced to the bisalcohol, X'=$CH_2OH$.

The reduction can be carried out by methods with which those skilled in the art are familiar, as are described, for example, in Houben-Weyl, 4th edition, Volume 6, 16, Chapter VIII, Georg-Thieme-Verlag, Stuttgart 1984.

Preferred embodiments are
  a) Reaction with $LiAlH_4$ or diisobutylaluminum hydride (DIBAL-H) in tetrahydrofuran (THF) or toluene, as described, for example, Organikum (loc. cit.), p. 612 ff.
  b) Reaction with boron hydrides, such as $BH_3$, as described, for example, in Houben-Weyl, 4th edition, Volume 6, 16, Chapter VIII, pp. 211–219, Georg-Thieme-Verlag, Stuttgart 1984.
  c) Reaction with hydrogen in the presence of a catalyst, as described, for example, in Houben-Weyl, 4th edition, Volume 6, 16, Chapter VIII, p. 110 ff., Georg-Thieme-Verlag, Stuttgart 1984.
  d) Reaction with sodium or sodium hydride.

Particular preference is given to reduction with $LiAlH_4$ or DIBAL-H.

Reaction C(a)

The bisalcohols of the formula (V) (X=$CH_2OH$) obtained from reaction A or B can be converted into bisaldehydes of the formula (II) according to the invention by selective oxidation. Such an oxidation can be carried out by methods known per se with which those skilled in the art are familiar, as described, for example, in R. C. Larock, Comprehensive Organic Transformations, VCH, 1989, pp. 604–614, and the literature cited therein.

Preference is given to:
  a) the oxidation with dimethyl sulfoxide/oxalyl chloride (Swern oxidation), as is described, for example, in A. J. Mancoso, D. Swern, Synthesis 1981, 165, and
  b) the oxidation with pyridinium chlorochromate (PCC) or pyridinium dichromate, as is described, for example, in Houben-Weyl, 4th edition, Volume E3, pp. 291–296, Georg-Thieme Verlag, Stuttgart, 1983.

Reaction C(b)

According to the invention, the OH groups in the bisalcohols of the formula (V) can be replaced by halogen by nucleophilic substitution.

To prepare chlorides and bromides, preference is given to reacting the corresponding bisalcohol with HCl or HBr, for example in glacial acetic acid, (see, for example, Houben-Weyl, Volume 5/4, p. 385 ff, 1960) or with thionyl chloride or bromide, in the presence or absence of a catalyst, (see, for example, Houben-Weyl, Volume 5/1b, p. 862 ff., 1962).

Chlorides can also be prepared in a preferred way by reaction with phosgene (see, for example, Houben-Weyl, Volume V, 3, p. 952 ff, 1962), bromides by reaction with $PBr_3$. Iodides are preferably prepared by reaction with phosphorus/iodine by the method of A. I. Vogel (see, for example, Houben-Weyl, Volume V, 4, p. 615 ff., 1969).

In all cases, work-up is carried out in a simple manner by known methods with which those skilled in the art are familiar.

Reaction D

The conversion of halogen compounds of the formula (IIb) into the bis(diphenylphosphine oxides) or bis (phosphonic esters) of the formula (IIc) can be easily achieved, for example from the corresponding bis (halomethyl) compounds using the Michaelis-Arbusov reaction with ethyl diphenylphosphinite ($C_6H_5$)P—O—$C_2H_5$ or with triethyl phosphite. Bisphosphonium salts are likewise readily obtainable by reaction of the halides with, for example, triarylphosphines. Bisthio salts can be obtained analogously by reaction with dialkyl sulfides, for example tetrahydrothiophene.

The monomers of the formula (II) which are obtainable in these ways can then be polymerized to form polymers comprising repeating units of the formula (I) by means of the abovementioned polymerization variants, possibly with addition of further comonomers not explicitly mentioned here. These polymers are very particularly suitable as electroluminescence materials.

For the purposes of the invention, electroluminescence materials are materials which can be employed as active layer in an electroluminescence device. The term active layer means that the layer is capable of emitting light on application of an electric field (light-emitting layer) and/or that it improves the injection and/or transport of the positive and/or negative charges (charge injection layer or charge transport layer).

The invention therefore also provides for the use of a polymer comprising repeating units of the formula (I) as electroluminescence material.

For use as electroluminescence materials, the polymers comprising structural units of the formula (I) are applied in the form of a film to a substrate, generally by known methods with which those skilled in the art are familiar, for example dipping or spin coating.

The invention thus likewise provides an electroluminescence device comprising one or more active layers, where at least one of these active layers comprises one or more polymers according to the invention. The active layer can be, for example, a light-emitting layer and/or a transport layer and/or a charge injection layer.

The general structure of such electroluminescence devices is described, for example, in U.S. Pat. No. 4,539,507 and U.S. Pat. No. 5,151,629. Polymer-containing electroluminescence devices are described, for example, in WO-A 90/13148 or EP-B 0443861.

They usually comprise an electroluminescent layer between a cathode and an anode, where at least one of the electrodes is transparent. In addition, one or more electron injection layers and/or electron transport layers can be introduced between the electroluminescent layer and the cathode and/or one or more hole injection layers and/or hole transport layers can be introduced between the electroluminescent layer and the anode. As cathode, preference is given to metals or metallic alloys, e.g. Ca, Mg, Al, In, Mg/Ag. As anode, it is possible to use metals, e.g. Au, or other materials having metallic conductivity, for example oxides such as ITO (indium oxide/tin oxide) on a transparent substrate, e.g. of glass or a transparent polymer.

In operation, the cathode is placed at a negative potential relative to the anode. This results in injection of electrons from the cathode into the electron injection layer/electron transport layer or directly into the light-emitting layer. At the same time, holes from the anode are injected into the hole injection layer/hole transport layer or directly into the light-emitting layer.

The injected charge carriers move toward one another through the active layers under the action of the applied potential. At the interface between charge transport layer and light-emitting layer or within the light-emitting layer, this leads to electron/hole pairs which recombine with emission of light.

The color of the emitted light can be varied by means of the materials used as light-emitting layer.

Electroluminescence devices are employed, for example, as self-illuminating display elements such as control lamps, alphanumeric displays, signs and in optoelectronic couplers.

The present application cites various documents, for example to illustrate the technical field of the invention. All these documents are hereby expressly incorporated by reference into the present application.

The content of the german patent application 196 51 439.8, whose priority is claimed by the present application, and also the abstract of the present application are hereby expressly incorporated by reference into the present application:

The invention is illustrated by the examples, without being restricted thereby.

PART 1: SYNTHESIS OF THE MONOMERS

A. Synthesis of Compounds of the Formula (III)

EXAMPLE A1

Synthesis of Diethyl 2-Bromoterephthalate and 2-Bromo-1,4-bis(hydroxymethyl)benzene a) Synthesis of 2-Bromo-p-xylene p-Xylene (934.4 g; 8.8 mol) and Fe powder (16 g) were placed in the reaction vessel and about 20 ml of bromine were slowly added dropwise. The commencement of the reaction (after about 10 minutes) could be recognized by gas evolution. After the reaction had begun, the remaining bromine (total: 1278.4 g; 8.0 mol) was added dropwise at RT, with water bath cooling (4 hours). The mixture was stirred further for 2 hours at RT. The slightly brownish reaction solution was filtered off and stirred first with water, and then with 480 ml of saturated aqueous $Na_2SO_3$ solution, subsequently shaken once with dilute aqueous NaOH and twice with $H_2O$; the organic phase (clear and colorless) was dried over $MgSO_4$, filtered and purified by being vacuum-distilled twice (diaphragm pump/oil bath, about 100–120° C./60 cm column).

Product (bp. about 85–89° C. at 13–9 mbar; oil bath= 120–155° C.): 1234.1 g (83.4%) $^1$H NMR (400 MHz; $CDCl_3$): δ [ppm]=7.33 (dd; 1H; $J_1$=2, $J_2$=0.7 Hz; H-3), 7.06 (d (br); 1H; $J_1$=8 Hz; H-6), 6.97 (dd; 1H; $J_1$=8, $J_2$=2 Hz; H-5), 2.33 and 2.26 (each: s (br); 3H; Me).

b) Synthesis of 2-Bromoterephthalic Acid:

A 1 l Hastelloy C22 autoclave was charged with a solution of bromo-p-xylene (92.5 g, 0.5 mol), cobalt acetate tetrahydrate (0.62 g, 2.5 mmol), manganese acetate tetrahydrate (0.61 g, 2.5 mmol), hydrogen bromide (0.4 g, 5.0 mmol) and potassium acetate (0.98 g, 10 mmol) in 350 g of glacial acetic acid.

The solution was heated while stirring in a nitrogen atmosphere (18 bar). At 154° C., compressed air was passed through the solution (18 bar; air feed rate about 180 liters per hour). The reaction began immediately. The reaction temperature was held at about 165° C. by means of external cooling. After one hour, the exothermic reaction is complete, the contents of the reactor were again blanketed with nitrogen and cooled to 100° C. The suspension taken out at this temperature was cooled to 20° C. while stirring and the material which crystallized out was filtered off.

After washing three times with 50 ml each time of glacial acetic acid, the colorless product was dried at 50° C. and 65 mbar. Product: colorless, microcrystalline powder, 102.2 g (83.7% of theory), melting point 302° C.

$^1$H NMR (400 MHz; $d_6$-DMSO): δ [ppm]=13.7 (br; 2H; $CO_2H$), 8.18 (d; 1H; $J_1$=2 Hz; H-3), 8.02 (dd; 1H; $J_1$=8, $J_2$=2 Hz; H-5), 7.85 (d; 1H; $J_1$=8 Hz; H-6).

c1) First Synthetic Route to Diethyl 2-Bromoterephthalate

2-Bromoterephthalic acid (122.52 g; 0.5 mol) was suspended in ethanol (138 g; 3 mol) and carbon tetrachloride (150 ml), then 15 ml of sulfuric acid were added by means of a pipette and the mixture was refluxed for 5 days while stirring vigorously.

The suspension became a clear solution within about 24 hours, but the reaction was complete only after 5 days (TLC monitoring). The phases were subsequently separated and the organic phase was shaken with $H_2O$ and aqueous $NaHCO_3$ solution, with the supernatant aqueous phase becoming slightly alkaline. After shaking again with $H_2O$, the organic phase was dried over $Na_2SO_4$ and the solvent was taken off. The desired product was obtained virtually pure (97–98%) without further purification as a yellowish, slightly viscous oil: 118 g (78%), d=1.38 kg/dm$^3$. Fractional vacuum distillation was suitable for further purification. 99.9%-pure product ($^1$H-NMR) was obtained at 1.1 mbar and 142° C.

$^1$H NMR (400 MHz; $CDCl_3$): δ [ppm]=8.30 (d; 1H; $J_1$=1.7 Hz; H-3), 8.01 (dd; 1H; $J_1$=8, $J_2$=1.7 Hz; H-5), 7.79 (d; 1H; $J_1$=8 Hz; H-6), 4.43, 4.41 (each: q; 2H; J=7.1 Hz; O—$CH_2$), 1.42, 1.41 (each: t; 3H; J=7.1 Hz; $CH_3$).

c2) Second Synthetic Route to Diethyl 2-Bromoterephthalate

Bromoterephthalic acid (500 g, 2.04 mol) was placed in the reaction vessel under protective gas, admixed at room temperature while stirring with $SOCl_2$ (728 g, 446 ml, 6.12 mol) and 3 drops of DMF (N,N-dimethylformamide). Even after the end of the addition over 90 minutes, the mixture was a thick slurry and was therefore difficult to stir. It was subsequently heated to an internal temperature of 60° C. and stirred at this temperature for 4 days; a clear solution was then present. The mixture was freed of excess thionyl chloride by adding 2×100 ml of toluene and each time distilling off the thionyl chloride/toluene mixture at atmospheric pressure (140° bath temperature). The resulting liquid acid chloride was admixed over a period of about 50 minutes with absolute ethanol (460 g, 583 ml, 10 mol) while cooling on a water bath (temperature rise to 45°) and heated overnight under reflux. Impurities were filtered off and the solvent was taken off. The honey-colored, slightly viscous product was dried in an oil pump vacuum: 612.7 g (+99% of theory); about 97%-pure ($^1$H-NMR).

NMR: similar to c1). Further purification similar to c1.

c3) Third Synthetic Route to Diethyl 2-Bromoterephthalate

Bromoterephthalic acid (49 g, 0.2 mol) and EtOH (184 g, 233 ml, 4.0 mol) were placed in the reaction vessel under protective gas and were then admixed at RT with $H_2SO_4$ (1 ml) while stirring. The mixture was subsequently refluxed (78° C.). The initially white suspension became a clear solution after 20 minutes. The ethanol was distilled off until the internal temperature had reached 110° C. Fresh ethanol (200 ml) was subsequently added and the procedure was repeated from the beginning. This process was repeated a total of five times, after which the reaction was complete according to TLC. At the end of the reaction, remaining ethanol was distilled off as completely as possible, the reaction mixture was admixed with a little ethyl acetate and washed by shaking first with aqueous $NaHCO_3$ solution and finally to neutrality with $H_2O$. The organic solvent was taken off and the oily product was dried in an oil pump vacuum: 56.6 g (94%), purity (according to $^1$H-NMR) about 97%. Further purification similar to c1.

NMR: similar to c1).

d) Synthesis of 2-Bromo-1,4-bishydroxymethylbenzene

1st Stage:

122.82 g (0.50 mol) of bromoterephthalic acid were placed in the reaction vessel and admixed under $N_2$ with 3 drops of DMF. 110 ml (1.5 mol) of $SOCl_2$ were added dropwise at room temperature, first slowly and then quickly (suspension could be stirred somewhat better, but was still a thick slurry; time: about 70 minutes). The suspension was carefully heated and stirred for 7 hours at an internal temperature of 55° C. After standing overnight at room temperature, the mixture was freed of excess thionyl chloride by distillation. It was then admixed with 2×50 ml of hexane and the thionyl chloride/hexane mixture was distilled off at atmospheric pressure. Finally, a vacuum of 100 mbar was applied for about 30 minutes.

2nd Stage:

23.1 g (0.6 mol) of $LiAlH_4$ were admixed under $N_2$ with 500 ml of absolute THF. A solution from the 1st stage (about 90 ml) in 200 ml of absolute THF was added dropwise at room temperature to the gray suspension (time: about 3 hours). The mixture was then heated to reflux and stirred for 5.5 hours. After cooling to room temperature, the beige suspension was further cooled in an ice bath. 46 g of ice water were carefully added dropwise (time: about 1 hour). After addition of a further 50 ml of $H_2O$, 100 ml of 1 N aqueous $H_2SO_4$ and then 90 ml of ½-concentration aqueous $H_2SO_4$ were added dropwise. This gave 2 phases: upper: yellow, homogeneous; lower: gray suspension. The phases were separated and the lower, gray phase was extracted with 2×200 ml of ethyl acetate. The combined organic phases were extracted with 4×200 ml of $H_2O$ and finally evaporated to dryness. The crude product was obtained as a beige solid (110 g) which could be further purified by recrystallization ($H_2O$/ethanol=2/1). Product: colorless needles (78 g; 72%), melting point: 106–108° C.

$^1$H NMR (400 MHz; $d_6$-acetone): δ [ppm]=7.55 (m; 2H; H-3, H-6), 7.35 (dd; 1H; $J_1$=8, $J_2$=1.9 Hz; H-5), 4.66, 4.62 (each: d; 2H; J=5.9 Hz; $CH_2$—O), 4.37, 4.28 (each: t; 1H; J=5.9 Hz; OH).

EXAMPLE A2

Synthesis of Diethyl 2-Bromo-5-methoxyterephthalate a) Synthesis of 4-Bromo-2,5-dimethylanisole Bromine (291.5 g, 1835 mmol) was added dropwise while stirring to an initially charged mixture of 2,5-dimethylanisole (250 g, 1835 mmol) and Fe powder (3.25 g). The commencement of the reaction could be recognized by gas evolution. The remaining bromine was then added dropwise at room temperature over a period of 30–40 minutes while cooling on a water bath. The reaction mixture was stirred further for about 4 hours. The solution was then separated from the Fe powder, a little chloroform was added and the mixture was shaken with water, which led to the solution becoming lighter in color. After shaking with 50 ml of saturated aqueous $Na_2SO_3$ solution, the solution had become completely decolorized. It was then shaken again with dilute aqueous NaOH and twice with $H_2O$ and, after drying, the solvent was taken off. The crude product was fractionally distilled under reduced pressure.

The product was obtained as a viscous, colorless oil (boiling point 68° C., 0.8 mbar): 285 g (72%); $^1$H NMR ($CDCl_3$): δ [ppm]=7.25 (s, 1H, H-aryl), 6.68 (s, 1H, H-aryl), 3.78 (s, 3H, O—Me), 2.36, 2.14 (each, 3+3H, $CH_3$).

b) Synthesis of 2-Bromo-5-methoxyterephthalic Acid

A 1 l autoclave (HC-22) fitted with disk stirrer, reflux condenser, gas inlet and gas outlet was charged with a solution of cobalt acetate tetrahydrate (1.25 g, 5 mmol), manganese acetate tetrahydrate (1.23 g), HBr (0.81 g), sodium acetate (1.37 g) and 4-bromo-2,5-dimethylanisole (107.5 g, 0.5 mol) in 380 g glacial acetic acid. The reaction solution was heated while stirring to 150° C. under a nitrogen atmosphere (17 bar). At this temperature, air (17 bar) was passed through the solution (180–200 l/h), whereupon the exothermic reaction started immediately. The reaction temperature was kept at 150° C. by external cooling. After about 45 minutes, the exothermic reaction was complete. To make further reaction possible, an air/nitrogen mixture (10% of $O_2$) was passed through the mixture at 150° C. for 30 minutes. The air feed was then stopped and nitrogen was passed in.

The contents of the reactor were cooled to 100° C. under a nitrogen atmosphere, drained as solution into a flask and cooled while stirring to 20° C., with the product crystallizing out. The colorless crystal slurry was filtered with suction and the filter cake was washed four times with 40 g each time of glacial acetic acid.

Drying gave 96.2 g of 2-bromo-5-methoxyterephthalic acid (70%).

$^1$H NMR (DMSO): δ [ppm]=13.5 (br, 2H, COOH), 7.87 (s, 1H, H-aryl), 7.42 (s, 1H, H-aryl), 3.88 (s, 3H, O—Me).

c) Synthesis of Diethyl 2-Bromo-5-methoxyterephthalate

2-Bromo-5-methoxyterephthalic acid (202.89 g, 738 mmol) and 500 ml of EtOH were placed in the reaction vessel under protective gas and then admixed at RT with $H_2SO_4$ while stirring. The mixture was subsequently refluxed at an internal temperature of 78° C. and EtOH was distilled off until the internal temperature was above 100° C. Further ethanol was first introduced and this was then distilled off again. The procedure was repeated until only the diester was present according to TLC. Finally, all the ethanol was taken off, the resulting crude product was taken up in ethyl acetate, extracted with aqueous $NaHCO_3$ solution and finally, after phase separation at drying, all solvent was again taken off. The crystallized solid obtained in this way could, after comminution, be purified by stirring with hexane. This gave 190.4 g (78%) of pale yellow crystals.

Melting point: 61–63° C.; $^1$H NMR ($CDCl_3$): δ [ppm]= 8.00 (s, 1H, H-aryl), 7.34 (s, 1H, H-aryl), 4.43+4.37 (each q, 2+2H, $OCH_2$, J=7.5 Hz), 3.92 (s, 3H, O—Me), 1.42+1.38 (each t, 3+3H, $CH_3$, J=7.5 Hz).

B. Synthesis of Compounds of the Formula (IV)

EXAMPLE B1

Synthesis of 4-Hexyloxybenzeneboronic Acid a) Synthesis of 4-Hexyloxybromobenzene 4-Bromophenol (173 g, 1 mol) was dissolved in about 500 ml of freshly distilled THF under protective gas and, after passing argon through the solution, NaH (33 g, (80% in oil), 1.1 mol) was added a little at a time. During this addition the clear solution became turbid and gray and the temperature rose by 20°. The suspension was stirred for about 1 hour at room temperature under a blanket of protective gas. Hexyl bromide (181 g; 149 ml; 1.1 mol) was placed in a dropping funnel and $N_2$ was briefly passed through it; the hexyl bromide was then added to the reaction mixture over a period of 25 minutes while stirring. The mixture, which was still gray, was refluxed at 75° C. After 3 days, (the suspension had now become paler), the salt formed was filtered off with suction and the filtrate was admixed with 20 ml of EtOH to destroy any remaining NaH (no gas evolution). The yellowish solution was evaporated and the product was isolated from the (turbid) solution by means of fractional vacuum distillation: product: 95° C./1 mbar; 172.5 g (67%); (d~1.17).

$^1$H NMR (400 MHz; $CDCl_3$): δ [ppm]=7.35, 6.76 (AA'BB'; 4H; H-aryl), 3.91 (t; 2H; J=7.5 Hz; O—$CH_2$), 1.77 (pseudo-quin; 2H; J=7.3 Hz; O—$CH_2$—$CH_2$), 1.45–1.25 (m; 6H; H-alkyl), 0.91 (pseudo-t; 3H; J=7.7 Hz; $CH_3$).

b) Synthesis of 4-Hexyloxybenzeneboronic Acid

In a baked-out apparatus filled with argon, magnesium turnings (1.89 g; 78 mmol) were treated with a crystal of iodine and covered with dried THF. Subsequently, a few drops of 4-hexyloxybromobenzene were added to the static solution. The Grignard reaction commenced very quickly and the 4-hexyloxybromobenzene (total amount: 20 g; 78 mmol) was subsequently added dropwise while stirring at such a rate that the mixture boiled gently; during this addition, the mixture was diluted with THF (total of about 100 ml). The mixture was refluxed for 3 hours (only a few flakes of magnesium remaining in the solution) and was subsequently allowed to cool. The Grignard soltuion was transferred in a countercurrent of protective gas to a 250 ml dropping funnel and added dropwise at −70° C. to a solution of trimethyl borate (8.9 g; 9.6 ml; 86 mmol) in 50 ml of dry THF while stirring, with a precipitate being formed. The mixture was allowed to warm to RT overnight and the reaction mixture was poured into a mixture of 100 g of ice and 3 ml of concentrated sulfuric acid while stirring. The organic phase was separated off and the aqueous phase was extracted with 3×100 ml of chloroform, the combined organic phases were evaporated. The crude product was subsequently recrystallized from hexane.

Product: colorless, waxy solid (11.28 g; 66%); melting point: 84–87° C.

$^1$H NMR (400 MHz; $CDCl_3$): δ [ppm]=8.15, 7.00 (AA'BB'; 4H; H-aryl), 4.07 (t; 2H; J=7.7 Hz; O—$CH_2$), 1.83 (pseudo-quin; 2H; J=7.5 Hz; O—$CH_2$—$CH_2$), 1.55–1.32 (m; 6H; H; H-alkyl), 0.93 (pseudo-t; 3H; J=7.7 Hz; $CH_3$). Contained variable amounts of anhydrides.

EXAMPLE B2

Synthesis of 3-(3,7-Dimethyloctyloxy) benzeneboronic Acid a) Synthesis of 3-(3,7-Dimethyloctyloxy)bromobenzene 450 ml of ethanol were placed in the reaction vessel and admixed with NaI (10.5 g; 70 mmol) and KOH (67.3 g; 1.2 mol). A temperature rise from 25 to 40° C. was observed after addition of the KOH. After cooling to room temperature, 3-bromophenol (175.5 g; 1 mol) was added. The white suspension became beige during this addition. 3,7-dimethyloctyl chloride (186.32 g; 212.94 ml; 1.05 mol) was added over a period of 3 minutes by means of a dropping funnel. The mixture was stirred further for 2 hours at RT and subsequently for 96 hours at an internal temperature of 80° C. Ethanol was distilled off. The residue was taken up in ethyl acetate and the precipitate was separated off by filtration. The organic phase was extracted three times with 10% strength by weight aqueous NaOH solution, washed once with $H_2O$, three times with $H_2O$ which had been acidified with $CO_2$ and again with $H_2O$. After drying over $MgSO_4$, the solvent was again taken off on a rotary evaporator and the crude product was purified by fractional vacuum distillation.

Product: high-boiling colorless oil; 180° C. at 2–3 mbar; 262.3 g (84%).

$^1$H NMR (400 MHz; $CDCl_3$): δ [ppm]=7.12 (pseudo-t; 1H; J=8 Hz; H-5), 7.05 (m; 2H; H-2, H-6), 6.81 (ddd; 1H; $J_1$=8, $J_2$=2, $J_3$=0.7 Hz; H-4), 3.97 (m; 2H; O—$CH_2$), 1.81 (m; 1H; O—$CH_2$—$CH_2$—CH), 1.70–1.50 (m; 3H; H-alkyl), 1.35–1.13 (m; 6H; H-alkyl), 0.93 (d; 3H; J=7.7 Hz; $CH_3$), 0.87 (d; 6H; J=7.7 Hz; $CH_3$).

b) Synthesis of 3-(3,7-Dimethyloctyloxy)benzeneboronic Acid

Mg turnings (24.7 g, 1.02 mol) were placed in the reaction vessel and the apparatus was baked out under argon. At room temperature, about 100 ml of THF were introduced from the dropping funnel and a few crystals of iodine were added. A few ml of 3-(3,7-dimethyloctyloxy)bromobenzene were subsequently added dropwise to the static solution and the point at which the drops entered the solution was heated by means of a hot air blower. After the reaction had started, the remaining 3-(3,7-dimethyloctyloxy)bromobenzene (total: 313 g, 1 mol, 280 ml) was allowed to continuously run in dropwise while stirring (70 min). At the same time, a further 1100 ml of THF were added. The reaction mixture was stirred under reflux for a further two hours.

The resulting Grignard reagent was, after cooling to room temperature, added dropwise under protective gas and with rapid stirring to a mixture of 800 ml of THF and 123 ml of trimethyl borate (114 g, 1.10 mol) which had been cooled to −70° C. The rate of addition was such that the internal temperature did not exceed 60° C. (time: 3 hours). A pale suspension was formed.

The reaction mixture was stirred into 1200 g of ice water/40 ml of concentrated $H_2SO_4$. The clear phases were separated and the aqueous phase was shaken with ethyl acetate. The combined organic phases were stirred with water and, after drying, evaporated.

The resulting colorless solid was purified by stirring with about 500 ml of hexane (to which 2 ml of concentrated aqueous HCl had been added).

This gave 239 g (86%) of colorless crystalline powder. Melting point: 83–89° C.

$^1$H NMR (400 MHz; $CDCl_3$): δ [ppm]=7.81 (td; 1H; $J_1$=8, $J_2$=1.3 Hz; H-4), 7.73 (dd; 1H; $J_1$=2, $J_2$=1.1 Hz; H-2), 7.43 (t; 1H; J=8 Hz; H-5), 7.13 (ddd; 1H; $J_1$=8, $J_2$=2, $J_3$=1.1 Hz; H-6), 4.11 (m; 2H; O—$CH_2$), 1.90 (m; 1H; O—$CH_2$—$CH_2$—CH), 1.75–1.50 (m; 3H; H-alkyl), 1.44–1.14 (m; 6H; H-alkyl), 1.00 (d; 3H; J=7.9 Hz; $CH_3$), 0.88 (d; 6H; J=7.8 Hz; $CH_3$). Contains variable amounts of anhydrides.

EXAMPLE B3

Synthesis of 2,5-Dimethylbenzeneboronic Acid

Magnesium turnings (30.3 g; 0.55 mol) are placed in a baked-out apparatus flushed with argon, covered with about 30 ml of THF and treated with a few crystals of iodine. A few drops of bromo-p-xylene (cf. Example A1 a)) were subsequently added to the static solution. The Grignard reaction commenced very quickly and the remaining bromo-p-xylene (total amount: 92.5 g; about 70 ml; 0.5 mol) was subsequently added dropwise while stirring. The mixture was refluxed for 4 hours, then cooled. The Grignard solution was then transferred in a countercurrent of protective gas into a 500 ml dropping funnel and added dropwise at −70° C. to a solution of trimethyl borate (62.4 g; 67 ml; 0.6 mol) in 350 ml of THF while stirring (time: about 1 hour). During this addition, a precipitate was formed. The reaction mixture was allowed to warm to RT overnight and was then poured while stirring into a mixture of 700 g of ice and 20 ml of concentrated sulfuric acid. The organic phase was separated off, the aqueous phase was extracted three times with chloroform and the combined organic phases were evaporated. The crude product was recrystallized from chloroform/hexane.

This gave a colorless microcrystalline powder: 47.71 g (64%).

$^1$H NMR (400 MHz; $CDCl_3$): δ [ppm]=8.00 (d; 1H; J=1.4 Hz; H-6), 7.26 (dd; 1H; $J_1$=8.0, $J_2$=1.4 Hz; H-4), 7.17 (d; 1H; J=8 Hz; H-3), 2.76, 2.38 (each: s; 3H; $CH_3$). Contained variable amounts of anhydrides.

EXAMPLE B4

Synthesis of 4-(3,7-Dimethyloctyloxy) benzeneboronic Acid a) Synthesis of 4-(3,7-Dimethyloctyloxy)bromobenzene
Procedure similar to Example B2, a).
Yield: 85%; Boiling point: 180° C. at 2 mbar; $^1$H NMR ($CDCl_3$): δ [ppm]=7.36, 6.77 (AA'BB', 4H, H-aryl), 3.95 (m, 2H, O—$CH_2$), 1.82 (m, 1H, H-3'), 1.6 (m, 3H, H-2', H-7'), 1.24 (m, 6H, H-4', H-5', H-6'), 0.94 (d, 3H, Me, J=7 Hz), 0.87 (d, 6H, Me, J=7 Hz).
b) Synthesis of 4-(3,7-Dimethyloctyloxy)benzeneboronic Acid
Procedure similar to Example B2, b).
Yield: 83%; Melting point: 57–63° C.; $^1$H NMR ($CDCl_3$): δ [ppm]=7.67, 6.92 (AA'BB', 4H, H-aryl), 4.6 (br, 2H, B(OH)$_2$), 4.03 (m, 2H, O—$CH_2$),1.87 (m, 1H, H-3'), 1.65 (m, 3H, H-2', H-7'), 1.27 (m, 6H, H-4', H-5', H-6'), 0.95 (d, 3H, Me, J=7 Hz), 0.87 (d, 6H, Me, J=7 Hz). Contains variable amounts of anhydrides.

EXAMPLE B5

Synthesis of 3,4-bis(2-Methylpropyloxy) benzeneboronic Acid a) Synthesis of 1,2-bis(2-Methylpropyloxy)benzene
Catechol (220.22 g, 2 mol) and NaI (10.49 g, 0.14 mol) were initially charged in 900 ml of ethanol and heated to reflux. Subsequently, KOH (56.11 g, 1 mol) dissolved in about 300 ml of ethanol and, simultaneously, 1-bromo-2-methylpropane (137.03 g, 1 mol, 108.75 ml) were slowly added dropwise. The mixture was refluxed further overnight. On the next day, the same amounts of KOH and alkyl bromide were again added. This procedure was repeated a total of seven times. After cooling the reaction mixture, the solution was decanted from the solid. The filter cake was washed with ethanol. The organic phase was evaporated. The filter cake was dissolved in 1 l of warm water and admixed with the organic phase which had been diluted with ethyl acetate. After phase separation, the organic phase was again stirred with 10% strength aqueous NaOH, washed with water and dried over $Na_2SO_4$. The crude product obtained after taking off the solvent was fractionally distilled under reduced pressure.

The product was obtained as a colorless oil (boiling point: 82° C. at 0.18 mbar): 333.4 g (75%).

$^1$ H NMR ($CDCl_3$): δ [ppm]6.87 (ps-s, 4H, H-aryl), 3.75 (d, 4H, O—$CH_2$, J=8 Hz), 2.13 (ps-non, 2H, C—H, J=8 Hz), 1.05 (d, 12H, $CH_3$, J=8 Hz).

b) Synthesis of 3,4-bis(2-Methylpropyloxy)bromobenzene
1,2-Bis(-2-methylpropyloxy)benzene (359.61 g, 1.62 mol) and 500 ml of $CH_2Cl_2$ were placed in the reaction vessel and admixed with a little iron powder. While cooling, bromine (266.88 g, 1.78 mol) (mixed with about 200 ml of $CH_2Cl_2$) was slowly added dropwise. The mixture was stirred for about 20 hours at room temperature. For the work-up, the mixture was stirred with aqueous $Na_2SO_3$ solution and the iron powder was subsequently filtered off. The organic phase was then shaken twice with $NaHCO_3$ solution and subsequently washed with water until neutral. After drying, the organic phase was evaporated.

Fractionally distilling the crude product twice gave the desired product as a colorless solid (166.9 g, 34%).

Melting point: 47° C.; $^1$H NMR ($CDCl_3$): δ [ppm]=6.98 (m, 2H, H-2, H-6), 6.73 (m, 1H, H-5), 3.72, 3.70 (2×d, 2×2H, O—$CH_2$, J=8 Hz), 2.12 (m, 2H, CH), 1.04 (m, 12H, $CH_3$).

c) Synthesis of 3,4-bis(2-Methylpropyloxy)benzeneboronic Acid
Procedure similar to Example B2, b).
Yield: 76%; Melting point: 146° C.; $^1$H NMR ($CDCl_3$): δ [ppm]=7.81 (dd, 1H, H-6, $J_1$=8 Hz, $J_2$=1.8 Hz), 7.68 (d, 1H, H-2, J=1.8 Hz), 6.99 (d, 1H, H-5, J=8 Hz), 3.89, 3.84 (2×d, 2×2H, O—$CH_2$, J=8 Hz), 2.13 (m, 2H, CH), 1.07 (m, 12H, $CH_3$). Contains variable amounts of anhydrides.

EXAMPLE B6

Synthesis of 4'-(3,7-Dimethyloctyloxy)biphenyl-4-boronic Acid a) Synthesis of 4-(3,7-Dimethyloctyloxy)-4'-bromobiphenyl
Procedure similar to Example B2, a).
Work-up by recrystallization from ethanol.
Colorless crystals, 85% yield.
Melting point: 104° C.; $^1$H NMR ($CDCl_3$): δ [ppm]=7.53, 7.40 (AA'BB', 4H, H-aryl), 7.47, 6.96 (AA'BB', 4H, H-aryl), 4.03 (m, 2H, O—CH$_2$), 1.83 (m, 1H, H-3'), 1.62 (m, 3H, H-2', H-7'), 1.3 (m, 6H, H-4', H-5', H-6'), 0.96 (d, 3H, Me, J=7.5 Hz), 0.87 (d, 6H, Me, J=7.5 Hz).

b) Synthesis of 4'-(3,7-Dimethyloctyloxy)biphenyl-4-boronic Acid:

Procedure similar to Example B2, b).

Yield: 78%; Melting point: 116° C.; $^1$H NMR (DMSO-d$_6$): δ [ppm]=8.02 (br, 2H, B(OH)$_2$), 7.83, 7.58 (AA'BB', 4H, H-aryl), 7.61, 7.01 (AA'BB', 4H, H-aryl), 4.04 (m, 2H, O—CH$_2$), 1.77 (m, 1H, H-3'), 1.58 (m, 3H, H-2', H-7'), 1.25 (m, 6H, H-4', H-5', H-6'), 0.92 (d, 3H, Me, J=7.5 Hz), 0.86 (d, 6H, Me, J=7.5 Hz).

C. Coupling Reactions as Reaction A

EXAMPLE C1

Synthesis of Diethyl 2-(4'-Hexyloxyphenyl)terephthalate

Diethyl bromoterephthalate (30.1 g, 100 mmol), K$_2$CO$_3$ (27.6 g, 200 mmol), 140 ml of toluene and 140 ml of H$_2$O were placed in the reaction vessel and flushed with argon for 30 minutes. 4-Hexyloxyphenylboronic acid (26.7 g, 120 mmol) (cf. B1) and Pd(PPh$_3$)$_4$ (1.16 g, 1 mmol) were subsequently added under protective gas. The yellowish green, turbid mixture was stirred vigorously under a blanket of protective gas at an internal temperature of 85° C. After 7 hours, the reaction was complete. After phase separation, the organic phase was shaken with dilute HCl/H$_2$O (until neutral). The aqueous phase was shaken with toluene and the organic phases were combined. After filtration from any palladium residues, the solution was evaporated.

The product was obtained as a yellowish brown oil in satisfactory purity (about 85%): 44.7 g (112%).

$^1$H NMR (400 MHz; CDCl$_3$): δ [ppm]=8.03 (dd; 1H; J$_1$=2, J$_2$=1 Hz; H-3), 8.02 (dd; 1H; J$_1$=8, J$_2$=2 Hz; H-5), 7.79 (dd; 1H; J$_1$=8, J$_2$=1 Hz; H-6), 7.25, 6.93 (AA'BB'; 4H; H-phenyl), 4.40, 4.14 (each: q; 2H; J=8 Hz; CO$_2$—CH$_2$), 3.99 (t; 2H; J=7.5 Hz; O—CH$_2$), 1.81 (m; 2H; O—CH$_2$—CH$_2$), 1.53–1.33 (m; 6H; H-alkyl), 1.40, 1.07 (each: t; 3H; J=8 Hz; CO$_2$—CH$_2$—CH$_3$), 0.91 (m; 3H; CH$_3$).

EXAMPLE C2

Synthesis of Dimethyl 2-(3'-(3,7-Dimethyloctyloxy)phenyl)terephthalate

Dimethyl bromoterephthalate (49.7 g, 182 mmol, obtained from TransWorld, Rockville, Md., USA, or prepared by a method similar to Example A1 c)), K$_2$CO$_3$ (50.3 g, 364 mmol) and 170 ml of toluene and 170 ml of H$_2$O were placed in the reaction vessel and flushed with argon for 30 minutes. 3-(3,7-dimethyloctyloxy)boronic acid (55.7 g, 200 mmol) (cf. B2) and Pd(PPh$_3$)$_4$ (0.93 g, 0.8 mmol) were subsequently added under protective gas. The yellowish green, turbid mixture was stirred vigorously under a blanket of protective gas at an internal temperature of 85° C. After 24 hours, the reaction was complete. After phase separation, the organic phase was shaken with dilute HCl/H$_2$O (until neutral). The aqueous phase was shaken with ethyl acetate and the organic phases were combined. These were evaporated and dried at 2 mbar. The product was obtained as a yellow oil in satisfactory purity (greater than 95%): 76.1 9 (98%).

$^1$H NMR (400 MHz; CDCl$_3$): δ [ppm]=8.07 (d; 1H; J=2 Hz; H-3), 8.05 (dd; 1H; J$_1$=8, J$_2$=2 Hz; H-5), 7.82 (d; 1H; J=8 Hz; H-6), 7.29 (t; 1H; J=8 Hz; H-5'), 6.90 (m; 3H; H-2', H-4', H-6'), 4.01 (m; 2H; O—CH$_2$), 3.94, 3.67 (each: s; 3H; CO$_2$—CH$_3$), 1.84 (m; 1H; O—CH$_2$—CH$_2$—CH), 1.63–1.48 (m; 3H; H-alkyl), 1.37–1.12 (m; 6H; H-alkyl), 0.96 (d; 3H; J=7.8 Hz; CH$_3$), 0.87 (d; 6H; J=7.7 Hz; CH$_3$).

EXAMPLE C3

Synthesis of Diethyl 2-(2',5'-Dimethylphenyl)terephthalate

Diethyl bromoterephthalate (45.2 g, 150 mmol), K$_2$CO$_3$ (41.5 g, 300 mmol), 140 ml of toluene and 140 ml of H$_2$O were placed in the reaction vessel and flushed with argon for 30 minutes. 2,5-Dimethylbenzeneboronic acid (24.8 g, 165 mmol) (cf. B3) and Pd(PPh$_3$)$_4$ (0.7 g, 0.6 mmol) were subsequently added under protective gas. The brownish mixture, which was turbid as a result of phase separation, was stirred vigorously under a blanket of protective gas at an internal temperature of 85° C. The reaction was complete after 24 hours (according to TLC). After phase separation, the organic phase was shaken with dilute HCl/H$_2$O (until neutral). The aqueous phase was shaken with toluene and the organic phases were combined. After filtering off any palladium residues, the solution was evaporated. The product was obtained as a yellow oil in satisfactory purity (greater than 97%). Yield: 48.7 g (99%).

$^1$H NMR (400 MHz; CDCl$_3$): δ [ppm]=8.07 (dd; 1H; J$_1$=8, J$_2$=2 Hz; H-5), 7.96 (d; 1H; J=8 Hz; H-6), 7.92 (d; 1H; J=2 Hz; H-3), 7.14 (d; 1H; J=7.9 Hz; H-3'), 7.09 (dd; 1H; J$_1$=7.9, J$_2$=2 Hz; H-4'), 6.91 (d; 1H; J=2 Hz; H-6'), 4.39, 4.16 (each: t; 3H; J=8 Hz; CO$_2$—CH$_2$), 2.32, 2.02 (each: s; 3H; aryl-CH$_3$), 1.39, 0.97 (each: t; 3H; J=8 Hz; CO$_2$—CH$_2$—CH$_3$).

EXAMPLE C4

Synthesis of Diethyl 4'-(3,7-Dimethyloctyloxyphenyl)terephthalate

Procedure similar to Example C3; palladium residues were additionally eliminated by stirring with 1% strength aqueous NaCN solution.

The product (100% yield) is a colorless, highly viscous oil.

$^1$H NMR (CDCl$_3$): δ [ppm]=8.04 (d, 1H, H-3, J=1.8 Hz), 8.03 (dd, 1H, H-5, J$_1$=7.8, J$_2$=1.8 Hz), 7.8 (d, 1H, H-6, J=7.8 Hz), 7.25, 6.93 (AA'BB', 4H, H-aryl), 4.40, 4.15 (2×q, 2×2H, CO$_2$CH$_2$, J=7.6 Hz), 4.04 (m, 2H, O—CH$_2$), 1.86 (m, 1H, H-3"), 1.60 (m, 3H, H-2', H-7'), 1.40,1.07 (2×t, 2×3H, ester-CH$_3$, J=7.6 Hz), 1.30 (m, 6H, H-4', H-5', H-4'), 0.92 (d, 3H, Me, J=7.5 Hz), 0.86 (d, 6H, Me, J=7.5 Hz).

EXAMPLE C5

Synthesis of Diethyl 3,4-bis(2-Methylpropyloxy)phenylterephthalate

Synthesis similar to Example C4. The product (99% yield) is a colorless, highly viscous oil.

$^1$H NMR (CDCl$_3$): δ [ppm]=8.05 (d, 1H, H-3, J=1.9 Hz), 8.03 (dd, 1H, H-5, J$_1$=7.9, J$_2$=1.9 Hz), 7.77 (d, 1H, H-6, J=7.9 Hz), 6.87 (m, 3H, H-aryl), 4.40, 4.13 (2×q, 2×2H, CO$_2$CH$_2$, J=7.5 Hz), 3.79, 3.76 (2×d, 2×2H, O—CH$_2$, J=8 Hz), 2.13 (m, 2H, CH), 1.41, 1.07 (2×t, J=7.5 Hz), 1.04 (m, 12H, CH$_3$).

EXAMPLE C6

Synthesis of Diethyl 4-[4'-(3,7-Dimethyloctyloxy)biphenyl]terephthalate

Synthesis similar to Example C4. The product (99% yield) is a colorless, highly viscous oil.

$^1$H NMR (CDCl$_3$): δ [ppm]=8.10 (d, 1H, H-3, J=1.9 Hz), 8.07 (dd, 1H, H-5, J$_1$=7.9, J$_2$=1.9 Hz), 7.86 (d, 1H, H-6, J=7.9 Hz), 7.59, 7.38 (AA'BB', 4H, H-aryl), 7.56, 6.99 (AA'BB', 4H, H-aryl), 4.41, 4.14 (2×q, 2×2H, CO$_2$CH$_2$, J=7.6 Hz), 4.05 (m, 2H, O—CH$_2$), 1.86 (m, 1H, H-3"), 1.65 (m, 3H, H-2", H-7"), 1.41, 1.04 (2×t, 2×3H, ester-CH$_3$, J=7.6 Hz), 1.30 (m, 6 H H-4", H-5", H-6"), 0.96 (d, 3H, Me, J=7.5 Hz), 0.87 (d, 6H, Me, J=7.5 Hz).

EXAMPLE C7

Synthesis of Diethyl 2-[4-(3,7-Dimethyloctyloxy) phenyl]-5-methoxyterephthalate

Synthesis similar to Example C4 (here using diethyl 2-bromo-5-methoxy-terephthalate, cf. Example A2). The product (95% yield) was a colorless, highly viscous oil.

$^1$H NMR (CDCl$_3$): δ [ppm]=7.75, 7.35 (2×s, 2×1H, H-3, H-6), 7.20, 6.91 (AA'BB', 4H, H-aryl), 4.37, 4.12 (2×q, 2×2H, CO$_2$CH$_2$, J=7.6 Hz), 4.02 (m, 2H, O—CH$_2$), 3.97 (s, 3H, O—Me), 1.84 (m, 1H, H-3"), 1.62 (m, 3H, H-2", H-7"), 1.37, 1.03 (2×t, 2×3H, ester-CH$_3$, J=7.6 Hz), 1.28 (m, 6H, H-4", H-5", H-6"), 0.96 (d, 3H, Me, J=7.5 Hz), 0.87 (d, 6H, Me, J=7.5 Hz).

EXAMPLE C8

Synthesis of Diethyl 2-[3-(3,7-Dimethyloctyloxy) phenyl]-5-methoxyterephthalate

Synthesis similar to Example C7. The product (95% yield) was a colorless, highly viscous oil.

$^1$H NMR (CDCl$_3$): δ [ppm]=7.78, 7.37 (2×s, 2×1H, H-3, H-6), 7.26 (t; 1H; H-5', J=8 Hz), 6.86 (m; 3H; H-2', H-4', H-6'), 4.37, 4.10 (2×q, 2×2H, CO$_2$CH$_2$, J=7.6 Hz), 4.00 (m, 2H, O—CH$_2$), 3.97 (s, 3H, O—Me), 1.83 (m, 1H, H-3"), 1.62 (m, 3H, H-2", H-7"), 1.37, 1.01 (2×t, 2×3H, ester-CH$_3$, J=7.6 Hz), 1.28 (m, 6H, H-4", H-5", H-6"), 0.95 (d, 3H, Me, J=7.5 Hz), 0.86 (d, 6H, Me, J=7.5 Hz).

D. Reductions as Reaction B

EXAMPLE D1

Synthesis of 2,5-Bishydroxymethyl-4'-hexyloxybiphenyl

LiAlH$_4$ (5.3 g, 140 mmol) was added to about 200 ml of THF under a blanket of argon and diethyl 2-(4'-hexyloxyphenyl)terephthalate (40 9, 100 mmol) (cf. C1) together with a further 50 ml of THF was slowly added dropwise from a dropping funnel. The reaction mixture was vigorously stirred during this addition. It was subsequently refluxed for about one hour. The reaction mixture was brought to RT and, with water bath cooling and under a blanket of argon, ice water was carefully added dropwise until gas evolution had ceased. Dilute (10% strength) sulfuric acid was subsequently added dropwise until the turbid gray mixture was clear. The phases were separated by addition of chloroform and the aqueous phase was shaken with chloroform (twice). The organic phases were washed once with H$_2$O and subsequently evaporated. The resulting crude product was recrystallized from hexane/ethyl acetate (5/1).

Product: 20.3 g (65%) of colorless needles, purity>98%. Melting point: 72.5–74° C.

$^1$H NMR (400 MHz; CDCl$_3$): δ [ppm]=7.53 (d; 1H; J=8 Hz; H-6), 7.36 (dd; 1H; J$_1$=8, J$_2$=2 Hz; H-5), 7.27 (d; 1H; J=2 Hz; H-3), 7.26, 6.94 (AA'BB'; 4H; H-phenyl), 4.72, 4.61 (each: s; 2H; CH$_2$—OH), 3.99 (t; 2H; J=7.5 Hz; O—CH$_2$), 1.81 (m; 2H; O—CH$_2$—CH$_2$),1.53–1.26 (m; 6H; H-alkyl), 0.92 (m; 3H; CH$_3$).

EXAMPLE D2

Synthesis of 2,5-bis(Hydroxymethyl)-3'-(3,7-dimethyloctyloxy)biphenyl

LiAlH$_4$ (9.4 g, 248 mmol) was added to 300 ml of THF under N$_2$. At RT, dimethyl 2-(3'-(3,7-dimethyloctyloxy) phenyl)terephthalate (75.5 g, 177 mmol), dissolved in 120 ml of THF, was then slowly added dropwise. The mixture was subsequently stirred for 4 hours under reflux. After cooling, excess LiAlH$_4$ was carefully destroyed by addition of H$_2$O. Half-concentration H$_2$SO$_4$ was then carefully added dropwise (about 50 ml). The mixture became very viscous during this addition. After stirring further for 1 hour, a clear solution was obtained and a slimy gray precipitate could be seen at the bottom of the flask. The clear solution was decanted off and the solvent was taken off. The precipitate which remained was stirred with a large amount of water and ethyl acetate and, after filtration, the organic phase was separated off, the solvent was taken off and combined with the first organic phase. The combined organic phases were taken up in ethyl acetate and extracted five times with water. After drying over MgSO$_4$, the solvent was taken off. The resulting oil was stirred a number of times with hexane and dried in an oil pump vacuum. The product was thus obtained as a pure pale yellow, highly viscous oil (54 g, 82%).

$^1$H NMR (400 MHz; CDCl$_3$): δ [ppm]=7.50 (d; 1H; J=7.8 Hz; H-6), 7.34 (dd; 1H; J$_1$=7.8, J$_2$=1.9 Hz; H-5), 7.30 (dt; 1H; J$_1$=8, J$_2$=1 Hz; H-5'), 7.26 (d; 1H; J=1.9 Hz; H-3), 6.88 (m; 3H; H-2', H-4', H-6'), 4.69, 4.59 (each: s; 2H; CH$_2$—OH), 4.00 (m; 2H; O—CH$_2$), 1.97 (s; 2H; OH), 1.82 (m; 1H; O—CH$_2$—CH$_2$—CH), 1.67–1.50 (m; 3H; H-alkyl), 1.40–1.13 (m; 6H; H-alkyl), 0.95 (d; 3H; J=7.5 Hz; CH$_3$), 0.87 (d; 6H; J=7.6 Hz; CH$_3$)

EXAMPLE D3

Synthesis of 2,5-bis(Hydroxymethyl)-2',5'-dimethylbiphenyl

LiAlH$_4$ (7.9 g, 208 mmol) was added to about 250 ml of THF under a blanket of argon. Diethyl 2-(2',5'-dimethylphenyl)terephthalate (48.6 g, 149 mmol) (cf. C3) was diluted in a dropping funnel with about 60 ml of THF and was slowly added dropwise. The reaction mixture was vigorously stirred during this addition. The mixture was diluted with a further 100 ml of THF and was then refluxed at 67° C. After 2 hours, the mixture was cooled to RT. While cooling on a water bath and under a blanket of argon, ice water was added dropwise until gas evolution had ceased. Dilute (10% strength) sulfuric acid was subsequently added dropwise until the turbid gray mixture became clear. The phase mixture was separated by generous addition of chloroform and the aqueous phase was subsequently shaken twice with chloroform. The organic phases were shaken once with H$_2$O and evaporated. The crude product was recrystallized from chloroform/hexane: 24.7 g (68%) of colorless, microcrystalline powder; melting point: 145–148° C. (purity>95%).

$^1$H NMR (400 MHz; CDCl$_3$): δ [ppm]=7.54 (d; 1H; J=7.8 Hz; H-6), 7.38 (dd; 1H; J$_1$=7.8, J$_2$=1.8 Hz; H-5), 7.15 (d; 1H; J=7.8 Hz; H-3'), 7.13 (d; 1H; J=1.9 Hz; H-3), 7.08 (dd; 1H; J$_1$=7.71 J$_2$=1.5 Hz; H-4'), 6.94 (d; 1H; J=1.5 Hz; H-6'), 4.72, 4.42 (each: s; 2H; CH$_2$—OH), 2.33, 2.01 (each: s; 3H; aryl-CH$_3$).

EXAMPLE D4

Synthesis of 2,5-bis(Hydroxymethyl)-4'-(3,7-dimethyloctyloxy)biphenyl

The procedure was similar to Example D3; but the mixture was worked up in alkaline rather than acid medium: for this purpose, xml of water (when using x g of LiAlH$_4$) were carefully added after the reduction was complete. Subsequently, xml of aqueous NaOH solution (15% strength) and finally 3xml of water were added. After each addition, the mixture was stirred further for about 15 minutes ("1:1:3 method"). The solution was filtered with suction from the solid formed, the latter was again stirred with THF and the combined organic phases were finally evaporated. This work-up was found to be more advantageous than the acid variant which was employed in Examples D1 to D3. Recrystallization from hexane/ethyl acetate (30:1).

The product (88% yield) was obtained as a colorless, waxy solid.

Melting point: 67° C.; $^1$H NMR (CDCl$_3$): δ [ppm]=7.53 (d, 1H, H-6, J=7.9 Hz), 7.36 (dd, 1H, H-5, J$_1$=7.9, J$_2$=2 Hz), 7.27 (d, 1H, H-3, J=2 Hz), 7.28, 6.95 (AA'BB', 4H, H-aryl), 4.72, 4.63 (2×d, 2×2H, CH$_2$—OH, J=8 Hz), 4.03 (m, 2H, O—CH$_2$),1.90, 1.68 (2×t, 2×1H, OH, J=8 Hz), 1.85 (m, 1H, H-3'), 1.65 (m, 3H, H-2', H-7'), 1.30 (m, 6H, H-4', H-5', H-6'), 0.97 (d, 3H, Me, J=7.5 Hz), 0.87 (d, 6H, Me, J=7.5 Hz).

EXAMPLE D5

Synthesis of 2,5-bis(Hydroxymethyl)-3',4'-bis(2-methylpropyloxy)biphenyl

Synthesis similar to Example D4. Recrystallization from hexane/ethyl acetate (15:1).

The product (84% yield) was obtained as colorless crystals.

Melting point: 73° C.; $^1$H NMR (CDCl$_3$): δ [ppm]=7.53 (d, 1H, H-6, J=7.9 Hz), 7.37 (dd, 1H, H-5, J$_1$=7.9, J$_2$=2 Hz), 7.29 (d, 1H, H-3, J=2 Hz), 6.89 (m, 3H, H-aryl), 4.73, 4.63 (2×s, 2×2H, CH$_2$O), 3.80, 3.77 (2×d, 2×2H, O—CH$_2$, J=8 Hz), 2.15 (m, 2H, CH), 1.55 (br, 2H+H$_2$O, OH), 1.06, 1.03 (2×d, 2×6H, CH$_3$).

EXAMPLE D6

Synthesis of 2,5-bis(Hydroxymethyl)-4''-(3,7-dimethyloctyloxy)terphenyl

Synthesis similar to Example D4. Recrystallization from hexane/ethyl acetate (15:1).

The product (88% yield) was obtained as colorless crystals.

Melting point: 106° C.; $^1$H NMR (CDCl$_3$): δ [ppm]=7.60, 7.41 (AA'BB', 4H, H-aryl), 7.56, 6.99 (AA'BB', 4H, H-aryl), 7.54 (d, 1H, H-6, J=7.9 Hz), 7.39 (dd, 1H, H-5, J$_1$=7.9, J$_2$=2 Hz), 7.32 (d, 1H, H-3, J=2 Hz), 4.74, 4.66 (2×d, 2×2H, CH$_2$O, J=4 Hz), 4.05 (m, 2H, O—CH$_2$), 1.87 (m, 1H, H-3'), 1.77, 1.67 (2×br, 2×1H, OH), 1.65 (m, 3H, H-2', H-7'), 1.27 (m, 6H, H-4', H-5', H-6'), 0.96 (d, 3H, Me, J=7.5 Hz), 0.88 (d, 6H, Me, J=7.5 Hz).

EXAMPLE D7

Synthesis of 2,5-bis(Hydroxymethyl)-4-methoxy-4'-(3,7-dimethyloctyloxy)biphenyl

Synthesis similar to Example D4. Recrystallization from hexane/ethyl acetate (20:1).

The product (93% yield) was obtained as colorless crystals.

Melting point: 101 ° C.; $^1$H NMR (CDCl$_3$): δ [ppm]=7.21, 6.93 (AA'BB', 4H, H-aryl), 7.18, 7.10 (2×s, 2×1H, H-3, H-6), 4.70, 4.62 (2×s, 2×2H, CH$_2$O), 4.02 (m, 2H, O—CH$_2$), 3.93 (s, 3H, O—Me), 1.85 (m, 1H, H-3'), 1.65 (br, 2H, OH), 1.60 (m, 3H, H-2', H-7'), 1.28 (m, 6H, H-4', H-5', H-6'), 0.96 (d, 3H, Me, J=7.5 Hz), 0.86 (d, 6H, Me, J=7.5 Hz).

EXAMPLE D8

Synthesis of 2,5-bis(Hydroxymethyl)-4-methoxy-3'-(3,7-dimethyloctyloxy)biphenyl

Synthesis similar to Example D4. Crude product stirred with hot hexane. The product (99% yield) was obtained as a colorless, waxy solid.

Melting point: 55° C.; $^1$H NMR (CDCl$_3$): δ [ppm]=7.29 (t; 1H; J=8 Hz; H-5'), 7.21, 7.12 (2×s, 2×1H, H-3, H-6), 6.87 (m; 3H; H-2', H-4', H6'), 4.70, 4.64 (2×d, 2×2H, CH$_2$O, J=8 Hz), 4.01 (m, 2H, O—CH$_2$), 3.93 (s, 3H, O—Me), 2.29, 1.63 (2×t, 2×1H, OH, J=8 Hz), 1.84 (m, 1H, H-3'), 1.60 (m, 3H, H-2', H-7'), 1.25 (m, 6H, H-4', H-5', H-6'), 0.94 (d, 3H, Me, J=7.5 Hz), 0.87 (d, 6H, Me, J=7.5 Hz).

E. Halogenations as Reaction C(b)

EXAMPLE E1

Synthesis of 2,5-bis(Bromomethyl)-4'-hexyloxybiphenyl

With water cooling, 2,5-bis(hydroxymethyl)-4'-hexyloxybiphenyl (12.6 g, 40 mmol) (cf. D1) were stirred into HBr (33% strength in HAc, 36 ml, 200 mmol). The two-phase, pale brown and slightly viscous suspension was stirred overnight at RT under protective gas. The resulting reaction mixture was repeatedly extracted with chloroform until the aqueous phase was colorless. Evaporation of the organic phase gave a clear, honey-colored oil which under refrigeration solidified in 1–2 days to give a waxy, cloudy solid: 16.9 g (96%); melting point: 38.5°–40.5° C.; purity>98%.

$^1$H NMR (400 MHz; CDCl$_3$): δ [ppm]=7.49 (d; 1H; J=8 Hz; H-6), 7.35 (dd; 1H; J$_1$=8, J$_2$=2 Hz; H-5), 7.26 (d; 1H; J=2 Hz; H-3), 7.36, 6.98 (AA'BB'; 4H; H-phenyl), 4.48, 4.44 (each: s; 2H; CH$_2$—Br), 4.01 (t; 2H; J=6.5 Hz; O—CH$_2$), 1.81 (quint; 2H; J=6.9 Hz; O—CH$_2$—CH$_2$), 1.50–1.30 (m; 6H; H-alkyl), 0.92 (t; 3H; J=7.0 Hz; CH$_3$).

EXAMPLE E2

Synthesis of 2,5-bis(Chloromethyl)-4'-hexyloxybiphenyl 2,5-Bis(hydroxymethyl)-4'-hexyloxybiphenyl (9.43 g, 30 mmol) (cf. D1) and 50 ml of toluene, mixed with a drop of pyridine, were placed (undissolved) in the reaction vessel and SOCl$_2$ was added dropwise over a period of about 10 minutes. After addition of a few drops, the suspension became clear, which was associated with a slight rise in temperature. The solution was subsequently stirred at an internal temperature of 60° C. After 90 minutes, the mixture was worked up. The reaction mixture was cooled, admixed with about 20 ml of water and then shaken with H$_2$O. The aqueous phase was shaken with toluene, the organic phases were combined and evaporated: 10.5 g (100%) of honey-colored, oily product. Purity: about 90% ($^1$H-NMR).

$^1$H NMR (400 MHz; CDCl$_3$): δ [ppm]=7.53 (d; 1H; J=8 Hz; H-6), 7.38 (dd; 1H; J$_1$=8, J$_2$=2 Hz; H-5), 7.28 (d; 1H;

J=2 Hz; H-3), 7.33, 6.97 (AA'BB'; 4H; H-phenyl), 4.60, 4.53 (each: s; 2H; $CH_2$—Cl), 4.01 (t; 2H; J=6.9 Hz; O—$CH_2$), 1.83 (pseudo-quint; 2H; J=6.9 Hz; O—$CH_2$—$CH_2$), 1.55–1.33 (m; 6H; H-alkyl), 0.94 (m; 3H; $CH_3$).

EXAMPLE E3

Synthesis of 2,5-bis(Bromomethyl)-2',5'-dimethylbiphenyl 2,5-Bis(hydroxymethyl)-2',5'-dimethylbiphenyl (10 g, 41 mmol) (cf. D3) was stirred into HBr (33% strength in HAc, 36 ml, 200 mmol) cooled by means of a water bath. The clear solution was stirred overnight at RT under protective gas. It was extracted with chloroform a number of times until the aqueous phase was colorless. Evaporation of the organic phase gave a honey-colored oil which did not crystallize even in a freezer (−18° C.): 14.3 g (94%); purity>98%.

$^1$H NMR (400 MHz; $CDCl_3$): δ [ppm]=7.52 (d; 1H; J=7.8 Hz; H-6), 7.37 (dd; 1H; $J_1$=7.8, $J_2$=1.9 Hz; H-5), 7.18 (d; 1H; J=7.8 Hz; H-3'), 7.17 (d; 1H; J=1.9 Hz; H-3), 7.11 (dd; 1H; $J_1$=7.7, $J_2$=1.6 Hz; H-4'), 7.00 (d; 1H; J=1.7 Hz; H-6'), 4.48, 4.28 (each: AB; 2H; $J_{AB}$=12 Hz; $CH_2$—Br), 2.35, 2.03 (each: s; 3H; aryl-$CH_3$).

EXAMPLE E4

Synthesis of 2,5-bis(Chloromethyl)-2',5'-dimethylbiphenyl $SOCl_2$ (36.9 g; 22.7 ml, 310 mmol) was added dropwise under protective gas to 2,5-bis(hydroxymethyl)-2',5'-dimethylbiphenyl (34.2 g, 141 mmol) over a period of about 20 minutes while stirring at room temperature. At the end of the addition, an oily, slightly turbid solution had been obtained. The reaction mixture was stirred for 20 hours at room temperature, subsequently carefully stirred into 200 ml of aqueous $NaHCO_3$ solution and vigorously stirred with ethyl acetate. After phase separation, the organic phase was shaken with water until it was neutral and finally, after drying over $Na_2SO_4$, the solvent was taken off. The crude product was purified by fractional vacuum distillation over a little $NaHCO_3$. This gave 27.9 g (65%) of product as a clear viscous oil; purity>99% (boiling point: 135° C. at 0.3 mbar).

$^1$H NMR (400 MHz; $CDCl_3$): δ [ppm]=7.56 (d; 1H; J=7.9 Hz; H-6), 7.40 (dd; 1H; $J_1$=7.9, $J_2$=1.8 Hz; H-5), 7.18 (d; 1H; J=1.8 Hz; H-3), 7.16 (d; 1H; J=8 Hz; H-3'), 7.11 (dd; 1H; $J_1$=7.9, $J_2$=1.6 Hz; H-4'), 6.97 (d; 1H; J=1.5 Hz; H-6'), 4.60, 4.35 (each: AB; 2H; $J_{AB}$=12 Hz; $CH_2$—Cl), 2.33, 2.02 (each: s; 3H; aryl-$CH_3$).

EXAMPLE E5

Synthesis of 2,5-bis(Chloromethyl)-3'-(3,7-dimethyloctyloxy)biphenyl

Under $N_2$, 2,5-bis(hydroxymethyl)-3'-(3,7-dimethyloctyloxy)biphenyl (50.7 g, 137 mmol) was placed in the reaction vessel and thionyl chloride (20 ml, 274 mmol) was carefully added. 2 ml of further thionyl chloride were added after 2 hours and again after 8 hours and the mixture was finally stirred for a total of 20 hours at room temperature. The mixture was carefully poured into aqueous $NaHCO_3$ solution and extracted with ethyl acetate, and the organic phase was finally washed until neutral. After drying over $MgSO_4$, the ethyl acetate was taken off and the mixture was fractionally distilled under reduced pressure. This gave the product (39 g, 70%) as a highly viscous, colorless oil (boiling point: 212° C. at 0.67 mbar).

$^1$H NMR (300 MHz; $CDCl_3$): δ [ppm]=7.54 (d; 1H; J=8.3 Hz; H-6), 7.41 (dd; 1H; $J_1$=8.2, $J_2$=2.1 Hz; H-5), 7.34 (d; 1H; $J_1$=8, $J_2$=1 Hz; H-5'), 7.31 (d; 1H; J=2 Hz; H-3), 6.94 (m; 3H; H-2'; H-4', H-6'); 4.61, 4.52 (each: s; 2H; $CH_2$Cl), 4.04 (m; 2H; O—$CH_2$), 1.84 (m; 1H; O—$CH_2$—$CH_2$—CH), 1.72–1.46 (m; 3H; H-alkyl), 1.38–1.10 (m; 6H; H-alkyl), 0.94 (d; 3H; J=6.7 Hz; $CH_3$), 0.86 (d; 6H; J=6.9 Hz; $CH_3$).

EXAMPLE E6

Synthesis of 2,5-bis(Chloromethyl)-4'-(3,7-dimethyloctyloxy)biphenyl

Procedures similar to Example E5; the product (67% yield) was obtained by distillation in a short-path still (0.3 mbar, 243° C.) as a colorless, highly viscous oil (purity: 99%).

$^1$H NMR ($CDCl_3$): δ [ppm]=7.52 (d, 1H, H-4, J=7.9 Hz), 7.38 (dd, 1H, H-5, $J_1$=7.9, $J_2$=2 Hz), 7.32, 6.97 (AA'BB', 4H, H-aryl), 7.29 (d, 1H, H-3, J=2 Hz), 4.59, 4.52 (2×s, 2×2H, $CH_2$Cl), 4.04 (m, 2H, O—$CH_2$), 1.85 (m, 1H, H-3'), 1.60 (m, 3H, H-2', H-7'), 1.30 (m, 6H, H-4', H-5', H-6'), 0.97 (d, 3H, Me, J=7.5 Hz), 0.87 (d, 6H, Me, J=7.5 Hz).

EXAMPLE E7

Synthesis of 2,5-bis(Chloromethyl)-3',4'-bis(2-methylpropyloxy)-biphenyl

Procedure similar to Example E5; the product (42% yield) was obtained by distillation in a short-path still (0.5 mbar, 240° C.) as a colorless, highly viscous oil (purity: 99%).

$^1$H NMR ($CDCl_3$): δ [ppm]=7.53 (d, 1H, H-6, J=7.8 Hz), 7.38 (dd, 1H, H-5, $J_1$=7.8, $J_2$=2 Hz), 7.31 (d, 1H, H-3, J=2 Hz), 6.98 (d, 1H, H-2', J=2 Hz), 6.93 (d, 1H, H-5', J=8 Hz), ), 6.90 (dd, 1H, H-6', $J_1$=8, $J_2$=2 Hz), 4.60, 4.53 (2×s, 2×2H, $CH_2$Cl), 3.80 (m, 4H, O—$CH_2$), 2.16 (m, 2H, CH), 1.07, 1.04 (2×d, 2×6H, $CH_3$, J=7 Hz).

EXAMPLE E8

Synthesis of 2,5-bis(Chloromethyl)-4''-(3,7-dimethyloctyloxy)terphenyl

Procedure similar to Example E5; the product (25% yield) was obtained by distillation in a short-path still (0.1 mbar, 265° C.) as a colorless, highly viscous oil (purity:>99%).

$^1$H NMR ($CDCl_3$): δ [ppm]=7.65, 7.45 (AA'BB', 4H, H-aryl), 7.58, 7.00 (AA'BB', 4H, H-aryl), 7.56 (d, 1H, H-6, J=8 Hz), 7.43 (dd, 1H, H-5, $J_1$=8, $J_2$=2 Hz), 7.35 (d, 1H, H-3, J=2 Hz), 4.62, 4.57 (2×s, 2×2H, $CH_2$Cl), 4.06 (m, 2H, O—$CH_2$), 1.87 (m, 1H, H-3'), 1.60 (m, 3H, H-2', H-7'), 1.27 (m, 6H, H-4', H-5', H-6'), 0.97 (d, 3H, Me, J=7.5 Hz), 0.87 (d, 6H, Me, J=7.5 Hz).

EXAMPLE E9

Synthesis of 2,5-bis(Chloromethyl)-4-methoxy-4'-(3,7-dimethyl-octyloxy)biphenyl

Procedure similar to Example E5; the product (40% yield) was obtained by distillation in a short-path still (0.3 mbar, 265° C.) as a colorless, highly viscous oil (purity: 99%).

$^1$H NMR ($CDCl_3$): δ [ppm]=7.29, 6.95 (AA'BB', 4H, H-aryl), 7.27, 7.03 (2×s, 2×1H, H-3, H-6), 4.65, 4.53 (2×s, 2×2H, $CH_2$Cl), 4.04 (m, 2H, O—$CH_2$), 3.94 (s, 3H, O—Me), 1.85 (m, 1H, H-3'), 1.63 (m, 3H, H-2', H-7'), 1.28

(m, 6H, H-4', H-5', H-6'), 0.97 (d, 3H, Me, J=7.5 Hz), 0.88 (d, 6H, Me, J=7.5 Hz).

EXAMPLE E10

Synthesis of 2,5-bis(Chloromethyl)-4-methoxy-3'-(3,7-dimethyl-octyloxy)biphenyl

Procedure similar to Example E5; the product (25% yield) was obtained by distillation in a short-path still (0.2 mbar, 247° C.) as a colorless, highly viscous oil. More product could be recovered from the distillation residue by column chromatography (purity: 99%).

$^1$H NMR (CDCl$_3$): δ [ppm]=7.32 (t; 1H; J=8 Hz; H-5'), 7.30, 7.04 (2×s, 2×1H, H-3, H-6), 6.93 (m; 3H; H-2', H-4', H-6'), 4.66, 4.53 (2×s, 2×2H, CH$_2$Cl), 4.04 (m, 2H, O—CH$_2$), 3.95 (s, 3H, O—Me), 1.84 (m, 1H, H-3'), 1.60 (m, 3H, H-2', H-7'), 1.25 (m, 6H, H-4', H-5', H-6'), 0.94 (d, 3H, Me, J=7.5 Hz), 0.86 (d, 6H, Me, J=7.5 Hz).

F) Oxidations as Reaction C(a)

EXAMPLE F1

Synthesis of 2-(4'-Hexyloxyphenyl) terephthalaldehyde

Oxalyl chloride (8.4 g, 5.7 ml, 66 mmol) were added to 70 ml of dichloromethane and the mixture was cooled to −60° C. A solution of DMSO (10.2 g, 9.3 ml, 131 mmol) in 30 ml dichloromethane was added dropwise over a period of 10 minutes. The mixture was stirred further for 5 minutes. A solution of 2,5-bis(hydroxymethyl)-4'-hexyloxybiphenyl (10 g, 32 mmol) (cf. D1) in 70 ml of dichloromethane was then added dropwise over a period of 15 minutes (the reaction solution became turbid). It was stirred further for 10 minutes and triethylamine (15.9 g, 21.8 ml, 157 mmol) was subsequently added dropwise. During this addition, the reaction solution became yellow and a precipitate formed. The acetone/dry ice bath was removed and the mixture was stirred for 2 hours at RT. This resulted in a light-colored solid floating on the yellow liquid phase. The mixture was admixed with 150 ml of water, stirred further for 10 minutes (the solid went into solution), the organic phase was separated off, the aqueous phase was extracted twice with dichloromethane, the combined organic phases were subsequently washed three times with water, dried over Na$_2$SO$_4$, filtered and subsequently evaporated to dryness on a rotary evaporator. The yellow oil crystallized after some time at RT; it was subsequently recrystallized from hexane. It took a relatively long time for the product to become solid: pale beige, microcrystalline powder, 5.67 g (57%), purity about 98%. Melting point: 44.5–45.5° C.

$^1$H NMR (400 MHz; CDCl$_3$): δ [ppm]=10.14 (s; 1H; 1—CHO), 10.05 (d; 1H; J=0.8 Hz; 4—CHO), 8.13 (d; 1H; J=7.5 Hz; H-6), 7.96 (d; 1H; J=1.5 Hz; H-3), 7.94 (ddd; 1H; J$_1$=7.7, J$_2$=1.5, J$_3$=0.8 Hz; H-5), 7.33, 7.03 (AA'BB'; 4H; H-phenyl), 4.03 (t; 2H; J=6.7 Hz; O—CH$_2$), 1.83 (quint; 2H; J=6.6 Hz; O—CH$_2$—CH$_2$), 1.55–1.35 (m; 6H; H-alkyl), 0.92 (t; 3H; J=7.2 Hz; CH$_3$).

G. Reactions D

EXAMPLE G1

Synthesis of 2,5-bis(Diethylmethylenephosphonate)-4'-hexyloxy-biphenyl 2,5-Bis(chloromethyl)-4'-hexyloxybiphenyl (9.2 g, 26.2 mmol) (cf. E2) and triethyl phosphite (10.9 g, 11.2 ml, 65.5 mmol) were mixed under protective gas and heated to an oil bath temperature of 60° C. (without condensing); this resulted in evolution of chloroethane. After a reaction time of 40 minutes, the reaction was slowly heated with a condenser and subsequently stirred for 3 hours at 190° C. Subsequently, the mixture was dried at about 1 mbar, first at RT then with heating up to 190° C. The crude product was taken up in ethyl acetate, extracted with water and finally again freed of solvent on a rotary evaporator: 13.11 g (90%) of slightly brownish oil. Purity: about 90% ($^1$H-NMR).

$^1$H NMR (400 MHz; CDCl$_3$): δ [ppm]=7.50 (dd; 1H; J$_1$=8.2, J$_2$=2.5 Hz; H-6), 7.28, 6.93 (AA'BB'; 4H; H-phenyl), 7.24 (td; 1H; J$_1$=8.2, J$_2$=2.2 Hz; H-5), 7.16 (m; 1H; H-3), 3.97 (m; 10H; P—O—CH$_2$, aryl-O—CH$_2$), 3.17, 3.13 (each: d; 2H; J=8 Hz; CH$_2$—P), 1.82 (m; 2H; O—CH$_2$—CH$_2$), 1.54–1.33 (m; 6H; H-alkyl), 1.25, 1.22 (each: t; 6H; J=6.7 Hz; P—O—CH$_2$—CH$_3$), 0.92 (m; 3H; CH$_3$).

V. Synthesis of Comonomers

EXAMPLE V1

Preparation of 1-Chloro-3,7-dimethyloctane 275 ml (1.46 mol) of 3,7-dimethyl-1-octanol were placed in a 1 l four-neck round-bottom flask fitted with dropping funnel, low-temperature condenser and magnetic stirrer bar and cooled to −3° C. 0.7 ml of pyridine were then added and 129 ml (1.77 mol, 1.2 eq) of thionyl chloride were added dropwise at such a rate that the temperautre did not exceed 15° C. (75 minutes). The HCl gas formed was trapped in Ca(OH)$_2$/water in a wash bottle. The mixture was then heated to 130° C. over a period of 40 minutes. After two hours at this temperature, the mixture was cooled to 50° C., volatile constituents were distilled off by application of a vacuum of 100 mbar. The residue was then cooled to room temperature, diluted with 200 ml of n-hexane and washed first twice with 50 ml each time of 10% strength of NaOH solution in water, then with 50 ml of water and finally with 50 ml of saturated aqueous NaHCO$_3$ solution. The solution was dried over Na$_2$SO$_4$, the solvent was removed by distillation on a rotary evaporator. The residue was purified by distillation under reduced pressure (13 mbar, 86–87° C.). This gave 178.9 g (1.01 mol, 69%) of 1-chloro-3,7-dimethyloctane as a colorless oil.

Boiling point: 86–87° C., 13 mbar. $^1$H-NMR (400 MHz, CDCl$_3$): δ (ppm)=3.61–3.49 (m, 2H, CH$_2$Cl); 1.82–1.74 (m, 1H); 1.69–1.48 (m, 3H); 1.37–1.21 (m, 3H); 1.19–1.09 (m, 3H); 0.89 (d, J=6.7 Hz, 3H; CH$_3$); 0.87 (d, J=6.7 Hz, 6H; 2×CH$_3$).

EXAMPLE V2

Preparation of 1-Methoxy-4-(3,7-dimethyloctyloxy) benzene

In a 2 l four-neck round-bottom flask fitted with dropping funnel, low-temperature condenser, gas outlet and magnetic stirrer bar, 184.4 g (1.48 mol) of p-methoxyphenol, 275.9 g (1.56 mol, 1.05 eq) of 1-chloro-3,7-dimethyloctane, 106.9 g of KOH (85%-pure, 1.62 mol, 1.09 eq) and 15.04 g sodium iodide were dissolved in 620 ml of dry ethanol and heated at the boiling point for 64 hours with magnetic stirring. The mixture was cooled to room temperature and the reaction solution was decanted from the solid formed. The reaction solution was evaporated on a rotary evaporator. The solid was taken up in 400 ml of 10% strength aqueous NaOH solution. This solution was extracted twice with 400 ml each time of toluene. The organic phases were combined, washed with 100 ml of 10% strength aqueous NaOH solution and dried over $Na_2SO_4$. The solvent was distilled off under reduced pressure on a rotary evaporator. The residue was distilled under reduced pressure (1 mbar) (temperature at the top:159–162° C.). This gave 372.4 g (1.41 mol, 95%) 1-methoxy-4-(3,7-dimethyloctyloxy)benzene as a colorless oil.

Boiling point: 159–162° C. /1 mbar. $^1$H-NMR (400 MHz, $CDCl_3$): δ (ppm)=6.82 (d, J=0.8 Hz, 4H; $H_{arom}$); 3.97–3.88 (m, 2H; $OCH_2$); 3.75 (s, 3H; $OCH_3$); 1.84–1.75 (m, 1H); 1.71–1.47 (m, 3H); 1.38–1.23 (m, 3H); 1.22–1.09 (m, 3H); 0.93 (d, J=6.6 Hz, 6H; $CH_3$); 0.86 (d, J=6.7 Hz, 6H; $2\times CH_3$).

EXAMPLE V3

Preparation of 2,5-bis(Chloromethyl)-1-methoxy-4-(3,7-dimethyl-octyloxy)benzene 304.96 g (1.03 mol) of 1-(3,7-dimethyloctyloxy)-4-methoxybenzene and 85.38g (2.84 mol) of paraformaldehyde were placed in a 4 l four-neck flask fitted with mechanical stirrer, reflux condenser, thermometer and dropping funnel under $N_2$ and admixed with 490 ml (580.6 g, 5.89 mol) of 37% strength HCl; this gave a yellow suspension. 990 ml (1070 g, 10.5 mol) of acetic anhydride were then added dropwise at such a rate that the internal temperature did not exceed 70° C. (time: 1.5 hours). The last 100 ml were added all at once, which resulted in a temperature rise from 70° C. to 75° C.; the reaction mixture changed color from beige/brown to reddish. The mixture is stirred for 3.5 hours at 70–75° C. It was then cooled while stirring to room temperature: a light-colored solid crystallized at 32° C. and the temperature rose to 35° C. The mixture was allowed to stand overnight at room temperature, resulting in deposition of a light-colored solid. The reaction mixture was admixed with 940 ml of cold-saturated sodium acetate solution (time: about 15 minutes) and 700 ml of 25% strength NaOH were then added dropwise at such a rate that the internal temperature did not exceed 30° C. (time: about 35 minutes). The mixture was then heated to 52° C. (time: about 30 minutes) and then cooled on an ice bath while stirring rapidly (time: about 30 minutes). The cream-colored, granular solid was filtered off with suction and washed with 200 ml of $H_2O$. The solid (451 g) was admixed with 2500 ml of hexane, stirred at room temperature and then admixed with 300 ml of boiling $H_2O$. The mixture was stirred for 20 minutes and the aqueous phase was separated off. The yellowish organic phase was stirred with 3×300 ml of $H_2O$; the pH was 5. The organic phase was dried over $Na_2SO_4$ and filtered. The filtrate was evaporated and crystallized in a freezer chest.

The precipitate which crystallized out (447 g) was filtered off with suction, washed with hexane at −20° C. and, for recrystallization, dissolved in 1000 ml of hexane at 60° C. The solution was crystallized at −20° C., the solid was filtered off with suction and dried under reduced pressure at room temperature. This gave 279.6 g (0.774 mol, 75%) of 2,5-bis(chloromethyl)-1-methoxy-4-(3,7-dimethyloctyloxy) benzene as a colorless solid.

Melting point: 65° C.; $^1$H NMR (400 MHz, $CDCl_3$): δ (ppm)=6.92 (d, J=2.0 Hz, 2H; $H_{arom}$); 4.63 (d, J=2.6 Hz, 4H; $CH_2Cl$); 4.07–3.98 (m, 2H; $OCH_2$); 3.85 (s, 3H; $OCH_3$); 1.88–1.80 (m, 1H); 1.76–1.66 (br, m, 1H); 1.65–1.49 (m, 2H); 1.40–1.26 (m, 3H); 1.23–1.12 (m, 3H); 0.95 (d, J=6.8 Hz, 3H; $CH_3$); 0.87 (d, J=6.8 Hz, 6H; $2\times CH_3$). $^{13}$C NMR (100 MHz, $CDCl_3$): δ (ppm)=151.0, 150.7 (C1, C4); 127.1, 126.8 (C2, C5); 114.4, 113.3 (C3, C6); 67.5 ($OCH_2$); 56.3 ($OCH_3$); 41.3 ($2\times CH_2Cl$); 39.2 (C2'); 37.3, 36.3 (C4', C6'); 29.9 (C3'); 28.0 (C7'); 24.7 (C5'); 22.7, 22.6, 19.7 ($3\times CH_3$).

EXAMPLE V4

Preparation of 1,4-bis(3,7-Dimethyloctyloxy) benzene

In a 2 l four-neck round-bottom flask equipped with dropping funnel, low-temperature condenser, gas inlet and magnetic stirrer bar, 84.2 g of KOH (85%-pure, 1.28 mol, 1.28 eq) and 14.9 g sodium iodide (0.10 mol) were dissolved in 600 ml of dry ethanol. This resulted in a temperature rise to 35° C. 55.1 g (0.50 mol) of hydroquinone were then added to the turbid solution and 221 g of 1-chloro-3,7-dimethyloctane (1.25 mol, 1.25 eq) were slowly added dropwise. The pale brown suspension was heated at the boiling point for 10 hours with magnetic stirring. A further 21 g of KOH (85%-pure, 0.32 mol) and 55 g of 1 chloro-3,7-dimethyloctane (0.31 mol, 0.31 eq) were then added. The mixture was heated at the boiling point for a further 84 hours.

The reaction solution was cooled to room temperature and evaporated on a rotary evaporator. The solid was extracted with 500 ml of ethyl acetate. This solution was extracted three times with 200 ml each time of 10% strength aqueous NaOH solution, washed with 200 ml of water and then dried over $MgSO_4$. The solvent was distilled off under reduced pressure on a rotary evaporator. The residue was distilled under reduced pressure (0.05 mbar) (temperature at the top:166–170° C.). This gave 147.4 g (0.37 mol, 75%) of 1,4-bis(3,7-dimethyloctyloxy)benzene as a colorless oil.

Boiling point: 166–170° C./0.05 mbar. $^1$H NMR (400 MHz, $CDCl_3$): δ (ppm)=6.82 (s, 4H; $H_{arom}$); 3.98–3.88 (m, 4H; $OCH_2$); 1.84–1.75 (m, 2H); 1.71–1.61 (br, m, 2H); 1.59–1.49 (m, 4H); 1.40–1.09 (m, 12H); 0.93 (d, J=6.5 Hz, 6H; $2\times CH_3$); 0.86 (d, J=6.5 Hz, 12H; $4\times CH_3$).

EXAMPLE V5

Preparation of 2,5-bis(Chloromethyl)-1,4-bis(3,7-dimethyloctyloxy)benzene 58.6 g (150 mmol) of 1,4-bis(3,7-dimethyloctyloxy) benzene and 12.43 g (414 mmol) of paraformaldehyde were placed under $N_2$ in a 1 l four-neck flask fitted with mechanical stirrer, reflux condenser, thermometer and dropping funnel and were admixed with 71.4 ml (858 mmol) of 37% strength HCl, giving a yellow suspension. 144 ml (156 g, 1.53 mol) of acetic anhydride were then added dropwise at such a rate that the internal temperature did not exceed 70° C. (time: 2 hours). The mixture was stirred for 9 hours at 70–75° C. Another 110 ml (119 g, 1.17 mol) of acetic anhydride were then added and the mixture was stirred for another 8 hours at 70–75° C. It was then cooled to room temperature while stirring, resulting in the crystallization of a light-colored solid. The reaction mixture is admixed with 240 ml of cold-saturated sodium acetate solution (time: about 15 minutes) and 100 ml of 25%strength NaOH were then added dropwise at such a rate that the internal temperature does not exceed 30° C. (time: about 35 minutes). The granular solid was filtered off and distributed between 300 ml of hexane and 300 ml of water. The organic phase is dried over $Na_2SO_4$ and filtered. The filtrate was evaporated and crystallized in a refrigerator.

The solid was recrystallized from 170 ml of hexane (washing with hexane at −20° C.).

This gave 28.3 g (58.0 mmol, 39%) of 2,5-bis (chloromethyl)-1,4-bis(3,7-dimethyl-octyloxy)benzene as a colorless solid.

Melting point: 55° C.; $^1$H NMR (400 MHz, CDCl$_3$): δ (ppm)=6.92 (s, 2H; H$_{arom}$); 4.62 (s, 4H; CH$_2$Cl); 4.07–3.97 (m, 4H; OCH$_2$); 1.88–1.80 (m, 2H); 1.76–1.66 (br, m, 2H); 1.65–1.49 (m, 4H); 1.40–1.13 (m, 12H); 0.95 (d, J=6.5 Hz, 6H; 2×CH$_3$); 0.87 (d, J=6.8 Hz, 12H; 2×CH$_3$).

PART 2: SYNTHESIS AND CHARACTERIZATION OF THE POLYMERS

A. Synthesis of Copolymers

EXAMPLE A1

Copolymer from 50% of 2,5-bis(Chloromethyl)-1-methoxy-4-( 3,7-dimethyloctyloxy)benzene and 50% of 2,5-bis(Chloromethyl)-4'-(3,7-dimethyloctyloxy)biphenyl (Polymer A1)

Preparation of Poly(2-methoxy-5-(3,7-dimethyloctyloxy)-p-phenylene-vinylene)-co-(2-(4'-(3,7-dimethyloctyloxy)phenyl)-p-phenylene-vinylene)

In a dry 6 l four-neck flask fitted with mechanical Teflon stirrer, reflux condenser, thermometer and dropping funnel, 3400 ml of dry and O$_2$-free 1,4-dioxane were heated to 97° C. A solution of 8.44 g (23.35 mmol) of 2,5-bis (chloromethyl)-1-methoxy-4-(3,7-dimethyloctyloxy) benzene and 9.52 g (23.35 mmol) of 2,5-bis(chloromethyl)-4'-(3,7-dimethyloctyloxy)biphenyl in 50 ml of dry 1,4-dioxane was then added. Subsequently, a solution of 13.10 g (117 mmol) of potassium tert-butoxide in 117 ml of dry 1,4-dioxane was added dropwise to the intensively stirred mixture over a period of 5 minutes. The color changed from colorless via yellow to orange-red. After 5 minutes, a further 10.48 g (93 mmol) of potassium tert-butoxide, dissolved in 93 ml of 1,4-dioxane, were added. After stirring for 2 hours at 95–97° C., the reaction mixture was cooled to 45° C. and a mixture of 19 ml of acetic acid and 20 ml of 1,4-dioxane was added. The now orange solution was poured into 4 l of intensively stirred water. The polymer which precipitated was isolated by filtration through a polypropylene filter and dried under reduced pressure. The crude yield was 12.65 g (40.6 mmol, 87%).

The polymer was dissolved in 1690 ml of THF by heating to 60° C. and was precipitated at 40° C. by addition of 1700 ml of methanol. After drying under reduced pressure, this step was repeated. After drying under reduced pressure, 7.10 g (=22.79 mmol, 49%) of the polymer A1 was obtained as pale orange fibers.

$^1$H NMR (400 MHz, CDCl$_3$): δ (ppm)=7.9–6.9 (br, m, 6.5H); 4.2–3.6 (br, m, 3.5 H); 2.0–0.9 (br, m, 10H); 0.89, 0.86 (2 s, 9H).

GPC: THF+0.25% of oxalic acid; column set SDV500, SDV1000, SDV10000 (from PSS), 35° C., UV detection at 254 nm, polystyrene standard: M$_w$=1.5×10$^6$ g/mol, M$_n$=2.8×10$^5$ g/mol.

EXAMPLE A2

Copolymer from 50% of 2,5-bis(Chloromethyl)-1-methoxy-4-(3,7-dimethyloctyloxy)benzene and 50% of 2,5-bis(Chloromethyl)-3'-(3,7-dimethyloctyloxy) biphenyl (Polymer A2)

Preparation of Poly(2-methoxy-5-(3,7-dimethyloctyloxy)-p-phenylene-vinylene)-co-(2-(3'-(3,7-dimethyloctyloxy)phenyl)-p-phenylene-vinylene)

3.5 l of dry and O$_2$-free 1,4-dioxane were placed in a dry 6 l four-neck flask fitted with mechanical stirrer, reflux condenser, thermometer and dropping funnel and were heated to 95° C. while stirring. 9.00 g (24.9 mmol) of 2,5-bis(chloromethyl)-1-methoxy-4-(3,7-dimethyloctyloxy) benzene and 10.13 g (24.9 mmol) of 2,5-bis(chloromethyl)-3'-(3,7-dimethyloctyloxy)biphenyl, dissolved in 30 ml of dry 1,4-dioxane, were then added. Subsequently, a solution of 13.97 g (124.5 mmol), 2.5 eq) of potassium tert-butoxide in 125 ml of dry 1,4-dioxane was added dropwise to the intensively stirred mixture over a period of 5 minutes. The color changed from colorless via yellow to orange-red. After stirring for 5 minutes at 95–96° C., the same amount (13.97 g, 124.5 mmol, 2.5 eq) of potassium tert-butoxide in 125 ml of 1,4-dioxane was again added over a period of one minute. After stirring for a further 2 hours at 95°–97° C., the reaction mixture was cooled to 55° C. and a mixture of 30 ml of acetic acid and 30 ml of 1,4-dioxane was added. While stirring vigorously, 1.8 l of water was added to the now pale orange solution over a period of 5 minutes. The polymer which precipitated was filtered off and washed twice with 100 ml each time of methanol. Drying under reduced pressure gave 14.1 g of crude polymer.

The crude product was dissolved in 1.8 l of THF by heating to 60° C. and was precipitated by addition of 2 l of methanol. After drying under reduced pressure and washing with 200 ml of methanol, this step was repeated. After drying for two days under reduced pressure, 10.80 g (=34.7 mmol, 70%) of the polymer A2 was obtained as pale orange fibers.

$^1$H NMR (400 MHz, CDCl$_3$): δ (ppm)=7.9–6.6 (br, m; 6.5H); 4.2–3.6 (br, m, 3.5H); 2.0–0.95 (br, m, 10H); 0.86, 0.84 (2 s, 9H).

GPC: THF+0.25% of oxalic acid, column set SDV500, SDV1000, SDV10000 (from PSS), 35° C., UV detection at 254 nm, polystyrene standard: M$_w$=7.4×10$^5$ g/mol, M$_n$=7×10$^4$ g/mol.

The $^1$H NMR of this polymer is shown in FIG. 1.

EXAMPLE A3

Copolymer from 50% of 2,5-bis(Chloromethyl)-1-methoxy-4-(3,7-dimethyloctyloxy)benzene and 50% of 2,5-bis(Chloromethyl)-2',5'-dimethylbiphenyl (Polymer A3)

Preparation of poly(2-methoxy-5-(3,7-dimethyloctyloxy)-p-phenylene-vinylene)-co-(2-(2',5'-dimethyl)phenyl)-p-phenylene-vinylene).

3.5 l of dry 1,4-dioxane were placed in a baked-out 6 l four-neck flask fitted with mechanical Teflon stirrer, reflux condenser, thermometer and dropping funnel, degased by passing N$_2$ through it for 15 minutes and then heated to 95° C. while stirring. 9.00 g (24.9 mmol) of 2,5-bis (chloromethyl)-1-methoxy-4-(3,7-dimethyloctyloxy) benzene and 6.95 g (24.9 mmol) of 2,5-bis(chloromethyl)-2',5'-dimethylbiphenyl, dissolved in 30 ml of dry 1,4-dioxane, were then added. Subsequently, a solution of 13.97 g (124.5 mmol, 2.5 eq) of potassium tert-butoxide in 125 ml of dry 1,4-dioxane was then added dropwise to the intensively stirred mixture over a period of 5 minutes. After stirring further for 5 minutes at 95° C., the same amount (13.97 g, 124.5 mmol, 2.5 eq) of potassium tert-butoxide in 125 ml of 1,4-dioxane was again added over a period of one minute. The temperature was held at from 95 to 98° C. for another 2 hours; after this time, the reaction mixture was cooled to 55° C. and a mixture of 30 ml of acetic acid and 30 ml of 1,4-dioxane was added. The color of the reaction mixture changed from pale red to pale orange. 1.8 l of water were added to the mixture over a period of 2 minutes. The floccular polymer which precipitated was filtered off, washed twice with 200 ml each time of methanol and dried under reduced pressure at room temperature. This gave 11.1 g of crude polymer.

The crude product is dissolved in 1.5 l of THF by heating to 60° C. and is precipitated by dropwise addition of 1.5 l of methanol. After drying under reduced pressure and washing with 300 ml of methanol, this step is repeated. After drying for two days under reduced pressure, this gave 6.60 g (=26.7 mmol, 54%) of the polymer A3 as a pale orange powder.

$^1$H NMR (400 MHz, CDCl$_3$): δ (ppm)=7.9–6.1 (br, m; 6H); 4.2–3.4 (br, m, 2.5H); 2.35 (br, s, 1.5H); 2.1–0.95 (br, m, 6.5H); 0.85 (br, s, 4.5H).

GPC: THF+0.25% of oxalic acid; column set SDV500, SDV1000, SDV10000 (from PSS), 35° C., UV detection at 254 nm, polystyrene standard: $M_w$=6.2×10$^5$ g/mol, $M_n$=9× 10$^4$ g/mol.

EXAMPLE A4

Copolymer from 50% of 2,5-bis(Chloromethyl)-1-methoxy-4-(3',7'-dimethyloctyloxy)benzene and 50% of 2,5-bis(Bromomethyl)-2',5'-dimethylbiphenyl (Polymer A4)

Preparation of poly(2-methoxy-5-(3,7-dimethyloctyloxy)-p-phenylene-vinylene)-co-(2-(2',5'-dimethyl)phenyl)-p-phenylene-vinylene).

1160 g (=1.12 l) of dry 1,4-dioxane were placed in a dried 2 l four-neck flask fitted with mechanical Teflon stirrer, low-temperature condenser, thermometer and dropping funnel, degased by passing N$_2$ through it for 15 minutes and then heated to reflux (98° C.) while stirring. 3.50 g (9.68 mmol) of 2,5-bis(chloromethyl)-1-methoxy-4-(3',7'-dimethyloctyloxy)benzene and 3.56 g (9.68 mmol) of 2,5-bis(bromomethyl)-2',5'-dimethylbiphenyl, dissolved in 30 ml of dry 1,4-dioxane, were then added. Subsequently, a solution of 5.61 g (50 mmol, 2.6 eq) of potassium tert butyloxide in 50 ml of dried 1,4-dioxane was added dropwise to the intensively stirred mixture over a period of 5 minutes. During the addition of the base, the following color change was observed: colorless-green-yellow-orange/red. After stirring further for 5 minutes at this temperature, another 4.90 g (43.7 mmol, 2.25 eq) of potassium tert-butoxide in 50 ml of dry 1,4-dioxane was added over a period of one minute. The temperature was held at 95–98° C. for another 2 hours; after this time, the reaction mixture was cooled to 50° C. and a mixture of 7.5 ml of acetic acid and 7.5 ml of 1,4-dioxane was added. The color of the reaction mixture became somewhat lighter during this addition. After stirring for 20 minutes, the reaction mixture was poured into 1.2 l of intensively stirred water. 100 ml of methanol were added and stirring was continued for 20 minutes. Filtration through a round polypropylene filter gave 4.90 g (18.7 mmol, 96%) of crude polymer as pale orange flocs.

After drying under reduced pressure at room temperaure, the crude product was purified by dissolving twice in 500 ml of THF and each time precipitating with 500 ml of methanol. Drying gave 2.92 g (11.2 mmol, 58%) of polymer A4.

$^1$H NMR (400 MHz, CDCl$_3$): δ (ppm)=7.9–6.1 (br, m; 6H); 4.2–3.5 (br, m, 2.5H); 2.35 (br, s, 1.5H); 2.1–0.95 (br, m, 6.5H); 0.85 (s, 4.5H; 3×CH$_3$).

GPC: THF+0.25% of oxalic acid; column set SDV500, SDV1000, SDV10000 (from PSS), 35° C., UV detection at 254 nm, polystyrene standard: $M_w$=3.6×10$^5$ g/mol, $M_n$=8.4× 10$^4$ g/mol.

EXAMPLE A5

Ternary copolymer from 50% of 2,5-bis (Chloromethyl)-1-methoxy-4-(3,7-dimethyloctyloxy)benzene, 30% of 2,5-bis (Chloromethyl)-2',5'-dimethylbiphenyl and 20% of 2,5-bis(Chloromethyl)-3'-(3,7-dimethyloctyloxy) biphenyl (Polymer A5)

Preparation of poly(2-methoxy-5-(3,7-dimethyloctyloxy)-p-phenylene-vinylene)-co-(2-(3'-(3,7-dimethyloctyloxy)phenyl)-p-phenylene-vinylene)co(2-(2', 5'-dimethyl)phenyl)-p-phenylene-vinylene).

2.38 kg (2.30 l) of dry and O$_2$-free 1,4-dioxane were placed in a dry 4 l four-neck flask fitted with mechanical stirrer, reflux condenser, thermometer and dropping funnel and were heated to 98° C. while stirring. A solution of 5.96 g (16.5 mmol) of 2,5-bis(chloromethyl)-1-methoxy-4-(3,7-dimethyloctyloxy)benzene, 2.29 g (6.60 mmol) of 2,5-bis (chloromethyl)-3'-(3,7-dimethyloctyloxy)biphenyl and 2.76 g (9.90 mmol) of 2,5-bis(chloromethyl)-2',5'-dimethylbiphenyl, dissolved in 30 ml of dry 1,4-dioxane, was then added. Subsequently, a solution of 9.58 g (85.4 mmol, 2.6 eq) of potassium tert-butoxide in 86 ml of dry 1,4-dioxane was added dropwise to the intensively stirred mixture over a period of 5 minutes. During this addition, the color changed from colorless via green to pale orange; the viscosity of the solution increased slightly. After stirring at 98° C. for 5 minutes, another 7.68 g (68.4 mmol, 2.1 eq) of potassium tert-butoxide in 100 ml of 1,4-dioxane were added over a period of one minute. After stirring further for 2 hours at 95°–98° C., the reaction mixture was cooled to 50° C. and a mixture of 12.5 ml of acetic acid and 12.5 ml of 1,4-dioxane was added. After stirring further for 20 minutes, the polymer was precipitated by adding the reaction solution to 2.1 l of intensively stirred water. The polymer obtained in this way was filtered off and washed twice with 100 ml each time of methanol. Drying under reduced pressure at room temperature gave 8.85 g (32.4 mmol, 98%) of crude polymer.

The crude product was dissolved in 980 ml of THF by heating to 60° C. and was precipitated by addition of 1 l of methanol. After drying under reduced pressure and washing with 100 ml of methanol, this step was repeated. After drying for two days under reduced pressure, 5.85 g (=21.4 mmol, 65%) of the polymer A5 was obtained as pale orange fibers.

$^1$H NMR (400 MHz, CDCl$_3$): δ (ppm)=7.9–6.1 (br, m; 6.2H); 4.2–3.5 (br, m, 2.9H); 2.36 (br, s, 0.9H); 2.1–1.05 (br, m, 7.9H); 0.86 (br, s, 6.3H).

GPC: THF+0.25% of oxalic acid; column set SDV500, SDV1000, SDV10000 (from PSS), 35° C., UV detection at 254 nm, polystyrene standard: $M_w$=9.8×10$^5$ g/mol, $M_n$=9× 10$^4$ g/mol.

Figure 2:
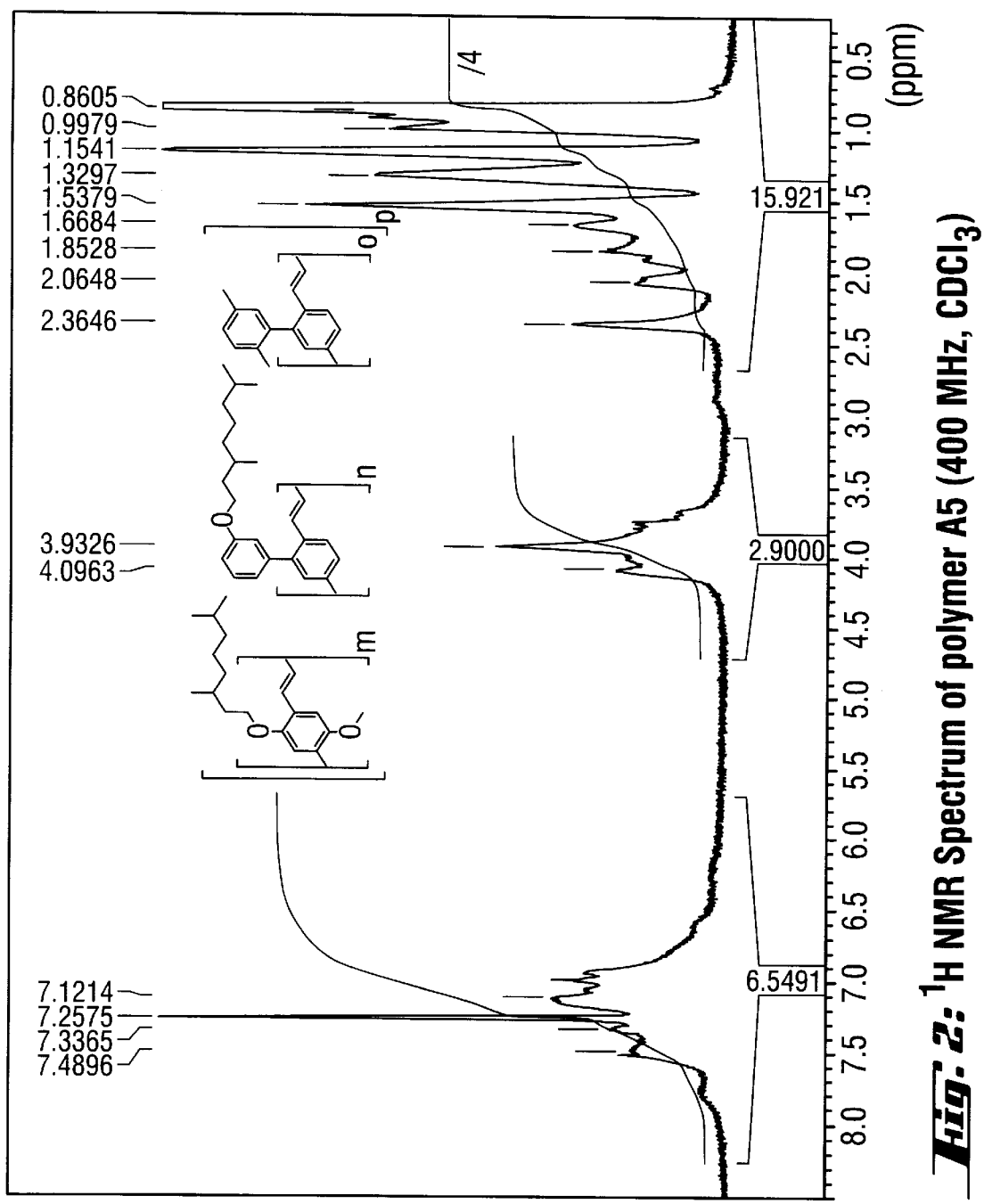
FIG. 2 is a $^1$H nmr spectrum of poly(2-methoxy-5-(3,7-dimethyloctyloxy)-p-phenylene-vinylene)-co-(2-3'-(3,7-diphenyloctyloxy)-p-phenylene-vinylene)-co-(2-(2',5'-dimethyl)phenyl)-p-phenylene-vinylene (polymer A5).

The $^1$H NMR of this polymer is shown in FIG. 2.

EXAMPLE A6

Ternary Copolymer from 4% of 2,5-bis (Chloromethyl)-1,4-bis(3,7-dimethyloctyloxy) benzene, 48% of 2,5-bis(Chloromethyl)-3'-(3,7-dimethyloctyloxy)biphenyl and 48% of 2,5-bis (Chloromethyl)-4'-(3,7-dimethyloctyloxy)biphenyl (Polymer A6)

Preparation of poly(2,5-bis(3,7-dimethyloctyloxy)-p-phenylene-vinylene)-co-(2-(3'-(3,7-dimethyloctyloxy) phenyl)-p-phenylene-vinylene)phenylene-vinylene)

3.53 kg (3.41l) of dry and O$_2$-free 1,4-dioxane were placed in a dry 6 l four-neck flask fitted with mechanical stirrer, reflux condenser, thermometer and dropping funnel and were heated to 99° C. while stirring. A solution of 975 mg (2.0 mmol) of 2,5-bis(chloromethyl)-1,4-bis(3,7-dimethyloctyloxy)benzene, 9.77 g (24 mmol) of 2,5-bis-chloromethyl)-3'-(3,7-dimethyloctyloxy)biphenyl and 9.77 g (24 mmol) of 2,5-bis(chloromethyl)-4'-(3,7-dimethyloctyloxy)biphenyl, dissolved in 50 ml of dry 1,4-dioxane, was then added. Subsequently, with exclusion of light, a solution of 14.59 g (130 mmol, 2.6 eq) of potassium tert-butoxide in 130 ml of dry 1,4-dioxane was added dropwise to the intensively stirred mixture over a period of 5 minutes. The solution changed color to yellow-orange. After stirring for 5 minutes at 98° C., another 11.21 g (100 mmol, 2.0 eq) of potassium tert-butoxide in 100 ml of 1,4-dioxane were added over a period of two minutes. After stirring further for 2 hours at 98°–100° C., the reaction mixture was cooled to 50° C. and a mixture of 13 ml of acetic acid and 13 ml of 1,4-dioxane was added. After stirring further for 10 minutes, the polymer was precipitated by adding the reaction solution to 3.7 l of intensively stirred water. The polymer obtained in this way was filtered off and washed twice with 300 ml each time of methanol. After drying under reduced pressure at room temperature, 12.2 g (36.1 mmol, 72%) of crude polymer A6 were obtained as orange fibers.

The crude product was dissolved in 1360 ml of THF by heating to 60° C. and was precipitated over a period of 2 hours by addition of 1.4 l of methanol. After drying under reduced pressure and washing with 200 ml of methanol, this step was repeated (1100 ml of THF/1100 ml of methanol). After drying for two days under reduced pressure, 8.47 g (=25 mmol, 50%) of polymer A6 was obtained as pale orange fibers.

$^1$H NMR (400 MHz, CDCl$_3$): δ (ppm)=7.9–6.6 (br, m; ca. 9H); 4.0 (br, s, ca. 2H); 1.9–0.9 (br, m, ca. 10H); 0.88, 0.87, 0.85, 0.84 (4s, 9H).

GPC: THF+0.25% of oxalic acid; column set SDV500, SDV1000, SDV10000 (from PSS), 35° C., UV detection at 254 nm, polystyrene standard: $M_w$=2.2×10$^5$ g/mol, $M_n$=1.6×10$^4$ g/mol.

EXAMPLE A7

Copolymer from 99% of 2,5-bis(Chloromethyl)-1-methoxy-4-(3,7-dimethyloctyloxy)benzene and 1% of 2,5-bis(Chloromethyl)-4'-(3,7-dimethyloctyloxy)biphenyl (Polymer A7)

Preparation of poly(2-methoxy-5-(3,7-dimethyloctyloxy)-p-phenylene-vinylene)-co-(2-(4'-(3,7-dimethyloctyloxy)phenyl)-p-phenylene-vinylene).

In a baked-out 6 l four-neck flask fitted with mechanical Teflon stirrer, reflux condenser, thermometer and dropping funnel, 3530 g of dry and O$_2$-free 1,4-dioxane were heated to 99° C. A solution of 20.78 g (57.5 mmol) of 2,5-bis(chloromethyl)-1-methoxy-4-(3,7-dimethyloctyloxy)benzene and 0.24 g (0.58 mmol) of 2,5-bis(chloromethyl)-4'-(3,7-dimethyloctyloxy)biphenyl in 30 g of dry 1,4-dioxane was then added. Subsequently, a solution of 16.8 g (150 mmol) of potassium tert-butoxide in 150 ml of dry 1,4-dioxane was added dropwise to the intensively stirred mixture over a period of 5 minutes. During this addition, the color changed from colorless via yellow to orange-red. After 5 minutes, another 13.46 g (120 mmol) of potassium tert-butoxide, dissolved in 120 ml of 1,4-dioxane, were added.

After stirring for 2 hours at 95–97° C., the reaction mixture was cooled to 50° C. and a mixture of 13 ml of acetic acid and 13 ml of 1,4-dioxane was added. The now orange solution was poured into 1.85 l of intensively stirred water. The fibrous polymer which precipitated was isolated by filtration through a polypropylene filter, washed twice with methanol and dried under reduced pressure. The crude yield was 12.87 g (44.6 mmol, 77%).

The polymer was dissolved in 1430 ml of THF by heating to 60° C. and was precipitated at 40° C. by addition of the same amount of methanol. After washing with methanol and drying under reduced pressure, this step was repeated. After drying under reduced pressure, 7.52 g (=26.06 mmol, 49%) of the polymer A7 was obtained as pale orange fibers.

$^1$H NMR (400 MHz, CDCl$_3$): δ (ppm)=7.7–6.5 (br, m, 4H; H$_{arom}$, olefin-H); 4.5–3.6 (br, m, 5H; OCH$_3$, OCH$_2$); 2.1–0.6 (br, m, 19H; aliph. H).

GPC: THF+0.25% of oxalic acid; column set SDV500, SDV1000, SDV10000 (from PSS), 35° C., UV detection at 254 nm, polystyrene standard: $M_w$=1.4×10$^6$ g/mol, $M_n$=2.6×10$^5$ g/mol.

EXAMPLE A8

Copolymer from 95% of 2,5-bis(Chloromethyl)-1-methoxy-4-(3,7-dimethyloctyloxy)benzene and 5% of 2,5-bis(Chloromethyl)-4'-(3,7-dimethyloctyloxy)biphenyl (Polymer A8)

Preparation of poly(2-methoxy-5-(3,7-dimethyloctyloxy)-p-phenylene-vinylene)-co-(2-(4'-(3,7-dimethyloctyloxy)phenyl)-p-phenylene-vinylene).

In a baked-out 6 l four-neck flask fitted with mechanical Teflon stirrer, reflux condenser, thermometer and dropping funnel, 3530 g of dry and O$_2$-free 1,4-dioxane were heated to 99° C. A solution of 19.95 g (55.2 mmol) of 2,5-bis(chloromethyl-1-methoxy-4-(3,7-dimethyloxyloxy)benzene and 1.18 g (2.9 mmol) of 2,5-bis(chloromethyl)-4'-(3,7-dimethyloctyloxy)biphenyl in 30 g of dry 1,4-dioxane was then added. Subsequently, a solution of 16.8 g (150 mmol) of potassium tert-butoxide in 150 ml of dry 1,4-dioxane was added dropwise to the intensively stirred mixture over a period of 5 minutes. During this addition, the color changed from colorless via yellow to orange-red. After 5 minutes, another 13.46 g (120 mmol) of potassium tert-butoxide, dissolved in 120 ml of 1,4-dioxane, were added. After stirring for 2 hours at 95–97° C., the reaction mixture was cooled to 50° C. and a mixture of 13 ml of acetic acid and 13 ml of 1,4-dioxane was added. The now orange solution was poured into 3.7 l of intensively stirred water. The fibrous polymer which precipitated was isolated by filtration through a polypropylene filter, washed twice with methanol and dried under reduced pressure. The crude yield was 10.68 g (29.4 mmol, 51%). The polymer was dissolved in 1420 ml of THF by heating to 60° C. and was precipitated at 40° C. by addition of the same amount of methanol. After washing with methanol and drying under reduced pressure, this step was repeated (1000 ml of THF/1000 ml of methanol). Drying under reduced pressure gave 7.00 g (=19.2 mmol, 33%) of the polymer A8 as pale orange fibers.

$^1$H NMR (400 MHz, CDCl$_3$): δ (ppm)=7.7–6.5 (br, m, 4H; H$_{arom}$, olefin-H); 4.5–3.6 (br, m, 5H; OCH$_3$, OCH$_2$); 2.1–0.6 (br, m, 19H; aliph. H).

GPC: THF+0.25% of oxalic acid; column set SDV500, SDV1000, SDV10000 (from PSS), 35° C., UV detection at 254 nm, polystyrene standard: $M_w$=1.4×10$^6$ g/mol, $M_n$=2.4×10$^5$ g/mol.

EXAMPLE A9

Copolymer from 82% of 2,5-bis(Chloromethyl)-1-(3,7-dimethyloctyloxy)-4-methoxybenzene and 18% of 2,5-bis(Chloromethyl)-3'-(3,7-dimethyloctyloxy)-4-methoxybiphenyl (Polymer A9)

Preparation of poly(2-(3,7-dimethyloctyloxy)-5-methoxy-p-phenylene-vinylene)-co-(2-(3'-(3,7-dimethyloctyloxy)phenyl)-5-methoxy-p-phenylene-vinylene).

In a dry 1 l four-neck flask fitted with mechanical Teflon stirrer, reflux condenser, thermometer and dropping funnel, 540 ml of dry and $O_2$-free 1,4-dioxane were heated to 98° C. A solution of 2.37 g (6.56 mmol) of 2,5-bis(chloromethyl)-1-(3,7-dimethyloctyloxy)-4-methoxybenzene and 0.630 g (1.44 mmol) of 2,5-bis(chloromethyl)-3'-(3,7-dimethyloctyloxy)-4-methoxybiphenyl in 10 ml of dry 1,4-dioxane was then added. Subsequently, a solution of 2.47 g (22 mmol) of potassium tert-butoxide in 22 ml of dry 1,4-dioxane was added dropwise to the intensively stirred mixture over a period of 5 minutes. During the addition, the color changed from colorless via yellow to orange-red. After 5 minutes, another 2.47 g (22 mmol) of potassium tert-butoxide, dissolved in 22 ml of 1,4-dioxane, were added. After stirring for 2 hours at 98–99° C., the reaction mixture was cooled to 42° C. A mixture of 6 ml of acetic acid and 6 ml of 1,4-dioxane was then added. The turbid orange solution was poured into 0.6 l of intensively stirred water. The flocular polymer which precipitated was isolated by filtration through a polypropylene filter and dried under reduced pressure. The crude yield was 2.46 g (6.56 mmol, 82%). The polymer was dissolved in 330 ml of THF by heating under reflux. It was precipitated by dropwise addition of 350 ml of methanol. After drying under reduced pressure, it was dissolved in 300 ml of THF and precipitated by addition of 300 ml of methanol. Washing with methanol and drying under reduced pressure gave 1.62 g (=4.32 mmol, 54%) of polymer A09 as orange fibers.

$^1$H NMR (400 MHz, $CDCl_3$): δ (ppm)=7.9–6.5 (br, m, 4.7H); 4.43.6 (br, m, 5H); 2.0–0.7 (br, m, 19H).

Owing to the tendency of polymer A09 to form a gel, no GPC measurement could be carried out.

EXAMPLE A10

Copolymer from 50% of 2,5-bis(Chloromethyl)-4'-(3,7-dimethyloctyloxy)biphenyl and 50% of 2,5-bis(Chloromethyl)-3'-(3,7-dimethyloctyloxy)biphenyl (Polymer A10)

Preparation of poly(2-(3'-(3,7-dimethyloctyloxy)phenyl)-p-phenylene-vinylene)-co-(2-(4'-(3,7-dimethyloctyloxy)phenyl)-p-phenylene-vinylene).

890 ml of dry and $O_2$-free 1,4-dioxane were placed in a dry 2 l four-neck flask fitted with mechanical stirring, reflux condenser, thermometer and dropping funnel and heated to 98° C. while stirring. 2.45 g (6.00 mmol) of 2,5-bis(chloromethyl)-4'-(3,7-dimethyloctyloxy)biphenyl and 2.45 g (6.00 mmol) of 2,5-bis(chloromethyl)-3'-(3,7-dimethyloctyloxy)biphenyl, dissolved in 20 ml of dry 1,4-dioxane, were then added. Subsequently, a solution of 3.37 g (30 mmol, 2.5 eq) of potassium tert-butoxide in 30 ml of dry 1,4-dioxane was added dropwise to the intensively stirred mixture over a period of 5 minutes. During the addition, the color changed from colorless via yellow to yellow-green. After stirring for 5 minutes at 97–98° C., another 2.69 g (24 mmol, 2.0 eq) of potassium tert-butoxide in 24 ml of 1,4-dioxane were added over a period of one minute. After stirring further for 2 hours at 95°–97° C., the reaction mixture was cooled to 40° C. and a mixture of 5 ml of acetic acid and 5 ml of 1,4-dioxane was added. The solution was poured into 1 l of water while stirring vigorously. The precipitated polymer was filtered off, washed once with 50 ml of water/methanol 1:1 and twice with 50 ml each time of methanol. Drying under reduced pressure gave 4.05 g of crude polymer.

The crude product was dissolved in 540 ml of THF by heating to 60° C. and was precipitated by additon of 550 ml of methanol. The resulting polymer was washed twice with 100 ml each time of methanol and dried under reduced pressure. It was dissolved in 400 ml of chlorobenzene and precipitated with 400 ml of methanol. After washing with methanol and drying for two days under reduced pressure, 3.20 g (=9.57 mmol, 80%) of the polymer A10 were obtained as yellow fibers.

$^1$H NMR (400 MHz, $CDCl_3$): δ (ppm)=7.9–6.6 (br, m; 9H); 4.0 (br, s, 2H); 1.9–0.9 (br, m, 10H); 0.88, 0.87, 0.85, 0.84 (4s, together 9H).

GPC: THF+0.25% of oxalic acid; column set SDV500, SDV1000, SDV10000 (from PSS), 35° C., UV detection at 254 nm, polystyrene standard: $M_w$=9.1×10$^5$ g/mol, $M_n$=9×10$^4$ g/mol.

EXAMPLE A11

Copolymer from 80% of 2,5-bis(Chloromethyl)-4'-(3,7-dimethyloctyloxy)biphenyl and 20% of 2,5-bis(Chloromethyl)-2',5'-dimethylbiphenyl (Polymer A11)

Preparation of poly(2-(4'-(3,7-dimethyloctyloxy)phenyl)-p-phenylene-vinylene)-co-(2-(2',5'-dimethyl)phenyl)-p-phenylene-vinylene).

700 ml of dry 1,4-dioxane were placed in a dried 2 l four-neck flask fitted with mechanical Teflon stirrer, low-temperature condenser, thermometer and dropping funnel, degased by passing $N_2$ through it for 30 minutes and then heated to reflux (98° C.) while stirring. 2.68 g of 2,5-bis(chloromethyl)-4'-(3,7-dimethyloctyloxy)biphenyl and 0.413 g (2.00 mmol) of 2,5-bis(chloromethyl)-2',5'-dimethylbiphenyl, dissolved in 30 ml of dry 1,4-dioxane, were then added.

Subsequently, a solution of 2.92 g (26 mmol, 2.6 eq) of potassium tert-butoxide in 26 ml of dried 1,4-dioxane was added dropwise to the intensively stirred mixture over a period of 5 minutes. During the addition of the base, the following color change was observed: colorless-green-yellow. After stirring for 5 minutes at this temperature, another 2.36 g (21 mmol, 2.1 eq) of potassium tert-butoxide in 21 ml of dry 1,4-dioxane were added over a period of one minute. The temperature was held at 95–97° C. for another 2 hours; after this time, the reaction mixture was cooled to 50° C. and a mixture of 12.5 ml of acetic acid and 12.5 ml of 1,4-dioxane was added. The color of the reaction mixture became somewhat lighter during this addition. After stirring for 20 minutes, the reaction mixture was poured into 0.8 l of intensively stirred water. 100 ml of methanol were added and stirring was continued for 20 minutes. Filtration through a round polypropylene filter, washing twice with methanol and drying under reduced pressure gave 1.80 g (4.71 mmol, 47%) of crude polymer as yellow fibers.

After drying under reduced pressure at room temperature, the crude product was purified by dissolving twice in 240 ml of THF and each time precipitating with 250 ml of methanol.

After drying, 1.30 g (3.40 mmol, 34%) of polymer A11 were obtained as yellow fibers.

$^1$H NMR (400 MHz, CDCl$_3$): δ (ppm)=7.8–6.5, including br, s at 6.9 (br, m; 8.8 H); 4.0 (br, s, 1.6H); 2.3 (br, s, 0.6H, CH$_3$); 2.0 (br, s, 0.6H, CH$_3$); 1.8, 1.65, 1.55, 1.3, 1.15 (5×s, together 8H; alkyl-H); 0.91, 0.85 (2×s, 7.2H; 3×CH$_3$).

GPC: THF+0.25% of oxalic acid; column set SDV500, SDV1000, SDV10000 (from PSS), 35° C., UV detection at 254 nm, polystyrene standard: M$_w$=7.6×10$^5$ g/mol, M$_n$=1.9×10$^5$ g/mol.

EXAMPLE A12

Quaternary Copolymer from 2% of 2,5-bis(Chloromethyl)-1-methoxy-4-(3,7-dimethyloctyloxy)benzene, 13% of 2,5-bis(Chloromethyl)-2',5'-dimethylbiphenyl, 25% of 2,5-bis(Chloromethyl)-3'-(3,7-dimethyloctyloxy)biphenyl and 60% of 2,5-bis(Chloromethyl)-4'-(3,7-dimethyloctyloxy)biphenyl (Polymer A12)

Preparation of poly(2-methoxy-5-(3,7-dimethyloctyloxy)-p-phenylene-vinylene)-co-(2-(3'-(3,7-dimethyloctyloxy)phenyl)-p-phenylene-vinylene)phenylene-vinylene)-co-( 2-(4'-(3,7-dimethyloctyloxy)phenyl)-p-phenylene-vinylene)-co-(2-(2',5'-dimethyl)phenyl)-p-phenylene-vinylene).

3.55 kg (3.40 l) of dry and O$_2$-free 1,4-dioxane were placed in a dry 6 l four-neck flask fitted with mechanical stirrer, reflux condenser, thermometer and dropping funnel and were heated to 98° C. while stirring. A solution of 240 mg (0.66 mmol) of 2,5-bis(chloromethyl)-1-methoxy-4-(3,7-dimethyloctyloxy)benzene, 3.38 g (8.29 mmol) of 2,5-bis(chloromethyl)-3'-(3,7-dimethyloctyloxy)biphenyl, 8.11 g (19.9 mmol) of 2,5-bis(chloromethyl)-4'-(3,7-dimethyloctyloxy)biphenyl and 1.20 g (4.31 mmol) of 2,5-bis(chloromethyl)-2',5'-dimethylbiphenyl, dissolved in 50 ml of dry 1,4-dioxane, was then added. Subsequently, a solution of 9.30 g (82.9 mmol, 2.6 eq) of potassium tert-butoxide in 83 ml of dry 1,4-dioxane was then added dropwise to the intensively stirred mixture over a period of 5 minutes. The viscosity of the solution increased slightly. After stirring at 98° C. for 5 minutes, another 7.44 g (66.3 mmol, 2.0 eq) of potassium tert-butoxide in 66 ml of 1,4-dioxane were added over a period of one minute. After stirring further for 2 hours at 97°–98° C., the reaction mixture was cooled to 45° C. and a mixture of 19.1 ml of acetic acid and 20 ml of 1,4-dioxane was added. After stirring further for 20 minutes, the polymer was precipitated by adding the reaction solution to 4 l of intensively stirred water. The resulting polymer was filtered off and washed twice with 300 ml each time of methanol. Drying under reduced pressure at room temperature gave 10.40 g (32.8 mmol, 99%) of crude polymer.

The crude product was dissolved in 1390 ml of THF by heating to 60° C. and was precipitated by addition of 1.4 l of methanol. After drying under reduced pressure and washing with 100 ml of methanol, this step was repeated (800 ml of THF/800 ml of methanol). After drying for two days under reduced pressure, 7.90 g (=24.9 mmol, 75%) of the polymer A12 were obtained as pale orange fibers.

$^1$H NMR (400 MHz, CDCl$_3$): δ (ppm)=7.9–6.6 (br, m; ca 9H); 4.0 (br, s, ca. 2H); 2.4, 2.1 (2×br, s, 2×je H); 1.9–0.8 (br, m, ca. 19H).

GPC: THF+0.25% oxalic acid; column set SDV500, SDV1000, SDV10000 (from PSS), 35° C., UV detection at 254 nm, polystyrene standard: M$_w$=7.8×10$^5$ g/mol, M$_n$=1.9×10$^5$ g/mol.

EXAMPLE A 13

Copolymer from 50% of 2,5-bis(Chloromethyl)-3'-(3,7-dimethyloctyloxy)biphenyl and 50% of 2,5-bis(Chloromethyl)-3',4'-bis(2-methylpropyloxy)biphenyl (Polymer A13)

Preparation of poly(2-(3'-(3,7-dimethyloctyloxy)phenyl)-p-phenylene-vinylene)-co-(2-(3',4'-bis(2-methylpropyloxy)phenyl)-p-phenylene-vinylene).

600 ml of dry 1,4-dioxane were placed in a baked-out 1 l four-neck flask fitted with mechanical Teflon stirrer, low-temperature condenser, thermometer and dropping funnel, degased by passing N$_2$ through it for 15 minutes and then heated to a gentle reflux (99° C.) while stirring. 1.63 g (4.00 mmol) of 2,5-bis(chloromethyl)-3'-(3,7-dimethyloctyloxy)biphenyl and 1.58 g (4.00 mmol) of 2,5-bis(chloromethyl)-3',4'-bis(2-methylpropyloxy)biphenyl, dissolved in 20 ml of dry 1,4-dioxane, were then added. Subsequently, a solution of 2.36 g (21 mmol, 2.6 eq) of potassium tert-butoxide in 21 ml of dried 1,4-dioxane was added dropwise to the intensively stirred mixture over a period of 5 minutes. During the addition of the base, the following color change was observed: colorless-yellow-yellowish green. After stirring further for 5 minutes at this temperature, another 1.80 g (16 mmol, 2.0 eq) of potassium tert-butoxide in 16 ml of dry 1,4-dioxane were added over a period of one minute. The temperature was held at 98–99° C. for another 2 hours; after this time, the reaction mixture was cooled to 45° C. and a mixture of 2.5 ml of acetic acid and 2.5 ml of 1,4-dioxane was added. The color of the reaction mixture became somewhat lighter during this addition and the viscosity increased. After stirring for 20 minutes, the reaction mixture was poured into 0.65 l of intensively stirred water. 100 ml of methanol were added and stirring was continued for 20 minutes. Filtration through a round polypropylene filter, washing twice with methanol and drying under reduced pressure gave 1.30 g (3.93 mmol, 49%) of crude polymer as yellow fibers.

After drying under reduced pressure at room temperature, the crude product was purified by dissolving twice in 100 ml each time of THF and each time precipitating with 100 ml of methanol. Drying gave 0.99 g (3.00 mmol, 38%) of polymer A13 as yellow fibers.

$^1$H NMR (400 MHz, CDCl$_3$): δ (ppm)=7.8–6.5, including br, s at 6.9 (br, m; 8.8H); 4.0 (br, s, 1.6H); 2.3 (br, s, 0.6H, CH$_3$); 2.0 (br, s, 0.6H, CH$_3$); 1.8, 1.65, 1.55, 1.3, 1.15 (5×s, together 8H; alkyl-H); 0.91, 0.85 (2×s, 7.2H; 3×CH$_3$).

GPC: THF+0.25% of oxalic acid; column set SDV500, SDV1000, SDV10000 (from PSS), 35° C., UV detection at 254 nm, polystyrene standard: M$_w$=1.8×10$^6$ g/mol, M$_n$=3.9×10$^5$ g/mol.

The composition of the copolymers A1 to A13 was determined by oxidative degradation and subsequent qualitative and quantitative analysis of the monomer units obtained in this way. It was found that the proportion of the monomer units in the copolymer was the same as the ratio of the monomers used in the synthesis.

B. Synthesis of Homopolymers of the Monomers Having the Formula (II)

EXAMPLE B1

Polymerization of 2,5-bis(Chloromethyl)-3'-(3,7-dimethyloctyloxy)biphenyl (Polymer B1) by Dehydrohalogenation Preparation of poly-2-(3'-(3,7-dimethyloctyloxy)phenyl)-p-phenylene-vinylene 640 g (619 ml) of dry 1,4-dioxane were placed in a dry reaction apparatus (2 l four-neck round-bottom flask fitted with reflux condenser, mechanical stirrer, dropping funnel and thermometer) and degased by passing $N_2$ through it for 15 minutes. After changing to $N_2$ blanketing the solvent was heated to 98° C. Subsequently, 3.26 g (8.00 mmol) of 2,5-bis(chloromethyl)-3'-(3,7-dimethyloctyloxy)biphenyl (dissolved in 30 ml of dry 1,4-dioxane) were added to the boiling solution. A solution of 2.33 g (20.8 mmol, 2.6 eq) of potassium tert-butoxide in 21 ml of dry 1,4-dioxane was added dropwise over a period of 5 minutes; during this addition, the color of the reaction mixture changed from colorless to green. After 5 minutes, another 1.8 g (16 mmol, 2 eq) of potassium tert-butoxide (dissolved in 18 ml of dry 1,4-dioxane) was added over a period of one minute. The mixture was stirred further for 2 hours at 98° C. This resulted in a color change from green to yellow-green. The reaction solution was cooled to 50° C. and a mixture of 3 ml of acetic acid and 3 ml of 1,4-dioxane was added. The resulting mixture was stirred further for 20 minutes and then poured into 700 ml of water while stirring vigorously. After addition of 100 ml of methanol, the polymer (fine green fibers) was filtered off with suction on a round polypropylene filter, washed with 100 ml of methanol/water 1:1 and then with 100 ml of pure methanol. Drying under reduced pressure at room temperature gave 2.60 g (7.77 mmol, 97%) of crude polymer B1.

The polymer was purified by dissolving it in 300 ml of THF (60° C.), cooling the solution to 30° C. and precipitating the polymer by dropwise addition of 300 ml of methanol. After washing with 100 ml of methanol, it was dried at room temperature under reduced pressure. This procedure was repeated two more times using 260 ml of THF/260 ml of methanol each time. 1.85 g (5.53 mmol, 69%) of polymer B1 were obtained as a fibrous polymer with a green fluorescence.

$^1$H NMR (400 MHz, CDCl$_3$): δ (ppm)=7.85–7.02 (br, m, 7H; $H_{arom}$); 6.92, 6.67 (br, s, together 2H; olefin-H) 3.99 (br, s, 2H; OCH$_2$); 1.82 (br, s, 1H; aliph. H); 1.72–1.45 (m, 3H); 1.40–1.08 (m, 6H), 0.91 (s, 3H; CH$_3$); 0.85 (s, 3H; CH$_3$); 0,83 (s, 3H; CH$_3$).

GPC: THF+0.25% of oxalic acid; column set SDV500, SDV1000, SDV10000 (from PSS), 35° C., UV detection at 254 nm, polystyrene standard: $M_w$=6.3×10$^5$ g/mol, $M_n$=6.8× 10$^4$ g/mol.

Figure 3:
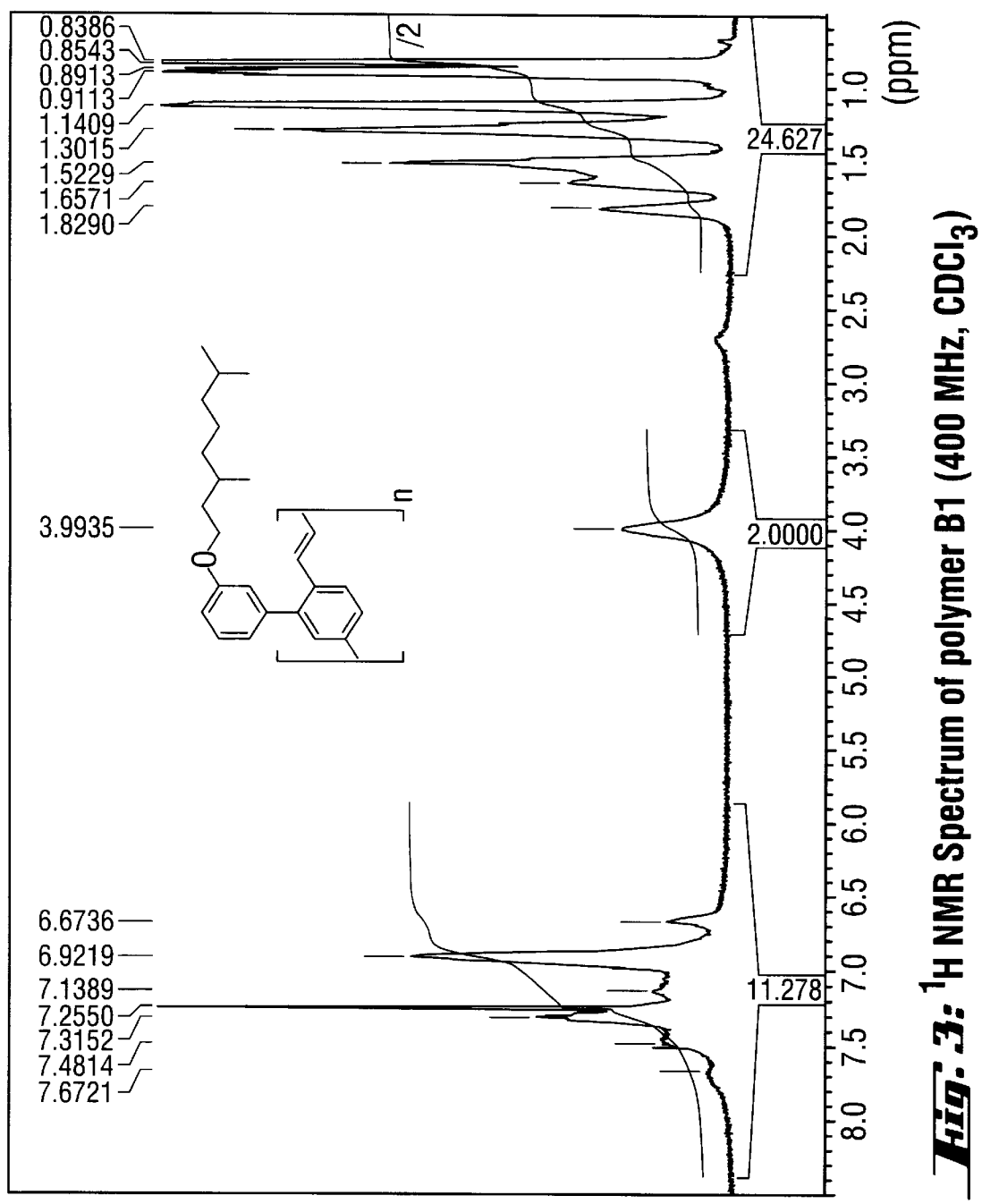
FIG. 3 is a $^1$H nmr spectrum of poly-2-(3'-(3,7-dimethyloctyloxy)phenyl)-p-phenylene-vinylene (polymer B1).

The $^1$H-NMR of this polymer is shown in FIG. 3.

EXAMPLE B2

Polymerization of 2,5-bis(Chloromethyl)-2'5'-dimethylbiphenyl (Polymer B2) by Dehydrohalogenation Preparation of poly-2-(2',5'-dimethylphenyl)-p-phenylene-vinylene.

650 g (629 ml) of dry 1,4-dioxane were placed in a dry reaction apparatus (1 l four-neck round-bottom flask fitted with reflux condenser, mechanical stirrer, dropping funnel and thermometer) and degassed by passing N2 through it for 15 minutes. After changing to $N_2$ blanketing, the solvent was heated to 98° C. Subsequently, 2.33 g (8.00 mmol) of 2,5-bis(chloromethyl)-2'5'-dimethylbiphenyl (dissolved in 30 ml of dry 1,4-dioxane) were added to the boiling solution. A solution of 2.47 g (22 mmol, 2.7 eq) of potassium tert-butoxide in 22 ml of dry 1,4-dioxane was then added dropwise over a period of 5 minutes; during this addition, the color of the reaction mixture changed from colorless to green. After 5 minutes, another 1.8 g (16 mmol, 2 eq) of potassium tert-butoxide (dissolved in 18 ml of dry 1,4-dioxane) were added over a period of one minute. The mixture was stirred further for 2 hours at 98° C. This resulted in a color change from green to yellow-green. The reaction solution was cooled to 50° C. and a mixture of 3 ml of acetic acid and 3 ml of 1,4-dioxane was added. It was stirred further for 20 minutes and then poured into 700 ml of water while stirring vigorously. After addition of 100 ml of methanol, the polymer (fine green fibers) was filtered off with suction on a round polypropylene filter, washed with 100 ml of methanol/water 1:1 and then with 100 ml of pure methanol. Drying under reduced pressure at room temperature gave 1.60 g (7.76 mmol, 97%) of crude polymer B2.

The polymer was purified by dissolving it in 180 ml of THF (60° C.), cooling the solution to 30° C. and precipitating the polymer by dropwise addition of 200 ml of methanol. After washing with 100 ml of methanol, it was dried at room temperature under reduced pressure. This procedure was repeated two more times using 90 ml of THF/90 ml of methanol each time. 0.53 g (2.57 mmol, 32%) of polymer B2 was obtained as a pulverulent polymer with a green fluorescence.

$^1$H NMR (400 MHz, CDCl3): δ (ppm)=7.85–6.6 (br, m, 7.8H; $H_{arom}$ and olefin H); 6.14 (br, br, s, together 0.2H; olefin-H); 2.6–1.8 (m, 6H).

GPC: THF+0.25% of oxalic acid; column set SDV500, SDV1000, SDV10000 (from PSS), 35° C., UV detection at 254 nm, polystyrene standard: $M_w$=4.3×10$^5$ g/mol, $M_n$=9× 10$^4$ g/mol.

Horner Polymerization

EXAMPLE C1

Horner Polymerization of 2,5-bis (Diethylmethylenephosphonate)-1-(3,7-dimethyloctyloxy)-4-methoxybenzene and 2-(4'-Hexyloxyphenyl)terephthalaldehyde Preparation of poly-(4'-hexyloxyphenyl)phenylene-vinylene-co-alt-(2-(3',7'-dimethyloctyloxy)-5-methoxy) phenylene-vinylene 2,5-bis(diethyl methylenephosphonate)-1-(3,7-dimethyloctyloxy)-4-methoxybenzene (10.37 g, 18.4 mmol) was admixed with 2-(4'-hexyloxyphenyl)terephthalaldehyde (5.61 g, 18.1 mmol), bibenzyl-4,4'-dialdehyde (0.132 g, 0.55 mmol) and 70 ml of toluene. The yellow solution was saturated with $N_2$. After heating to reflux, a suspension of potassium tert-butoxide in 25 ml of dioxane (6.22 g, 55.4 mmol) was added. The mixture was then stirred for 2 hours under reflux, admixed with 100 ml of 4-fluorobenzaldehyde (0.116 g, 0.93 mmol), stirred further for one hour under reflux, finally diluted with 100 ml of toluene, again stirred for 20 minutes under reflux and poured while hot into about 1.2 l of i-propanol. The precipitate was stirred for about 1 hour, filtered off with suction on a paper filter and dried overnight in an oil pump vacuum.

The orange solid was finally purified by being reprecipitated twice (THF-H$_2$O; THF-MeOH) and finally dried under reduced pressure.

4.40 g (42%) of an orange polymer powder were obtained.

$^1$H NMR (400 MHz, CDCl$_3$): δ (ppm)=7.8–6.5 (br, m, 6.5H, $H_{aryl}$, $H_{vinyl}$), 4.2–3.8 (br, m, 3.5H, OCHx), 2.9 (br., 0.04H, Ar—CH$_2$), 2.0–0.8 (br-m, 19H, alkyl H).

GPC: THF+0.25% of oxalic acid; column set SVD500, SVD1000, SDV10000 (from PSS), 35° C., UV detection at 254 nm, polystyrene standard: $M_w$=8.9×10$^4$ g/mol, $M_n$=1.2× 10$^4$ g/mol.

V. Comparative Synthesis of the Homopolymer from 2,5-bis(Chloromethyl)-1-methoxy-4-(3,7-dimethyloctyloxy)benzene

EXAMPLE V1

Homopolymerization of 2,5-bis(Chloromethyl)-1-methoxy-4-(3',7'-dimethyloctyloxy)benzene (Polymer V1)

Preparation of poly(2-methoxy-5-(3,7-dimethyloctyloxy)-p-phenylene-vinylene)

A 4 l four-neck flask fitted with mechanical (Teflon) stirrer, reflux condenser thermometer and dropping funnel was baked out (stream of hot air) and flushed with $N_2$. It was then charged with 2.3 l of dried 1,4-dioxane and the solvent was degassed by passing $N_2$ through it for about 15 minutes. The solvent was heated to 98° C. on an oil bath and 14.0 g (38.7 mmol) of 2,5-bis(chloromethyl)-1-methoxy-4-(3',7'-dimethyloctyloxy)benzene were added as a solid (the solid was rinsed in with about 10 ml of dry 1,4-dioxane). 11.3 g (100 mmol, 2.6 eq) of potassium tert-butoxide, dissolved in 100 ml of 1,4-dioxane, were added dropwise to the reaction solution from the dropping funnel over a period of 5 minutes. During this addition, the reaction mixture changed color from colorless via greenish to yellow/orange and the viscosity increased significantly. After addition was complete, the mixture was stirred further for about 5 minutes at 98° C., 8.70 g of potassium tert-butoxide (77 mmol, 2 eq) in 100 ml of dry 1,4-dioxane were then added over a period of one minute and stirring was continued for 2 hours at 96–98° C. The solution was then cooled to 50° C. over a period of about 2 hours. The reaction mixture was finally admixed with 15 ml (260 mmol, 1.5 eq based on the base) of acetic acid (diluted with the same amount of dioxane) and stirred further for 20 minutes. The solution was then deep orange. For the work-up, the reaction solution was slowly poured into 2.5 l of intensively stirred water. The resulting mixture was stirred further for 10 minutes, admixed with 200 ml of methanol and the precipitated polymer was filtered off. This was washed with 200 ml of methanol and dried under reduced pressure at room temperature. 10.04 g (34.8 mmol, 90%) of crude polymer were obtained as red fibers.

The polymer was purified by dissolving it in 1.1 l of THF (60° C.), cooling the solution to 40° C. and precipitating the polymer by dropwise addition of 1.2 l of methanol. After washing with 200 ml of methanol, it was dried at room temperature under reduced pressure. This procedure was repeated once more using 1.0 l of THF/1.0 l of methanol. 6.03 g (20.9 mmol, 54%) of polymer V1 were obtained as a dark orange, fibrous polymer.

$^1$H NMR (400 MHz, $CDCl_3$): δ (ppm)=7.7–6.5 (br, m, 4H; $H_{arom}$, olefin-H); 4.5–3.6 (br, m, 5H; $OCH_3$, $OCH_2$); 2.1–0.6 (br, m, 19H; aliph. H). GPC: THF+0.25% of oxalic acid; column set SDV500, SDV1000, SDV10000 (from PSS), 35° C., UV detection at 254 nm, polystyrene standard: $M_w$=1.2×10$^6$ g/mol, $M_n$=1.1×10$^5$ g/mol.

PART 3: PRODUCTION AND CHARACTERIZATION OF LEDs

LEDs were produced by the general method outlined below. This naturally had to be adapted to the particular circumstances (e.g. polymer viscosity and optimum layer thickness of the polymer in the device) for each individual case. The LEDs described below were all single-layer systems, i.e. substrate/ITO/polymer/cathode.

General method of producing highly efficient, long-lived LEDs:

After the ITO-coated substrates (e.g. glass supports, PET film) have been cut to the correct size, they are cleaned in an ultrasonic bath in a plurality of cleaning steps (e.g. soap solution, Millipore water, isopropanol). They are dried by blowing $N_2$ onto them from an $N_2$ gun and are stored in a desiccator. Before being coated with the polymer, they are treated for about 20 minutes in an ozone plasma apparatus. A solution of the respective polymer (generally having a concentration of 4–25 mg/ml in, for example, toluene, chlorobenzene, xylene: cyclohexanone (4:1)) is made up and the polymer is dissolved by stirring at room temperature. Depending on the polymer, it can also be advantageous to stir for a while at 50–70° C. When the polymer has dissolved completely, it is filtered through a 5 μm filter and applied at variable speeds (400–6000) using a spin coater. In this way, the layer thicknesses can be varied in a range from about 50 to 300 nm.

Electrodes are then applied to the polymer films. This is generally achieved by thermal vapor deposition (Balzer BA360 or Pfeifer PL S 500). Subsequetly, the transparent ITO electrode as anode and the metal electrode (e.g. Ca) as cathode are provided with contacts and the device parameters are determined.

The results obtained using the polymers described are summarized in Table 1:

TABLE 1

| Polymer from Example | Conc. of solutions [mg/ml] | Rotational speed [rpm] | External quantum efficiency [Ph/El] | $I_{max}^{EL}$[nm] | Color | U for 100 cd/m$^2$ [V] | I/area for 100 cd/m$^2$ [mA/cm$^2$] |
|---|---|---|---|---|---|---|---|
| A1 | 5 [b] | 3000 | 3.75% | 581 | yellow-orange | 3.22 | 2.57 |
| A2 | 6 [c] | 500 | 3.1% | 587 | yellow-orange | 3.31 | 9.38 |
| A3 [d] | 10 [c] | 3000 | 2.8% | 568 | yellow | 3.23 | 4.59 |
| A4 | 15 [c] | 5500 | 1.6% | 567 | yellow | 3.89 | 8.65 |
| A5 [e] | 10 [c] | 2200 | 3.1% | 573 | yellow | 3.20 | 6.00 |
| A6 | 5 [b] | 1000 | 5.1% | 560 | yellow | 4.83 | 2.23 |
| A7 | 6 [b] | 5500 | 2.3% | 595 | orange | 3.44 | 4.37 |
| A8 | 5 [b] | 1000 | 2.1% | 594 | orange | 3.10 | 4.84 |
| A9 | 5 [b] | 2000 | 2.3% | 591 | orange | 3.33 | 4.31 |
| A10 | 5 [b] | 500 | 3.5% | 520 | green | 5.16 | 2.85 |
| A11 | 10 [c] | 2600 | 2.5% | 525 | green | 4.05 | 4.20 |
| A12 | 5 [b] | 900 | 2.6% | 547 | yellow | 5.60 | 4.15 |
| A13 | 5 [b] | 1000 | 2.9% | 517 | green | 5.09 | 4.60 |
| B1 | 8 [c] | 2200 | 3.1% | 519 | green | 3.70 | 4.20 |

TABLE 1-continued

| Polymer from Example | Conc. of solutions [mg/ml] | Rotational speed [rpm] | External quantum efficiency [Ph/El] | $I_{max}^{EL}$ [nm] | Color | U for 100 cd/m² [V] | I/area for 100 cd/m² [mA/cm²] |
|---|---|---|---|---|---|---|---|
| B2 | 10 [c] | 700 | 0.3% | 509 | green | 5.08 | 31.2 |
| C1 | 12 [c] | 2100 | 1.5% | 580 | yellow-orange | 4.95 | 7.15 |
| V1 | 6 [c] | 1100 | 2.1% | 591 | orange | 2.90 | 5.30 |

[a] Cathode material: Ca; Device size: 3 × 3 mm; layer thickness: 100 nm
[b] Solutions in toluene
[c] Solutions in cyclohexanone/p-xylene 1:4
[d] The most important electroluminescence properties are shown in FIG. 4
[e] The most important electroluminescence properties are shown in FIG. 5

What is claimed is:

1. A poly(p-arylene-vinylene) comprising repeating units of the formula (I),

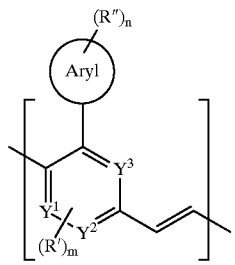

where the symbols and indices have the following meanings:
$Y^1$, $Y^2$, $Y^3$: identical or different, CH, N;
Aryl: an aryl group having from 4 to 14 carbon atoms;
R': is a straight-chain or branched or cyclic alkyl or alkoxy group having from 1 to 20 carbon atoms, where one or more non-adjacent CH₂ groups are optionally replaced by —O—, —S—, —CO—, —COO—, —O—CO—, —NR¹—, —(NR²R³)⁺—A⁻, or —CONR⁴— and one or more H atoms may be replaced by F, or else CN, F, Cl or any aryl group having from 4 to 14 carbon atoms which are optionally substituted by one or more non-aromatic radicals R' and when m is 2, the R' groups are identical or different;
R'': is identical or different, each a straight chain or branched or cyclic alkyl group with 1 to 20 carbon atoms, when one or more non-adjacent CH₂ groups are optionally replaced by —S—, —CO—, —COO—, —O—CO—, —NR¹—, —(NR²R³)⁺—A⁻, or —CONR⁴— or a straight chain or branched or cyclic alkoxy group having 4 to 20 carbon atoms where one or more non-adjacent CH₂ groups are optionally replaced by —O—, —S—, —CO—, —COO—, —O—CO—, —NR¹—, —(NR²R³)⁺—A⁻, or —CONR⁴— and one or more H atoms in each case optionally replaced by F, or else CN, F, Cl or any aryl group having from 4 to 14 carbon atoms which are optionally substituted by one or more nonaromatic radicals R' and when n is 2, 3, 4 or 5 the R'' groups are identical or different;
R¹, R², R³, R⁴: identical or different, aliphatic or aromatic hydrocarbon radicals having from 1 to 20 carbon atoms or else H;
A⁻: a singly charged anion or its equivalent;
m: 0, 1 or 2;
n: 1, 2, 3, 4 or 5.

2. A poly(p-arylene-vinylene) as claimed in claim 1 which comprises from 2 to 10,000 repeating units.

3. A poly(p-arylene-vinylene) as claimed in claim 1 consisting essentially of repeating units of the formula (I).

4. A poly(p-arylene-vinylene) copolymer comprising repeating units of the formula

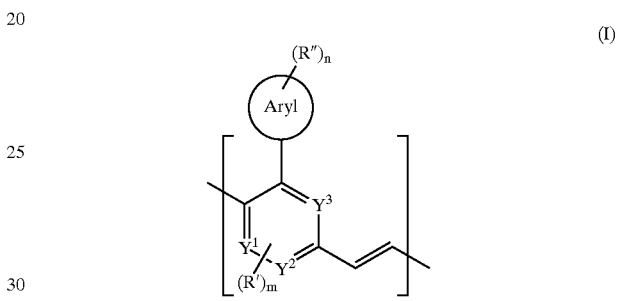

where the symbols and indices have the following meanings:
$Y^1$, $Y^2$, $Y^3$: identical or different, CH, N;
Aryl: an aryl group having form 4 to 14 carbon atoms;
R', R'': identical or different, each a straight-chain or branched or cyclic alkyl, where one or more non-adjacent CH₂ groups are optionally replaced by —S—, —CO—, —COO—, —O—CO—, —NR¹—, —(NR²R³)⁺—A⁻, or —CONR⁴— or a straight-chain or branched or cyclic alkoxy group having 1 to 20 carbon atoms where one or more non-adjacent CH₂ groups are replaced by —O—, —S—, —CO—, —COO—, —O—CO—, —NR¹—, —(NR²R³)⁺—A⁻, or —CONR⁴— and one or more H atoms in each case may be replaced by F, or else CN, F, Cl or any aryl group having from 4 to 14 carbon atoms which are optionally substituted by one or more nonaromatic radicals R';
R¹, R², R³, R⁴: identical or different, aliphatic or aromatic hydrocarbon radicals having from 1 to 20 carbon atoms or else H;
A⁻: a singly charged anion or its equivalent;
m: 0, 1 or 2;
n: 1, 2, 3, 4 or 5.

5. A poly(p-arylene-vinylene) as claimed in claim 4 which comprises at least two different repeating units of the formula (I).

6. A poly(p-arylene-vinylene) as claimed in claim 4 which comprises one or more repeating units of the formula (I) one or more further poly(p-arylene-vinylene) repeating units.

7. A poly(p-arylene-vinylene) as claimed in claim 6 which comprises one or more 2,5-dialkoxy-1,4-phenylene-vinylene repeating units.

8. A poly(p-arylene-vinylene) as claimed in claim 1, wherein the symbols and indices have the following meanings:

$Y^1$, $Y^2$, $Y^3$: CH;

Aryl: phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinolinyl, 2- or 3-thiophenyl, 2- or 3-pyrrolyl, and 2- or 3-furanyl;

R': is a straight-chain or branched alkoxy group having from 1 to 12 carbon atoms;

R": is a straight-chain or branched alkyl group having from 1 to 12 carbon atoms or a straight-chain or branched alkoxy group with 4 to 12 carbon atoms and when n is 2 or 3, the R" groups are identical or different;

m: 0, 1;

n: 1, 2, 3.

9. A poly(p-arylene-vinylene) as claimed in claim 8, wherein the aryl substituent in the formula (I) is phenyl, 1-naphthyl, 2-naphthyl or 9-anthracenyl.

10. A poly(p-arylene-vinylene) as claimed in claim 9, wherein, in the repeating unit of the formula (I), the aryl substituent has the following substitution pattern:

2',3- or 4-alkyl(oxy)phenyl, 2,3-, 2,4-, 2,5-, 2,6-, 3,4- or 3,5-dialkyl(oxy)phenyl, 2,3,4-, 2,3,5-, 2,3,6-, 2,4,5, 2,4, 6- or 3,4,5-trialkyl(oxy)phenyl, 2-, 3-, 4-, 5-, 6-, 7- or 8-alkyl(oxy)-1-naphthyl, 1-, 3-, 4-, 5-, 6-, 7- or 8-alkyl (oxy)-2-naphthyl or 10-alkyl(oxy)-9-anthracenyl.

11. A poly(p-arylene-vinylene) as claimed in claim 1, wherein $Y^1$, $Y^2$, $Y^3$: CH;

Aryl: an aryl group having 4 to 14 carbon atoms;

R': is a straight-chain or branched or cyclic alkyl or alkoxy group having from 1 to 20 carbon atoms, where one or more non-adjacent $CH_2$ groups are optionally replaced by —O—, —S—, —CO—, —COO—, —O—CO—, —$NR^1$—, —$(NR^2R^3)^+$—$A^-$, or —$CONR^4$— and one or more H atoms may be replaced by F, or else CN, F, Cl or an aryl group having from 4 to 14 carbon atoms which are optionally substituted by one or more non-aromatic radicals R' and when m is 2, the R' groups are identical or different;

R": is each a straight-chain or branched or cyclic alkyl group with 1 to 20 carbon atoms in which at least one non-adjacent $CH_2$ group is replaced by —S—, —CO—, —COO—, —$NR^1$—, —$(NR^2R^3)^+$—$A^-$, or —$CONR^4$— or a straight chain or branched or cyclic alkoxy group having 4 to 20 carbon atoms and when n is 2, 3, 4 or 5, the R" groups as identical or different.

12. The poly(p-arylene-vinylene) claimed in claim 11 wherein

Aryl: an aryl group having 6 carbon atoms;

R": an alkoxy group having 4 to 20 carbon atoms.

13. The poly(p-arylene-vinylene) as claimed in claim 12, wherein

Aryl: an aryl group having 6 carbon atoms;

R": an alkoxy having 10 carbon atoms;

m: 0; and n: 1.

14. The poly(p-arylene-vinylene) as claimed in claim 13, which comprises repeating units of the following formula:

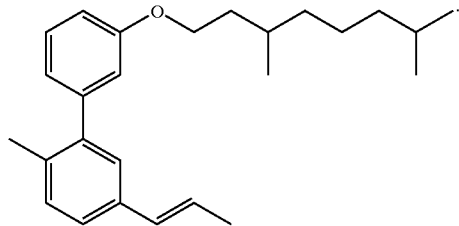

15. A copolymer wherein one of the repeating units is a poly(p-arylene-vinylene) according to claim 1.

16. An electroluminescence material comprising one or more poly(p-arylene-vinylenes) as claimed in claim 1.

17. A process for producing an electroluminescence material as claimed in claim 1, which comprises applying one or more poly(p-arylene-vinylene) comprising repeating units of the formula (I) as a film onto a substrate which optionally comprises further layers.

18. An electroluminescence device comprising one or more active layers, wherein at least one of these active layers comprises one or more poly(p-arylene-vinylenes) as claimed in claim 1.

* * * * *